(12) United States Patent
Kobayashi

(10) Patent No.: US 6,984,567 B2
(45) Date of Patent: Jan. 10, 2006

(54) NONVOLATILE SEMICONDUCTOR MEMORY DEVICE AND MANUFACTURING METHOD THEREOF

(75) Inventor: Takashi Kobayashi, Tokorozawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/819,270

(22) Filed: Apr. 7, 2004

(65) Prior Publication Data

US 2004/0191993 A1 Sep. 30, 2004

Related U.S. Application Data

(63) Continuation of application No. 10/301,643, filed on Nov. 22, 2002, now Pat. No. 6,741,501.

(30) Foreign Application Priority Data

Nov. 30, 2001 (JP) ............................ P2001-366870

(51) Int. Cl.
*H01L 21/8222* (2006.01)
(52) U.S. Cl. ...................................... 438/340; 438/257
(58) Field of Classification Search ................ 438/340, 438/257, 283
See application file for complete search history.

(56) References Cited

U.S. PATENT DOCUMENTS

| | | | |
|---|---|---|---|
| 5,600,164 A | | 2/1997 | Ajika et al. |
| 5,859,453 A | * | 1/1999 | Ahn ........................... 257/314 |
| 5,946,240 A | * | 8/1999 | Hisamune ............... 365/185.28 |
| 6,437,394 B1 | | 8/2002 | Kawata et al. |
| 6,605,507 B2 | | 8/2003 | Kawata et al. |
| 6,614,071 B1 | * | 9/2003 | Nakagawa ................... 257/317 |
| 2002/0031886 A1 | * | 3/2002 | Lim ............................ 438/257 |

FOREIGN PATENT DOCUMENTS

JP      2001-28428      7/1999

* cited by examiner

*Primary Examiner*—Caridad Everhart

(74) *Attorney, Agent, or Firm*—Reed Smith LLP; Stanley P. Fisher, Esq.; Juan Carlos A. Marquez, Esq.

(57) ABSTRACT

A nonvolatile semiconductor memory device having a memory cell comprising source/drain diffusion layer in p-well formed to a silicon substrate, a floating gate as a first gate, a control gate (word line) as a second gate, and a third gate, in which the floating gate and the p-well are isolated by a tunnel insulator film, the third gate and the p-well are isolated by a gate insulator film, the floating gate and the third gate are isolated by an insulator film, the floating gate and the word line (control gate) are isolated by a insulator film (ONO film), and the second gate film and the word line (control gate) are isolated by a silicon oxide film, respectively, wherein the thickness of the tunnel insulator film is made larger than the thickness of the gate insulator film. Accordingly, the reliability and access time of the device is improved.

23 Claims, 46 Drawing Sheets

F I G. 2
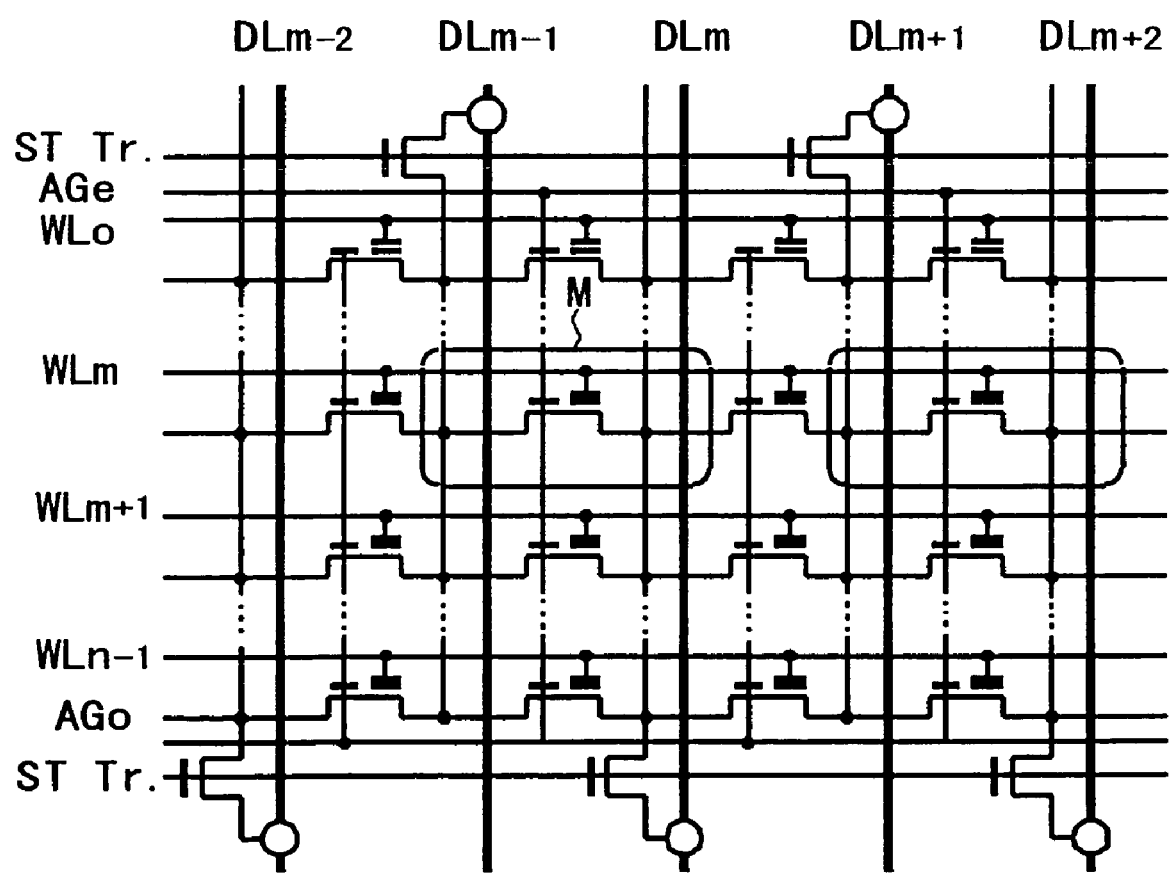

NONVOLATILE SEMICONDUCTOR MEMORY DEVICE AND MANUFACTURING METHOD THEREOF

This application is a Continuation application of U.S. application Ser. No. 10/301,643 filed Nov. 22, 2002 now U.S. Pat. No. 6,741,501. Priority is claimed based on U.S. application Ser. No. 10/301,643 filed Nov. 22, 2002, which claims the priority date of Japanese Patent Application No. 2001-366870 filed Nov. 30, 2001.

BACKGROUND OF THE INVENTION

1. Field of the Invention

This invention is related to semiconductor integrated circuit devices and a manufacturing technique therefor and, in particular, to a method of attaining high integration, high reliability and high performance of a nonvolatile semiconductor memory device.

2. Description of Related Art

Since flash memory devices functioning similarly to EEPROMs (Electrically Erasable Programmable Read Only Memory) are capable of electrical writing and erasing and are very portable and impact resistant, the demand therefor has recently increased rapidly for use in mobile phones, portable personal computers, digital cameras and in microcomputers in the engine control systems of automobiles.

To improve the marketability of such devices, reduction of the memory cell area is essential for reducing the cost thereof and various memory cell systems have been proposed for attaining the same. One such system is a virtual ground type memory cell using a 3-layered polysilicon gate as disclosed, for example, in JP-A No. 200242/1999.

The memory cell of the type described above comprises, as shown in FIG. 60, a well 601 in a silicon substrate 600, source and drain diffusion layer regions 605, 605' in the well, and three gates including a floating gate 603b as a first gate comprising a polysilicon film formed on the well, a control gate 611a as a second gate, and a third gate 607a for controlling an erasing gate and a split channel.

Each of the gates 603b, 611a, and 607a comprises a polysilicon film, and are isolated from the well 601 by insulator films 602, 606a, 606b, 608a, and 610. The control gates 611a are connected in a row to constitute word lines. The source and drain diffusion layer 605 is a virtual ground type having the diffusion layer of an adjacent memory cell in common to reduce the pitch in the direction of the row. The third gates 607a are disposed in parallel with the channels and perpendicular to the word lines 611a.

Upon writing, positive voltage independent of each other is applied to the word line 611a, the drain 605 and the third gate 607a while setting the well 601 and the source 605' to 0 V. Thus, hot electrons are generated in a channel at the boundary between the third gate and the floating gate and they are injected into the floating gate 603b. This increases the threshold voltage of the memory cell. Upon erasing, a positive voltage is applied to the third gate 607a while setting the word line 611a, the source 605', the drain 605 and the well 601 to 0 V. This discharges electrons from the floating gate 603b to the third gate 607a to lower the threshold voltage. "0" and "1" of information is determined by changing the threshold voltage of the memory cell transistor.

Problems arise, however, when to the density is increased in the nonvolatile semiconductor memory device described above.

At first, this concerns the reduction in the size of the memory cell. When it is intended to further reduce the size of the split gate type memory cell, it is important to reduce the gate length for the floating gate 603b and the third gate 607a. For this purpose, it is necessary to reduce the thickness of the gate insulator films 602 and 606a and improve the punch through resistance. However, no discussion has been made on the thickness of each gate insulator film.

Next, there is a problem in improving the reliability. In a flash memory, it has to be ensured that the data is held for more than 10 years after conducting writing/erasing cycles for 100,000 cycles or more. Elimination of data is caused by leakage of electrons accumulated in the floating gate.

While there are present plural modes for the cause of the leakage, the present inventors have found that the mode where electrons accumulate in the floating gate and incidentally leak at certain bits is most problematic. Such leakage has a correlation with the thickness of the gate insulator film 602 between the floating gate and the substrate, the so-called tunnel film, and the number of failure bits increases as the thickness of film is reduced.

According to the study made by the present inventors, it is necessary to increase the film thickness of the tunnel insulator film 602 to 9 nm or more in order to hold the data for 10 years, particularly in multi-level storage of 2 bits in one memory cell. Accordingly, to minimize the size of these memory devices, the thickness of the gate insulator films 602 and 606a must be considered.

The third problem is the increase in the number of manufacturing steps. A usual flash memory has a peripheral circuit for applying voltage to the memory cell or conducting logic operations. In the circuit for applying the voltage to the cell, since a high voltage, for example, of 18 V is applied to the word line, a MOS (Metal Oxide Semiconductor) transistor constituting the circuit has a high voltage withstanding structure using a thick gate insulator film of, for example, 25 nm. On the other hand, in the circuit for conducting the logic operation, the applied voltage is, for example, 3 V of an external power source voltage and high-speed operation is required. Therefore, the thickness of the gate insulator film of the MOS constituting the circuit for conducting the logic operation is extremely thin compared with the structure for withstanding high voltage. Thus, improved manufacturing methods are needed to form the two kinds of gate insulator films for the peripheral circuit and the two kinds of gate insulator films for the memory cell to simplify production and reduce the cost thereof.

As described above, the development of a new nonvolatile semiconductor memory device and a manufacturing method therefor are desirable with respect to gate insulator films of a split gate type memory cell.

A nonvolatile semiconductor memory device of reduced size and improved reliability are desirable.

Simplified production steps for producing such nonvolatile semiconductor memory devices are also desirable.

SUMMARY OF THE INVENTION

In a first preferred embodiment, the nonvolatile semiconductor memory device has a plurality of memory cells each comprising a first conduction type well formed in a silicon substrate, source/drain diffusion layer regions of a second conduction type formed in the well, a channel formed in a direction perpendicular to the diffusion layer region, a floating gate as a first gate formed on the silicon substrate comprising an insulator film, a control gate as a second gate comprising an insulator film disposed on the floating gate, a word line formed by connection of the control gate, and a third gate having a function different from those of the floating gate and the control gate and comprising an insulator film insulative with respect to the silicon substrate, the floating gate and the control gate, wherein the thickness of a gate insulator film for isolating the floating gate from the well is made larger than the thickness of the gate insulator film isolating the third gate from the well.

Preferably the third gate controls the split channel. Alternatively, the third gate functions as an erasing gate and to control the split channel.

The insulator film between the third gate and the well is formed by the same process step as the gate insulator film disposed on the low voltage area of the peripheral circuit region.

Alternatively, the insulator film between the floating gate and the well is preferably formed by the same process step as the gate insulator film disposed on the low voltage area of the peripheral circuit region.

The thickness of the insulator film between the floating gate and the third gate is preferably larger than the insulator film thickness between the floating gate and the well. Alternatively, the thickness of the insulator film between the floating gate and the third gate is preferably substantially identical to the insulator film thickness between the floating gate and the well.

In this first exemplary embodiment, the insulator film between the floating gate and the third gate preferably comprises a silicon oxide film containing nitrogen.

In a second preferred embodiment, the nonvolatile semiconductor memory device comprises (1) a plurality of memory cells each comprising a first conduction type well formed in a silicon substrate, source/drain diffusion layer regions of a second conduction type formed in the well, a channel formed in a direction perpendicular to the diffusion layer region, a floating gate as a first gate comprising an insulator film disposed on the silicon substrate, a control gate as a second gate comprising an insulator film disposed on the floating gate, a word line formed by connection of the control gate, and a third gate of having a function different from the floating gate and the control gate and comprising an insulator film isolating the silicon substrate, the floating gate and the control gate, and (2) a peripheral circuit region for operating the memory cell, wherein the peripheral circuit region comprises MOS transistors of a low voltage system and a high voltage system in which the film thickness of the gate insulator film for the low voltage system MOS transistor is substantially identical i.e., formed in the same process step and comprising part of the same layer as the gate insulator film between the third gate and the well, and the thicknesses of the insulator films are larger in the order of (i) the gate insulator film for the high voltage system MOS transistor, (ii) the gate insulator film between the floating gate and the well, and (iii) the gate insulator film between the third gate and the well.

In a third preferred embodiment, the nonvolatile semiconductor memory device comprises (1) a plurality of memory cells each comprising a first conduction type well formed in a silicon substrate, source/drain diffusion layer regions of a second conduction type formed in the well, a channel formed in a direction perpendicular to the diffusion layer region, a floating gate as a first gate comprising an insulator film disposed on the silicon substrate, a control gate as a second gate comprising an insulator film disposed on the floating gate, a word line formed by connection of the control gate, and a third gate having a function different from the floating gate and the control gate and comprising of an insulator film isolating the silicon substrate, the floating gate and the control gate, and (2) a peripheral circuit region for operating the memory cell, wherein the peripheral circuit region comprises MOS transistors of a low voltage system and a high voltage system in which the film thickness of the gate insulator film for the low voltage system MOS transistor is substantially identical i.e., formed in the same process step and comprising part of the same layer as the gate insulator film between the floating gate and the well, and the thicknesses of the insulator films are larger in the order of (i) the gate insulator film for the high voltage system MOS transistor, (ii) the gate insulator film between the floating gate and the well, and (iii) the gate insulator film between the third gate and the well.

In the nonvolatile semiconductor memory device of this third preferred embodiment, the memory cell conducts writing by the charging of hot electrons from the channel to the floating gate and erasing by tunnel emission from the floating gate to the well. Alternatively, the memory cell conducts writing by the charging of hot electrons from the channel to the floating gate and erasing by tunnel emission from the floating gate to the third gate.

Alternatively, a nonvolatile semiconductor memory device of the present invention preferably comprises a memory cell comprising a first conduction type well formed in a silicon substrate, source/drain diffusion layer regions of a second conduction type formed in the well, a channel formed in a direction perpendicular to the diffusion layer region, a floating gate as a first gate formed on the silicon substrate by way of an insulator film, a control gate as a second gate formed by way of an insulator film to the floating gate, a word line formed by connection of the control gate, and a third gate of a function different from the floating gate and the control gate and formed by way of an insulator film to the silicon substrate, the floating gate and the control gate, wherein the thickness of the gate insulator film for isolating the floating gate from the well is larger compared with the thickness of the gate insulator film for isolating the control gate from the well.

In this case, the third gate preferably is an erasing gate.

Further, the thickness of the insulator film between the floating gate and the control gate preferably is larger compared with the film thickness between the floating gate and the well.

Alternatively, the thickness of the insulator film between the floating gate and the control gate is substantially identical with the thickness between the floating gate and the well.

In this preferred example, the insulator film between the floating gate and the third gate is a silicon oxide film containing add nitrogen.

In the operation system of this case, writing to the memory cell is conducted by injection of channel hot electrons from the channel to the floating gate and erasing from the memory cell is conducted by tunnel emission from the floating gate to the third gate.

Alternatively, the nonvolatile semiconductor memory device of the present invention preferably comprises a memory cell comprising a first conduction type well formed in a silicon substrate, source/drain diffusion layer regions of a second conduction type formed in the well, a channel formed in a direction perpendicular to the diffusion layer region, a floating gate as a first gate formed on the silicon substrate by way of an insulator film, and a control gate as a second gate formed by way of an insulator film to the floating gate, and the channel, wherein the thickness of the gate insulator film for isolating the floating gate from the well preferably is larger compared with the thickness of the gate insulator film for isolating the control gate from the well.

In this case, the control gate preferably is a gate for controlling a split channel.

Further, writing to the memory cell is conducted by injection of channel hot electrons from the channel to the floating gate and erasing from the memory cell is conducted by tunnel emission from the floating gate to the drain.

Further, the gate insulator film between the floating gate and the well and the gate insulator film between the third gate and the well may be formed in the same manufacturing step that produces the gate insulator film of a MOS transistor in a peripheral circuit low voltage portion.

BRIEF DESCRIPTION OF THE DRAWINGS

This invention is to be described specifically for preferred embodiments with reference to the drawings. Throughout the drawings for explaining the preferred embodiments, those having identical functions carry the same reference numerals, for which duplicate explanations have been omitted, wherein:

FIG. 2 is a circuit diagram showing the constitution of a memory array for the nonvolatile semiconductor memory device of the first preferred embodiment of the present invention;

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided herein below with reference to the attached drawings.

First Preferred Embodiment

Figure 1:
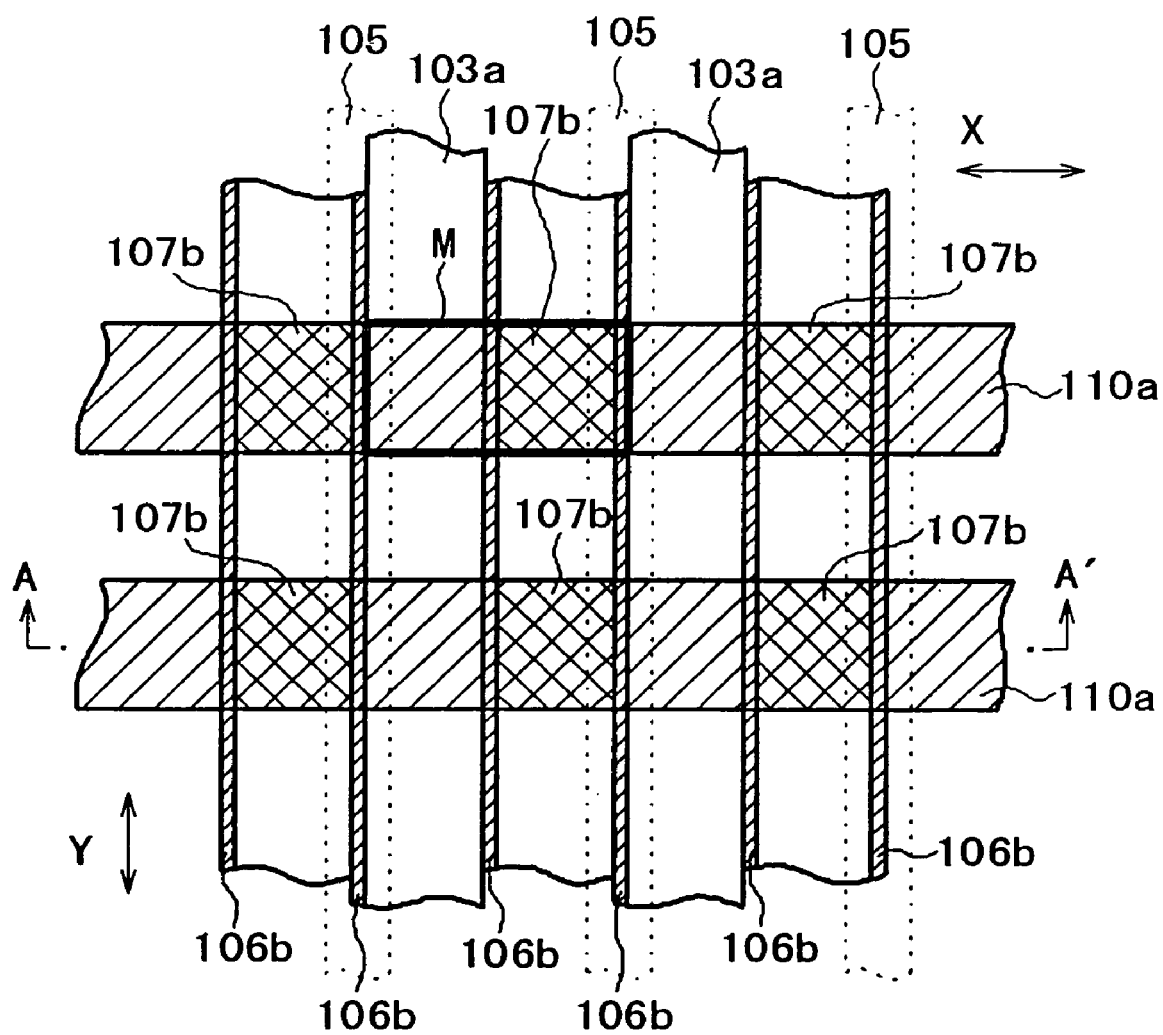
FIG. 1 is a plan view for a main portion of a substrate showing the nonvolatile semiconductor memory device (flash memory) of a first preferred embodiment of the present invention.

Referring to FIG. 1 to FIG. 14, the constitution, operation method and manufacturing method of a nonvolatile semiconductor memory device (flash memory) of a first preferred embodiment of the present invention are described below. FIG. 1 is a plan view for a main portion of a flash memory, and FIG. 3 to FIG. 14 are cross sectional views along line A–A' of FIG. 1 illustrating the production steps of the flash memory of this first preferred embodiment. Further, FIG. 2 is a circuit diagram showing the constitution of memory array in which memory cells are arranged in a matrix in said first preferred embodiment of the present invention.

Figure 14:
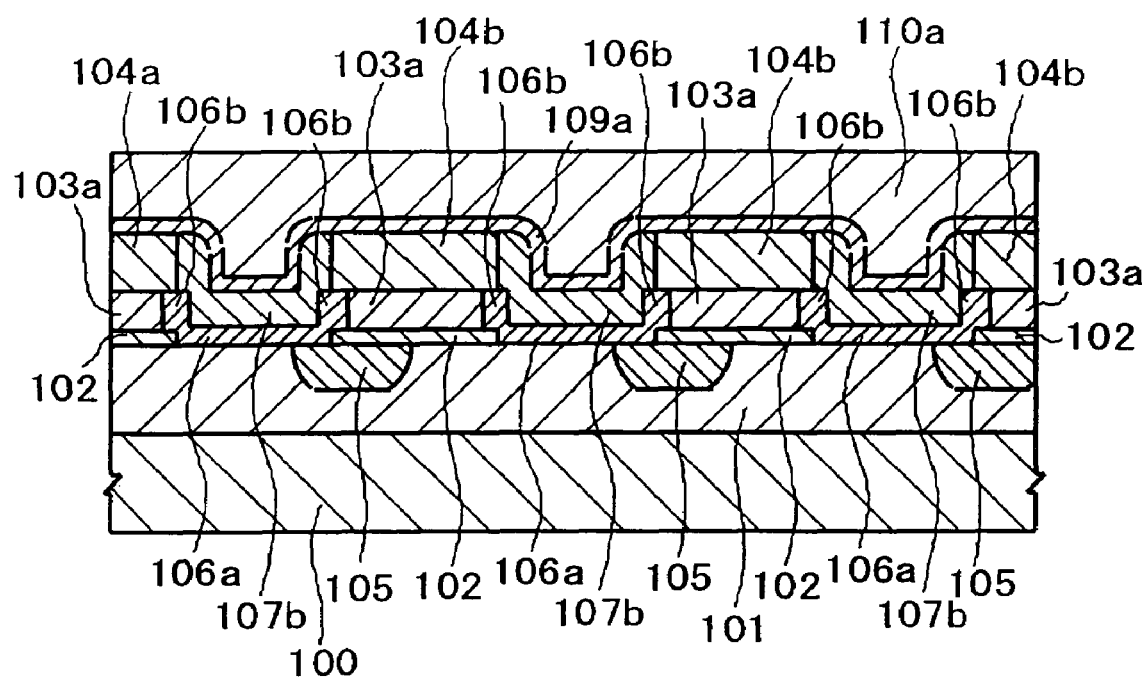
FIG. 14 is a cross sectional view for a main portion of a substrate showing a nonvolatile semiconductor memory device of the first preferred embodiment of the present invention.

First, the structure of the flash memory cell is described below. As shown in FIG. 1 and FIG. 14 which is a cross sectional view along A–A' in FIG. 1, the memory cell comprises a source/drain diffusion layer 105 in a p-type well (semiconductor region) 101 formed in a silicon substrate 100, a floating gate 107b as a first gate, a control gate as a second gate (word line) 110a, and a third gate 103a. One memory cell is formed, for example, in a region surrounded with a solid fat line of FIG. 1. The control gate 110a for the memory cells M by a predetermined number are connected in the direction of a row (direction X) to form word lines ($WL_0$–$WL_{n-1}$ in FIG. 2).

The floating gate 107b and the p-well 101 are isolated from each other by a gate insulator film 106a, the third gate 103a and the p-well 101 are isolated from each other by a gate insulator film 102, the floating gate 107b and the third gate 103a are isolated from each other by an insulator film 106b, the floating gate 107b and the word line (control gate) 110a are isolated from each other by an insulator film (ONO film) 109a, and the third gate 103a and the word line (control gate) 110a are isolated from each other by a silicon oxide films 104b and 109a.

The source/drain diffusion layer 105 is disposed perpendicular to the word line (control gate) 110a and present as a local source line and a local data line for connecting the source/drain of the memory cells in the direction of a column (direction Y). That is, this nonvolatile semiconductor memory device comprises a so-called contactless type memory cell array having no contact hole on every memory cell. A channel is formed in a direction perpendicular to the source/drain diffusion layer 105 (direction X).

The lateral sides of the third gate 103a extending in the direction Y are present opposing to the lateral side of the end faces of the floating gate 107b extending in the direction Y by way of the insulator film 106b, respectively, (refer to FIG. 1). The floating gate 107b is disposed in the gaps defined by the plurality of third gates 103a present in a perpendicular direction (direction Y) to the word line (control gate) 110a and the channel. Further, the floating gates 107b are present in symmetry with the third gate 103a and the third gates 103a are present in symmetry with the floating gate 107b.

In this preferred embodiment, a pair of diffusion layers 105 forming the source/drain are in an asymmetric positional relation to the pattern of the floating gate 107b in such an offset structure that one of the diffusion layers does not overlap with the floating gate 107b. Further, the third gate 103a and the diffusion layer 105 are present such that respective portions of them overlap with each other.

Next the writing/erasing operation of this preferred embodiment is described with reference to FIG. 2.

When writing is conducted by selecting the memory cell M in FIG. 2, a high positive voltage, for example, at about 12 V is applied to a word line WLm, a low voltage at 2 V is applied to a third gate AGe and, a voltage at about 4 V is applied to a drain DLm. Source DLm-1 and the well are held at 0 V. Thus, a channel is formed in the well below the third gate 103a and hot electrons are generated in the channel at the floating gate end on the side of the source to inject electrons into the floating gate. Thus, the third gate 103a functions as a gate for controlling the channel present therebelow.

According to this memory cell, generation and injection efficiency of hot electrons is increased compared with existent NOR type flash memories and writing in a region of small channel current is enabled. Accordingly, a number of memory cells of Kbytes order or larger can be written in parallel by an internal power source having the same extent of current supply performance as usual.

Upon erasure, a high negative voltage, for example –18 V is applied to the word line WLm. In this case, the third gates AGe and AGo, all the source/drain diffusion layers DL and the well are held at 0 V. Thus, electrons accumulated in the floating gate are emitted into the well by a tunnel phenomenon.

Figure 60:
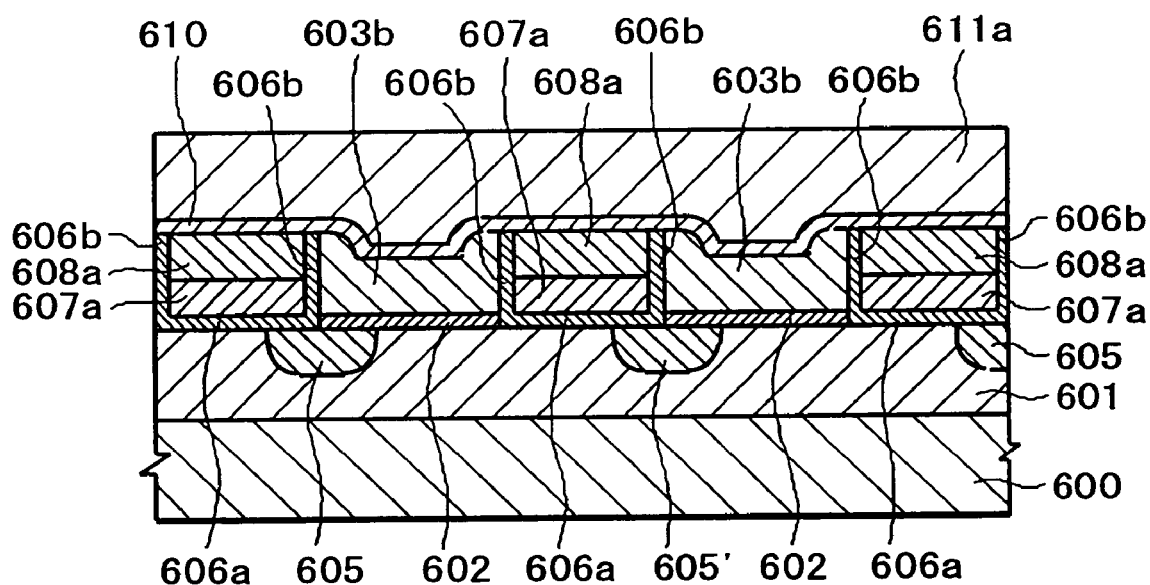
FIG. 60 is a cross sectional view for a main portion of a substrate of a nonvolatile semiconductor memory device for showing the effect of the present invention.

The memory cell in this preferred embodiment is different from the memory cell, for example, shown in FIG. 60 in that the thickness of the gate insulator film 106a between the floating gate 107b and the p-well 101, that is, a so-called tunnel insulator film, is made larger compared with the gate insulator film 102 between the third gate 103a and the well 101.

Since the thickness of the tunnel insulator film 106a is made larger, it is possible to suppress charge retention failure caused by incidental leakage of electrons accumulated in the floating gate at specified bits. Further, since the thickness of the gate insulator film 102 for the third gate 103a is reduced, the punch through resistance of MISFET (Metal Insulator Semiconductor Field Effect Transistor) (referred to herein as "MOS transistor") constituted by the third gate 103a is improved, thereby enabling a decrease in the gate length of the third gate. Accordingly, improved reliability and refinement for the memory cell are compatible with each other.

According to this preferred embodiment, since the thickness of the gate insulator film 102 for the third gate 103a is reduced, the channel current can be increased to improve the access time of the memory cell.

A preferred method of manufacturing the memory cell of this preferred embodiment is described below with reference to FIG. 1 to FIG. 14.

Figure 3:
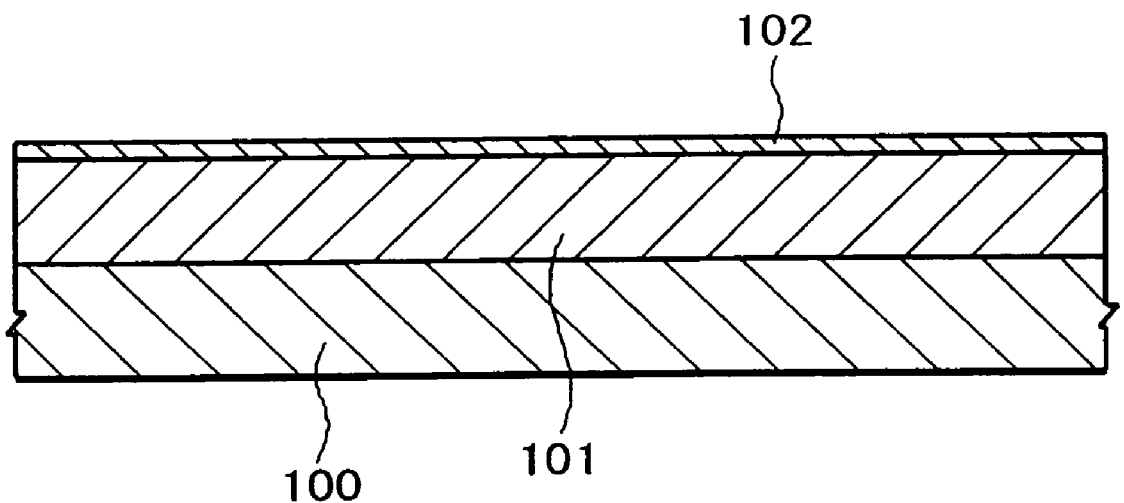
FIG. 3 is a cross sectional view for a main portion of a substrate showing a preferred manufacturing method of a nonvolatile semiconductor memory device of the first preferred embodiment of the present invention.
Figure 4:
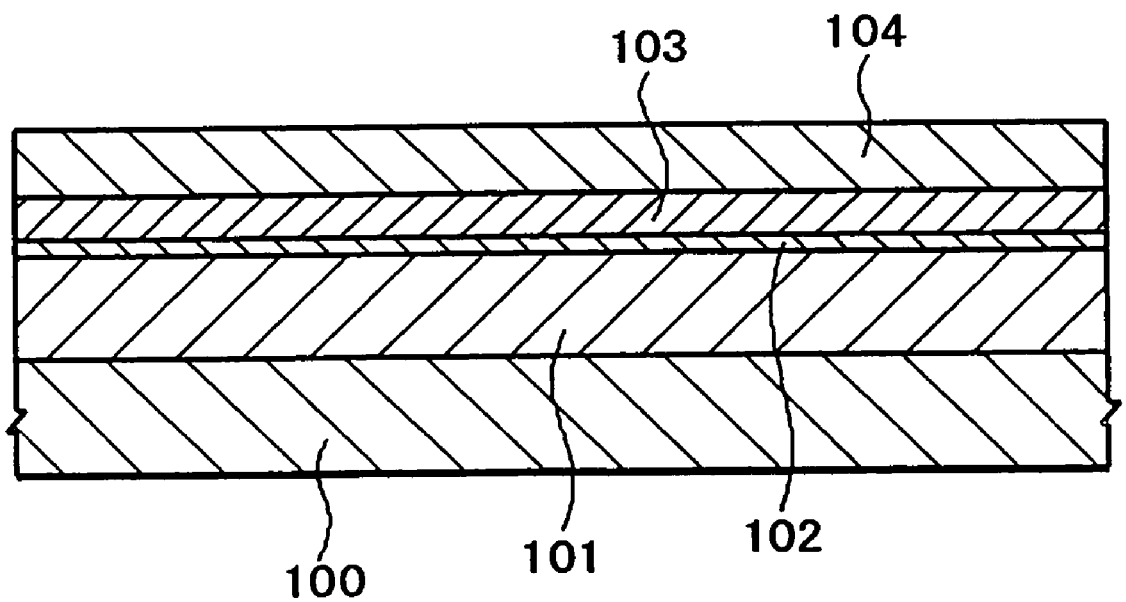
FIG. 4 is a cross sectional view for a main portion of a substrate showing a preferred manufacturing method of the nonvolatile semiconductor memory device of the first preferred embodiment of the present invention.
Figure 5:
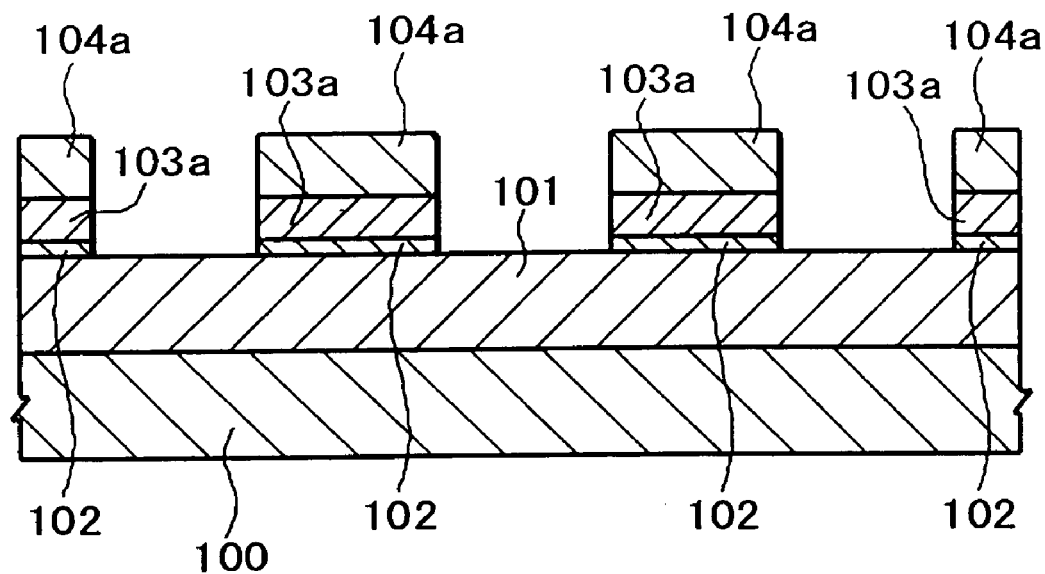
FIG. 5 is a cross sectional view for a main portion of a substrate showing a preferred manufacturing method of the nonvolatile semiconductor memory device of the first preferred embodiment of the present invention.

At first, as shown in FIG. 3, a p-well 101 is formed on a silicon substrate 100 and then a gate insulator film 102 of 7.5 nm thickness for isolating a third gate from the well is formed by a known thermal oxidation process. Successively, as shown in FIG. 4, a phosphorus doped polysilicon film 103 and a silicon oxide film 104 as a third gate are deposited. Then, as shown in FIG. 5, the silicon oxide film 104 and the polysilicon film 103 are patterned by known lithography and dry etching technology. As a result, the silicon oxide film and the polysilicon film are formed as 104a and 103a (third gate), respectively.

Figure 6:
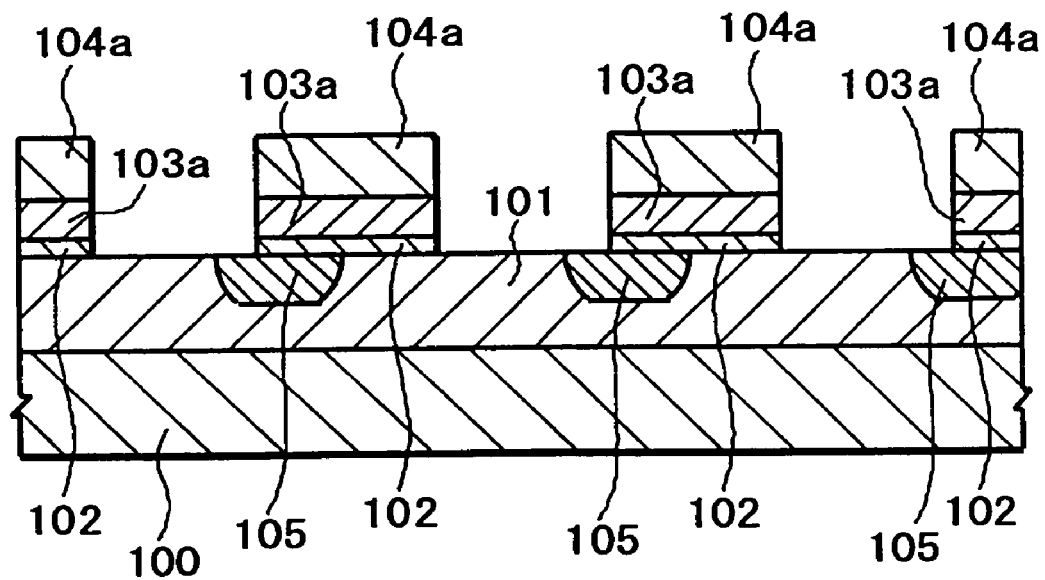
FIG. 6 is a cross sectional view for a main portion of a substrate showing a preferred manufacturing method of the nonvolatile semiconductor memory device of the first preferred as embodiment of the present invention.

Subsequently, as shown in FIG. 6, a diffusion layer 105 as a source/drain of a memory cell is formed by implanting arsenic ions by a tilted ion implanting process.

Figure 7:
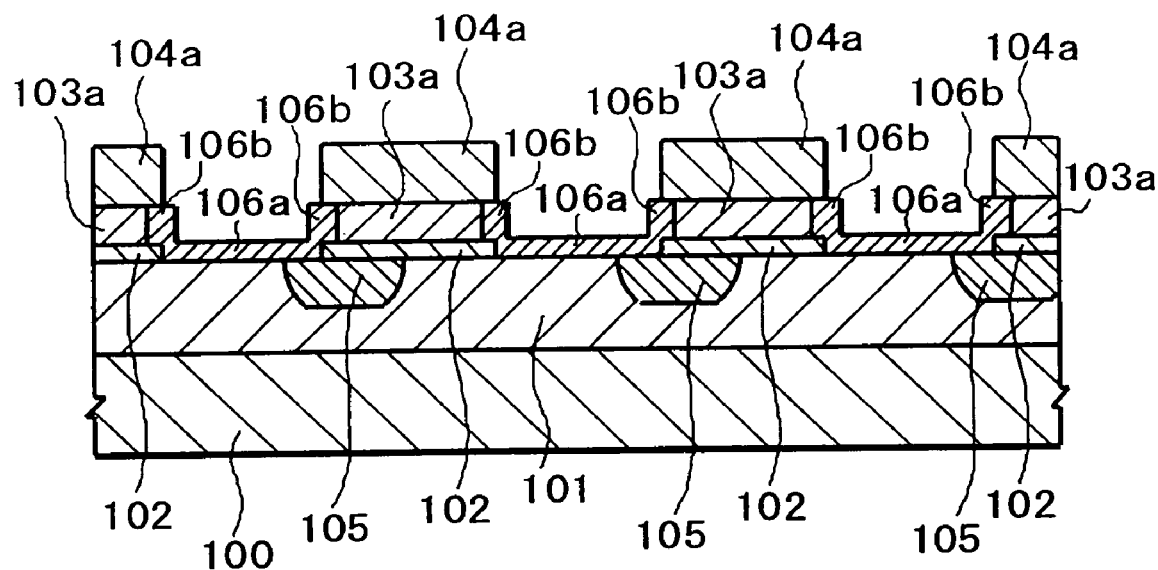
FIG. 7 is a cross sectional view for a main portion of a substrate showing a preferred manufacturing method of the nonvolatile semiconductor memory device of the first preferred embodiment of the present invention.

Then, as shown in FIG. 7, a 9 nm thermal oxidation film for isolating the floating gate from the substrate, a so-called tunnel insulator film 106a is formed on the silicon substrate (p-well 101) by a known thermal oxidation process. In this step, a thermal oxidation film (insulator film) 106b of about 20 nm thickness is formed on the side wall of the third gate 103a to enable isolation between the floating gate and the third gate. The thickness of the thermal oxidation film 106b is larger compared with 106a, because phosphorus is doped on the polysilicon film as the material for the third gate 103a and accelerated oxidation is caused by phosphorus.

Figure 8:
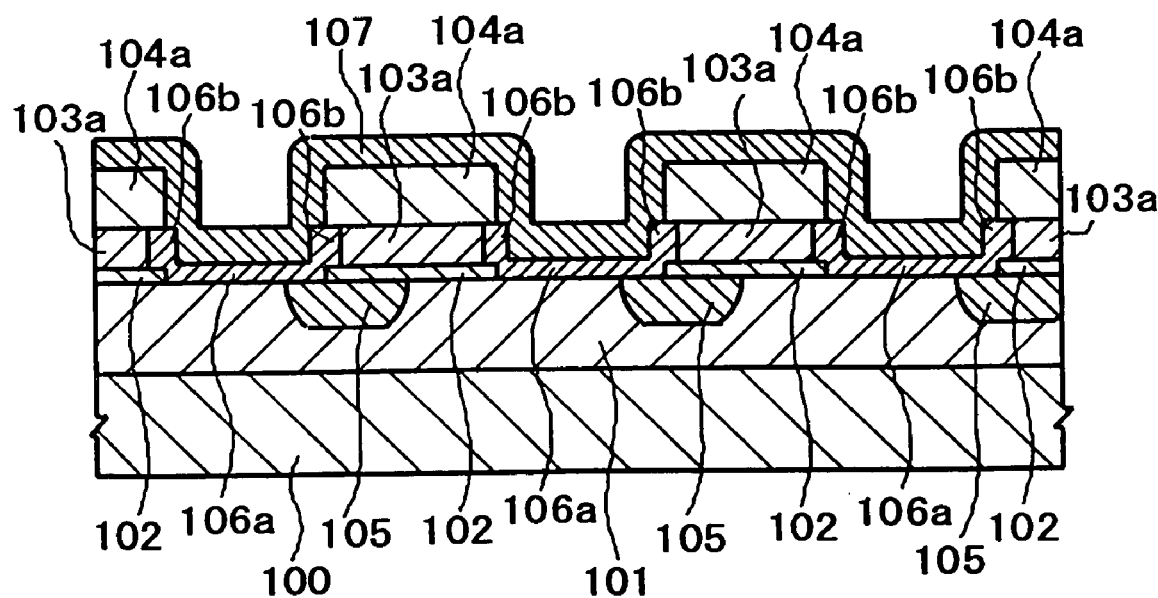
FIG. 8 is a cross sectional view for a main portion of a substrate showing a preferred manufacturing method of a nonvolatile semiconductor memory device of the first preferred embodiment of the present invention.

Then, as shown in FIG. 8, a phosphorus-doped polysilicon film 107 as the floating gate is deposited. In this step, the thickness of the polysilicon film 107 is set to such a value as to not fill the gap between the stacked films of the third gate 103a and the silicon oxide film 104a.

Figure 9:
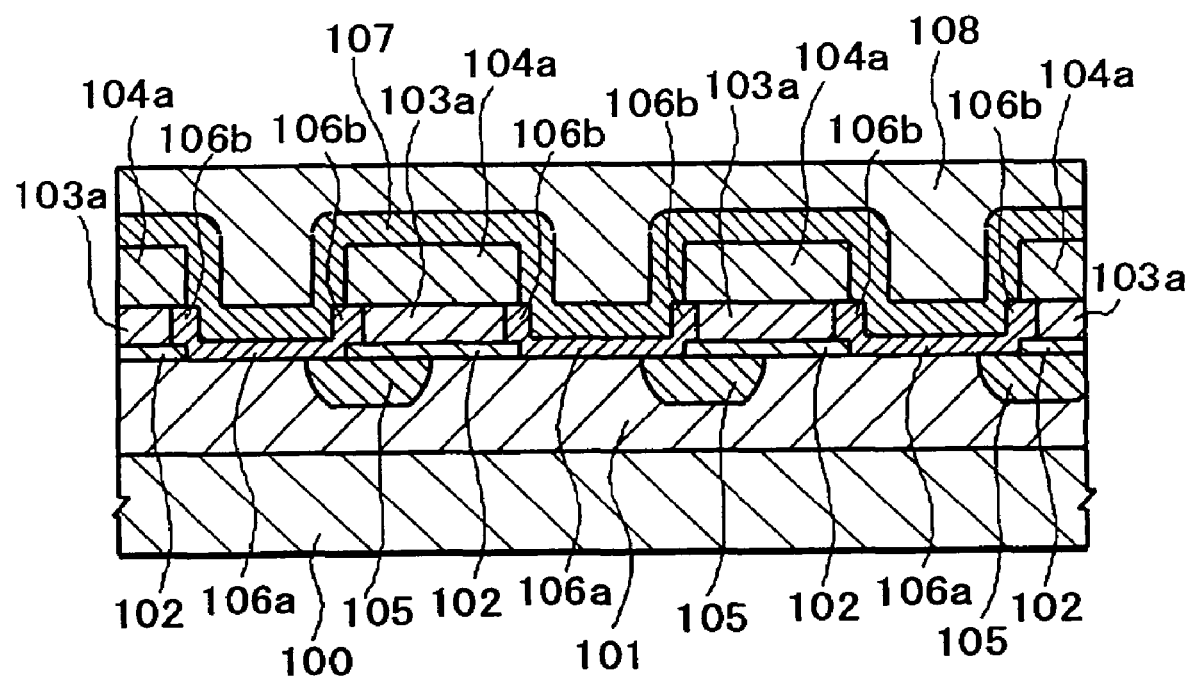
FIG. 9 is a cross sectional view for a main portion of a substrate showing a preferred manufacturing method of a nonvolatile semiconductor memory device of the first preferred embodiment of the present invention.

Successively, as shown in FIG. 9, a flowable organic material 108, for example, a resist material for lithography or an anti-reflection film, is coated such that the gap between the stacked films of the third gate 103a and the silicon oxide film 104a is completely filled.

Figure 10:
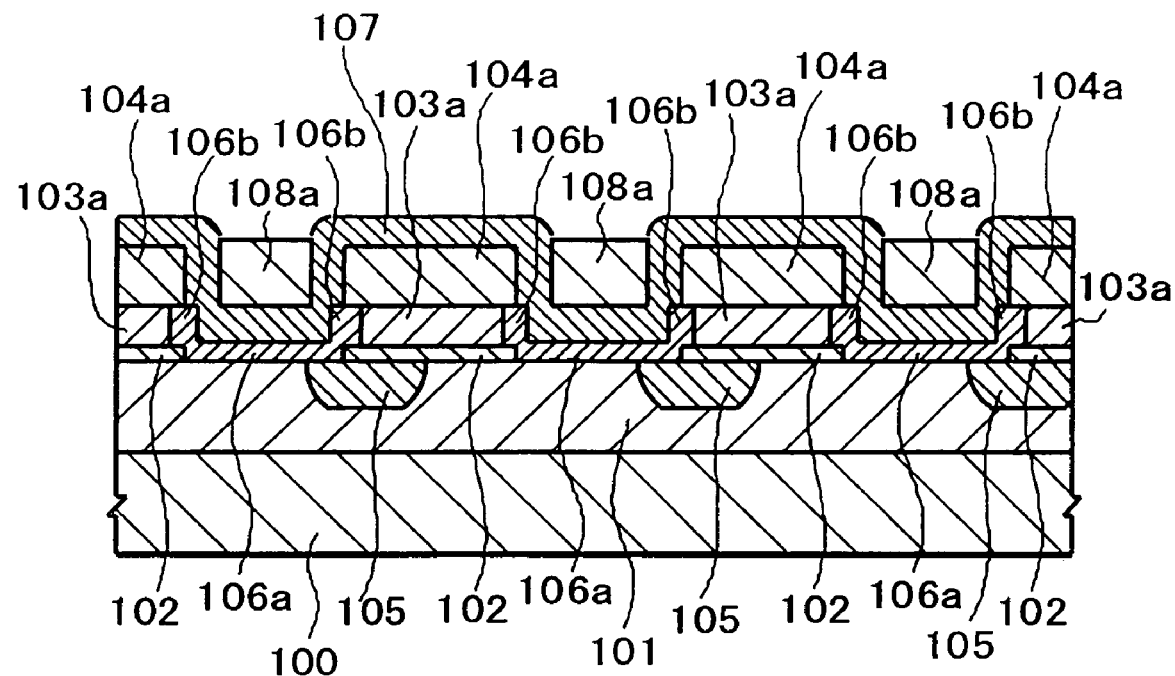
FIG. 10 is a cross sectional view for a main portion of a substrate showing a preferred manufacturing method of a nonvolatile semiconductor memory device of the first preferred embodiment of the present invention.
Figure 11:
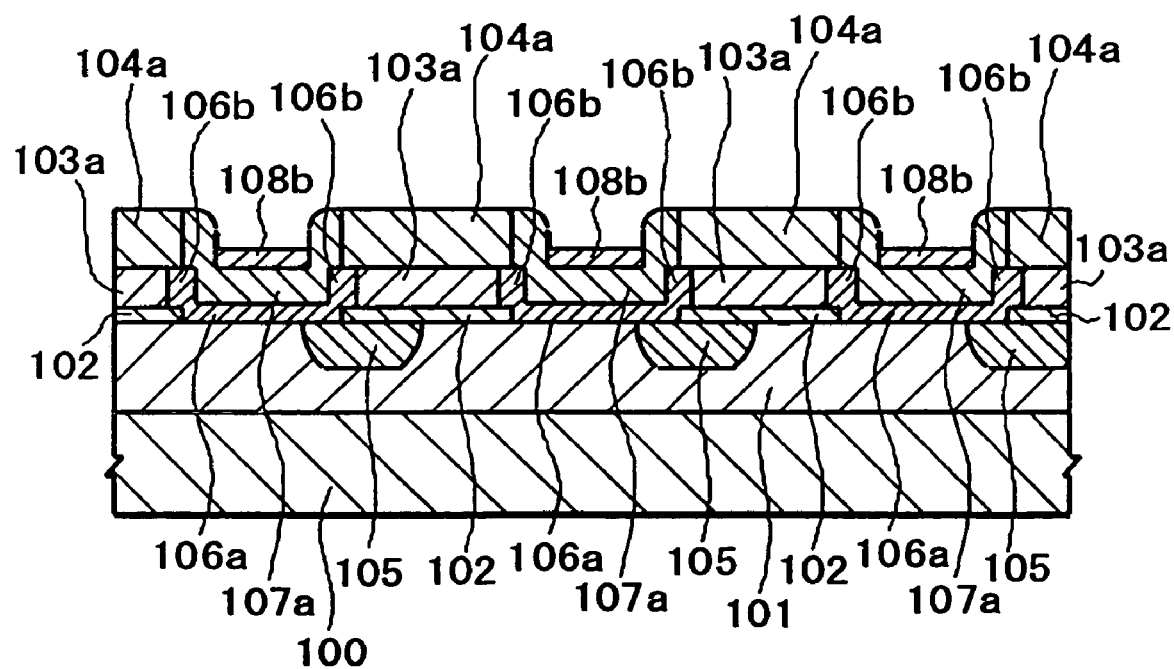
FIG. 11 is a cross sectional view for a main portion of a substrate showing a preferred manufacturing method of a nonvolatile semiconductor memory device of the first preferred embodiment of the present invention.

Then, as shown in FIG. 10, the flowable organic material 108 is etched back by a dry etching process to leave the material only in the gap between the stacked films of the third gate 103a and the silicon oxide film 104a. As a result, the flowable organic material 108 is formed as 108a. Subsequently, the polysilicon film 107 is etched back using the organic material 108a as a mask. As a result, the polysilicon film 107a remains between the stacked films of the third gate 103a and the silicon oxide film 104a to form a polysilicon film 107a. Further, the organic material 108a is formed as 108b.

Figure 12:
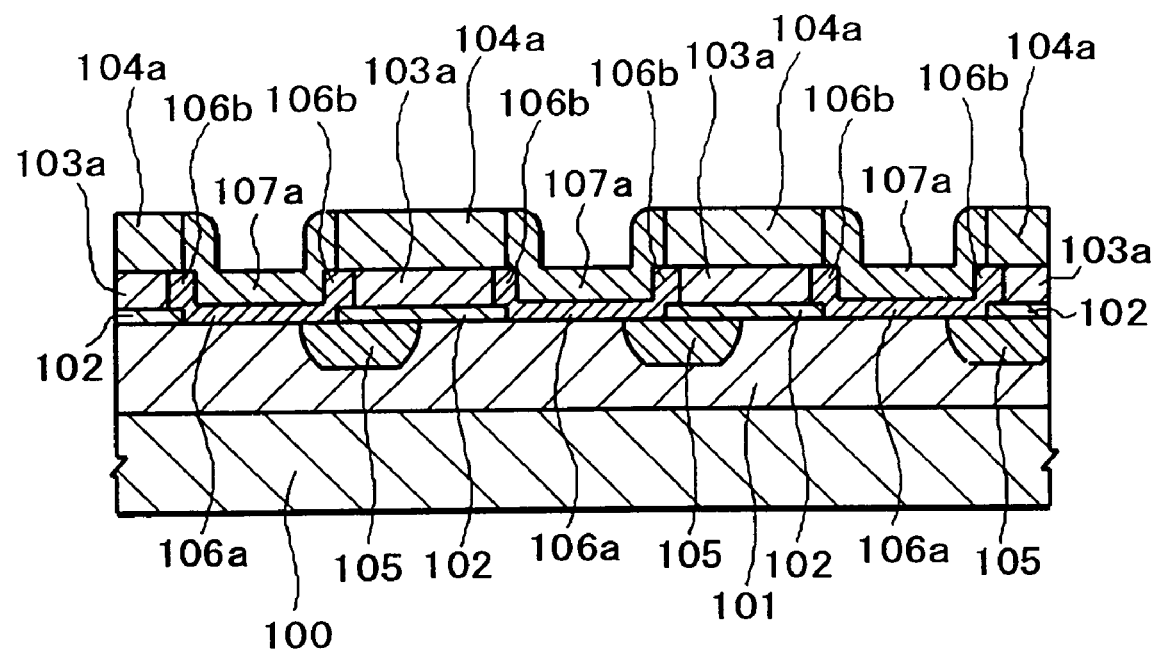
FIG. 12 is a cross sectional view for a main portion of a substrate showing a preferred manufacturing method of a nonvolatile semiconductor memory device of the first preferred embodiment of the present invention.
Figure 13:
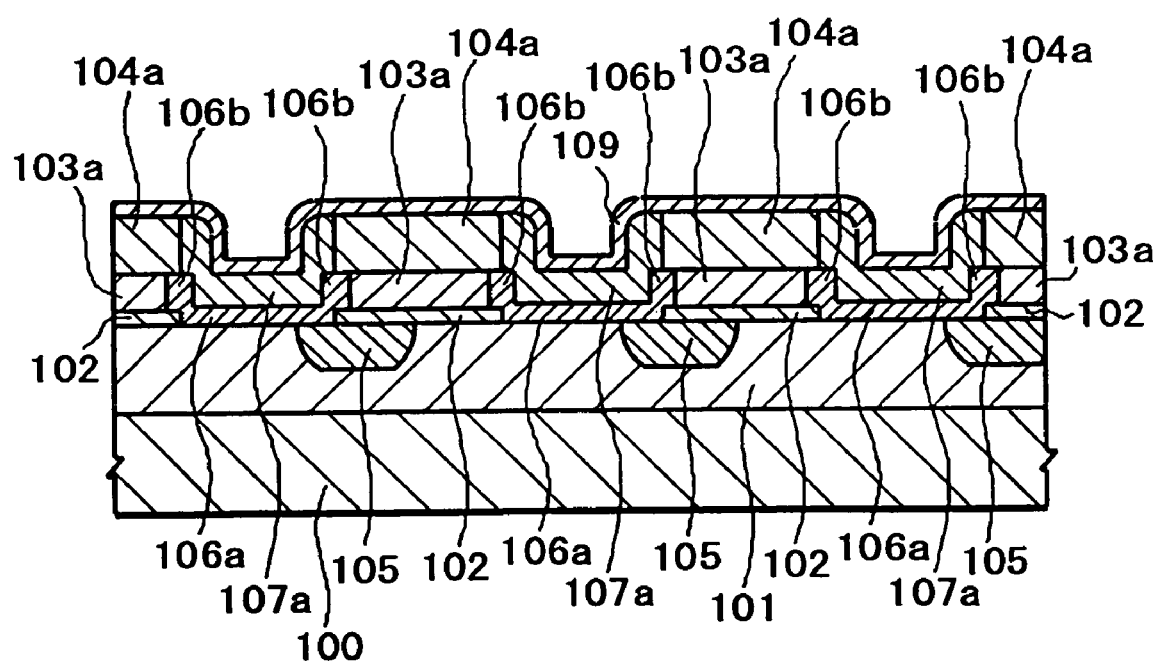
FIG. 13 is a cross sectional view for a main portion of a substrate showing a preferred manufacturing method of a nonvolatile semiconductor memory device of the first preferred embodiment of the present invention.

Then as shown in FIG. 12, the organic material 108b is removed by a known ashing process. Then, as shown in FIG. 13, a stacked film of silicon-oxide film/silicon nitride film/silicon oxide film for isolating the floating gate from the word line, a so-called ONO film 109, is formed at a thickness of 13 nm by being converted from the oxide film on the silicon substrate.

Then, as shown in FIG. 14, a stacked film of a polysilicon film and a tungsten silicide film 110, a so-called polyside film, is deposited. Then, it is patterned by known lithography and dry etching technology so as to extend in the direction X shown in FIG. 1 to form word lines (control gate). As a result, the polyside film 110 is formed as 110a (word line, control gate).

Further, the ONO film 109 and the polysilicon film 107a are successively etched using the word lines (control gate) 110a as a mask to complete the floating gate. Thus, the polysilicon film 107a is formed as 107b (floating gate), the ONO film 109 is formed as 109a and the silicon oxide film 104a is formed as a silicon oxide film 104b.

Subsequently, although not illustrated in the drawing, after forming an interlayer insulator film on the silicon substrate, contact holes reaching the word line (control gate) 110a, the source/drain diffusion layer 105, the p-well 101 and the third gate 103a are formed and, successively, a metal film is deposited and patterned into wirings to complete the memory cell.

In the memory cell of this preferred embodiment in which the thickness of the gate insulator film 106a between the floating gate 107b and the p-well 101 is made larger compared with the gate insulator film 102 between the third gate 103a and the p-well 101, when compared with the case in which the thickness of the gate insulator film 106a is made equal with or smaller than that of the gate insulator film 102, the charge retention characteristic of the memory cell was comparable therewith after many writing/easing cycles but punch through did not occur even when the gate length of the third gate was decreased and stable operation was possible. Further, a larger channel current was obtained to improve the access time of the nonvolatile semiconductor memory device.

As described above, in this preferred first exemplary embodiment of the nonvolatile semiconductor memory device of the present invention, memory cell area has been reduced while maintaining reliability after many writing/erasing cycles and access time has been improved.

Second Preferred Embodiment

The, constitution, operation method and manufacturing method of a nonvolatile semiconductor memory device (flash memory) of a second preferred embodiment of the present invention are described below with reference to FIGS. 15 to 17. This embodiment is different from the first preferred embodiment in that the gate insulator film between the floating gate 107b and the p-well 101 is preferably formed by a low pressure chemical vapor deposition process (LPCVD) instead of the thermal oxidation process. The plan view for the main portion of the flash memory, the cross sectional structure of the memory cell after completion, and the constitution of the memory array are identical with those of the first preferred embodiment, which are omitted here.

A preferred manufacturing method of this memory cell of the second preferred embodiment is described below.

Figure 15:
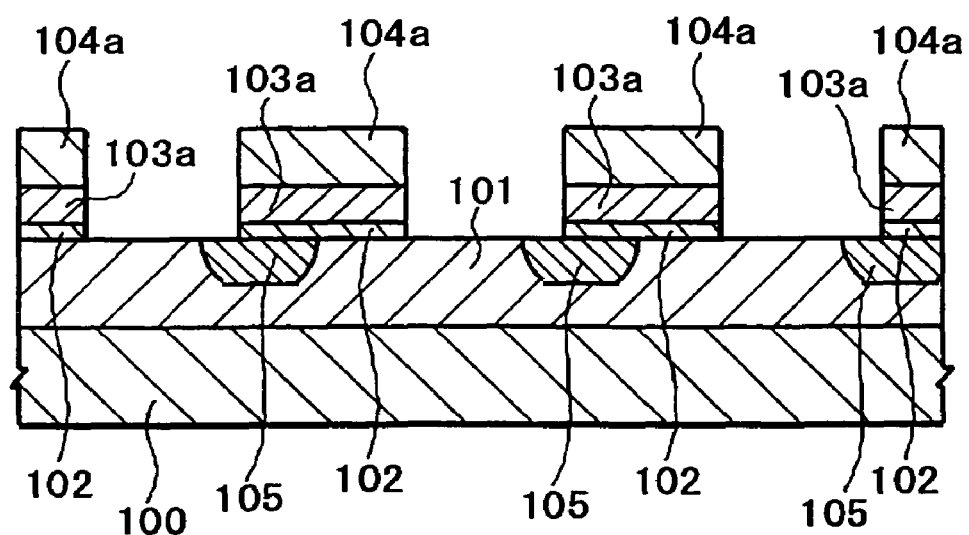
FIG. 15 is a cross sectional view for a main portion of a substrate showing a preferred manufacturing method of a nonvolatile semiconductor memory device of a second preferred embodiment of the present invention.

At first, by the same method as in Embodiment 1 which has been explained with reference to FIGS. 3 to 6, a p-well 101, a gate insulator film 102, a third gate 103a, a silicon oxide film 104a and a source/drain diffusion layer 105 are formed successively on the main surface of a silicon substrate 100 (FIG. 15).

Figure 16:
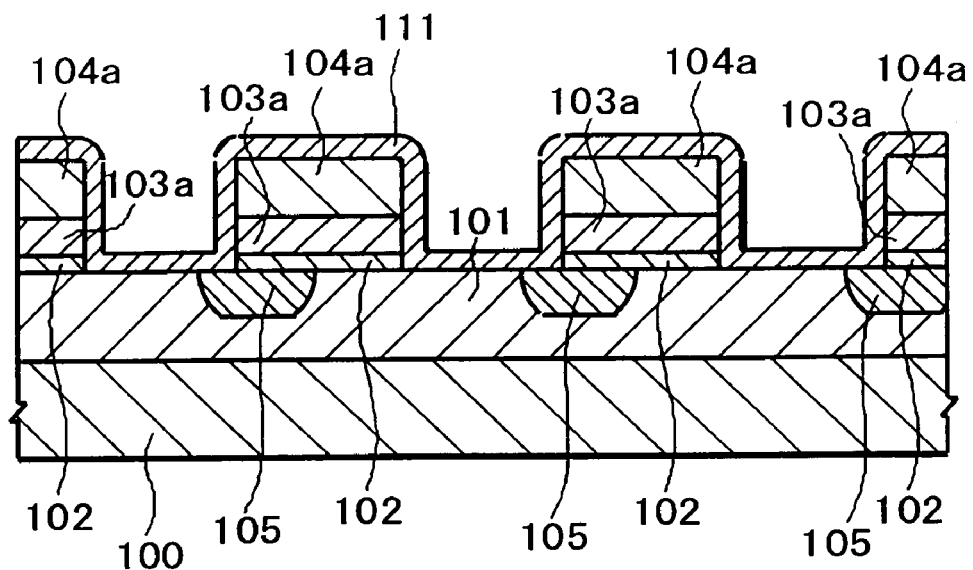
FIG. 16 is a cross sectional view for a main portion of a substrate showing a preferred manufacturing method of a nonvolatile semiconductor memory device of the second preferred embodiment of the present invention.

Then, as shown in FIG. 16, a silicon oxide film 111 of 11 nm is formed for isolating the floating gate from the silicon substrate and the floating gate from the third gate. The forming method is as described below. At first, a silicon oxide film is deposited to 11 nm by a low pressure chemical vapor deposition process using mono-silane and di-nitrogen sub-oxide as the starting material. Then, this specimen is heat treated in an ammonia atmosphere to introduce nitrogen into the silicon oxide film 111. Then, the specimen is annealed in wet oxidation.

Micro defects and electron traps in the silicon oxide film 111 are decreased by this step. Since the low pressure chemical vapor deposition process is used, the thickness of the silicon oxide film 111 deposited on the upper surface and the side wall of the stacked film of the third gate 103a and the silicon oxide film 104a, and on the surface of the p-well 101, are substantially identical. Accordingly, the thickness of the silicon oxide film 111 between the side wall of the third gate 103a and the floating gate 107b is substantially identical with the thickness of the silicon oxide film (gate insulator film) 111 between the floating gate 107b and the p-well 101 (refer to FIG. 17).

Figure 17:
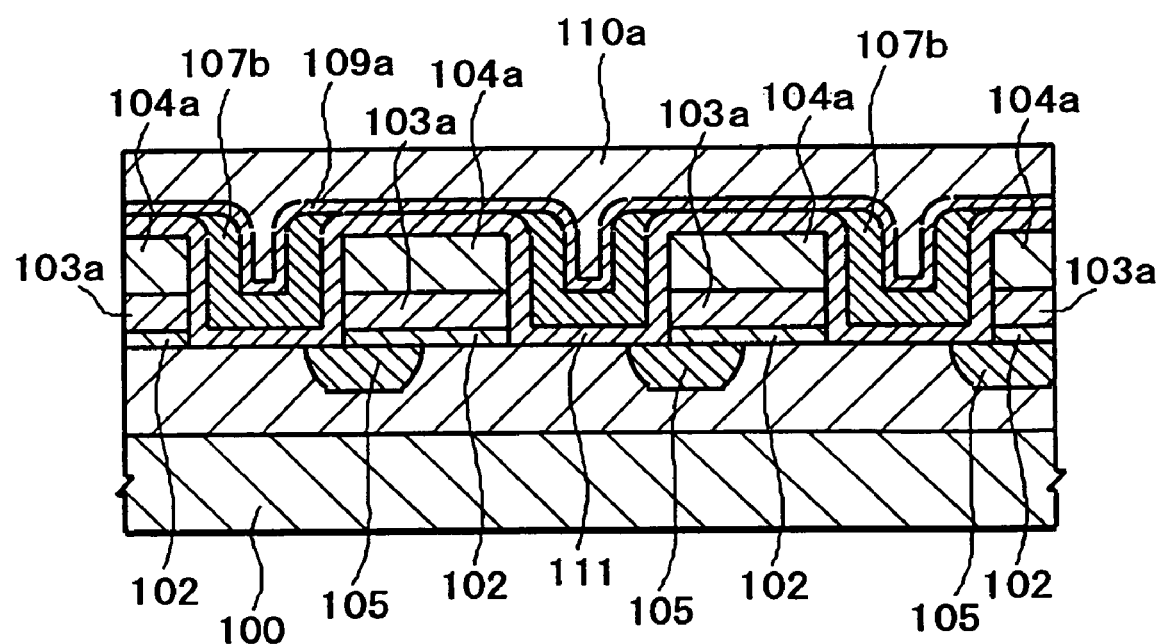
FIG. 17 is a cross sectional view for a main portion of a substrate showing a nonvolatile semiconductor memory device of the second preferred embodiment of the present invention.

Then, as shown in FIG. 17, a floating gate 107b, an ONO film 109a, and a word line (control gate) 110a are formed by the same method as in Embodiment 1, which has been explained with reference to FIGS. 7 to 10, to complete a memory cell.

The memory cell formed according to this second preferred embodiment, like the first preferred embodiment, caused no punch-through even when the gate length of the third gate was reduced and can operate stably. Further, the channel current is increased to improve the access time of the nonvolatile semiconductor memory device.

Further, in this second preferred embodiment, the thickness of the insulator film between the floating gate 107b and the sidewall of the third gate 103a can be decreased compared with that of Embodiment 1. Therefore, erasing operation can be conducted by applying voltage at about −13 V to the selected word line, at about 3 V to the third gate and at 0 V to the source/drain and the well, to conduct electron emission from the floating gate to the third gate. Thus, the internal operation voltage can be lowered and the area of the peripheral circuit region can be decreased compared with the first preferred embodiment.

As described above, in this second preferred embodiment of the nonvolatile semiconductor memory device of the present invention, memory cell area has been reduced while maintaining reliability after many writing/erasing cycles, access time has been improved, and internal operation voltage has been lowered.

Third Preferred Embodiment

In this embodiment, different from the first and second preferred embodiments, the present invention is applied to a split gate type memory cell having no third gate. The constitution, operation method and manufacturing method of a nonvolatile semiconductor memory device (flash memory) of a third preferred embodiment of the present invention are described below with reference to FIGS. 18 to 25.

Figure 25:
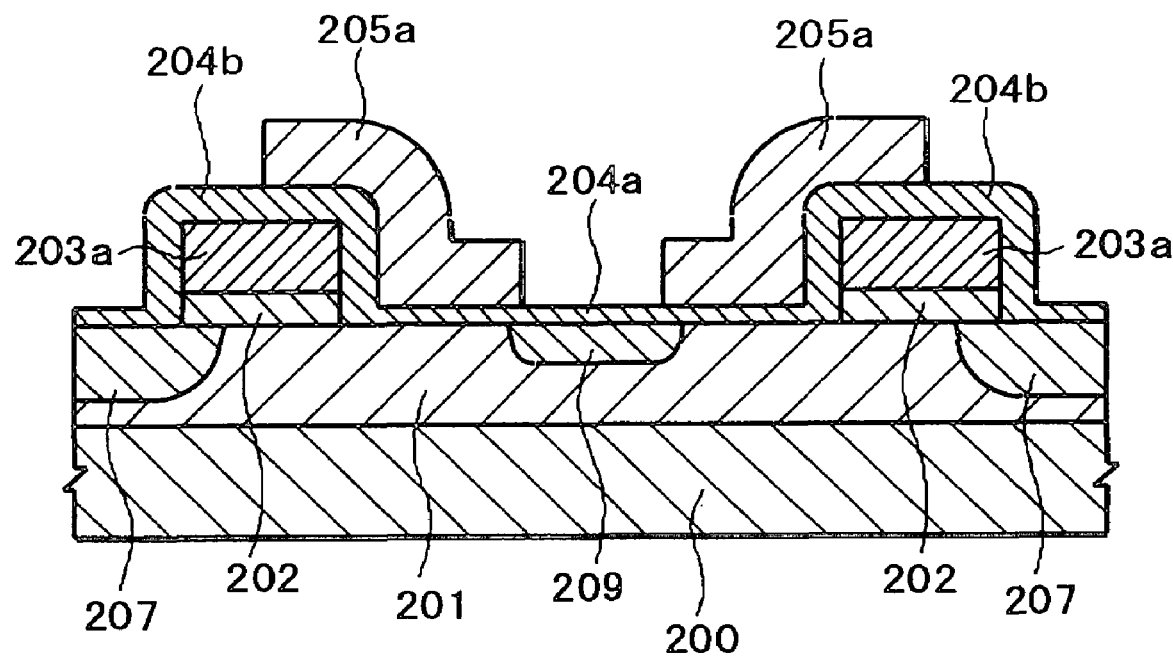
FIG. 25 is a cross sectional view for a main portion of a substrate showing a nonvolatile semiconductor memory device of the third preferred embodiment of the present invention.

At first, the structure of a flash memory cell is described. As shown in FIG. 25, this memory cell comprises a source 209, a drain 207, a floating gate 203a and a control gate 205a formed in a p-well 201 formed to a silicon substrate 200.

The floating gate 203a and the p-well 201 are isolated from each other by a gate insulator film 202, the control gate 205a and the p-well 201 are isolated from each other by a gate insulator film 204a, and the floating gate 203a and the control gate 205a are isolated from each other by an insulator film 204b, respectively.

A portion of the control gate 205a overlaps to a channel portion on the silicon substrate while the remaining portion thereof overlaps while riding over the floating gate 203a. The source 209 overlaps with the control gate 205a and the drain 207 overlaps with the floating gate 203a by way of the gate insulator film 204a or 202, respectively.

As described above, this memory cell is a so-called split gate type memory cell in which a transistor controlled by the control gate 205a and the transistor controlled by the floating gate 203a are connected in series.

Upon writing, voltage is applied at about 2 V to the control gate 205a and 12 V to the drain 207, and the p-well 201 and the source 209 are kept at 0 V. Thus, hot electrons are generated in the channel on the floating gate 203a at the source end and electrons are injected into the floating gate 203a.

Upon erasing, voltage is applied at 12 V to the drain 207 and at such a level as not deteriorating to the gate insulator film 204a, for example, 4 V to the control gate 205a, and the source 209 and the p-well 201 are kept at 0 V. Thus, electrons accumulated in the floating gate 203a are emitted by the tunnel phenomenon into the drain 207.

The reason for adopting such an erasing method is described below. That is, since the thickness of the gate insulator film 204a between the control gate 205a and the p-well 201 is reduced, a high voltage can not be applied between them and the voltage applied to the control gate 205a has to be restricted, for example, to about 4 V as described above. Accordingly, upon erasing, a method of applying a high potential (12 V) on the drain 207 to extract electrons toward the drain 207 has to be taken.

Also in the memory cell of this preferred embodiment, different from the memory cell shown in FIG. 60, the thickness of the gate insulator film 202 between the floating gate 203a and the p-well 201, a so-called tunnel insulator film, is made larger compared with the gate insulator film 204a between the control gate 205a and the p-well 201.

By increasing the thickness of the tunnel insulator film 202, it is possible to suppress charge retention failure caused by incidental leakage of electrons accumulated in the floating gate into the substrate at specified bits. Further, since the thickness of the gate insulator film 204a of the control gate 205a is reduced, punch-through resistance of the MOS transistor constituted with the control gate 205a is improved to reduce the gate length of the control gate 205a. Accordingly, improved reliability and the refinement of the memory cell are compatible with each other. Further, the channel current can be increased to improve the access time of the memory cell.

A preferred method of manufacturing the memory cell of this third preferred embodiment is described with reference to FIGS. 18 to 25.

Figure 18:
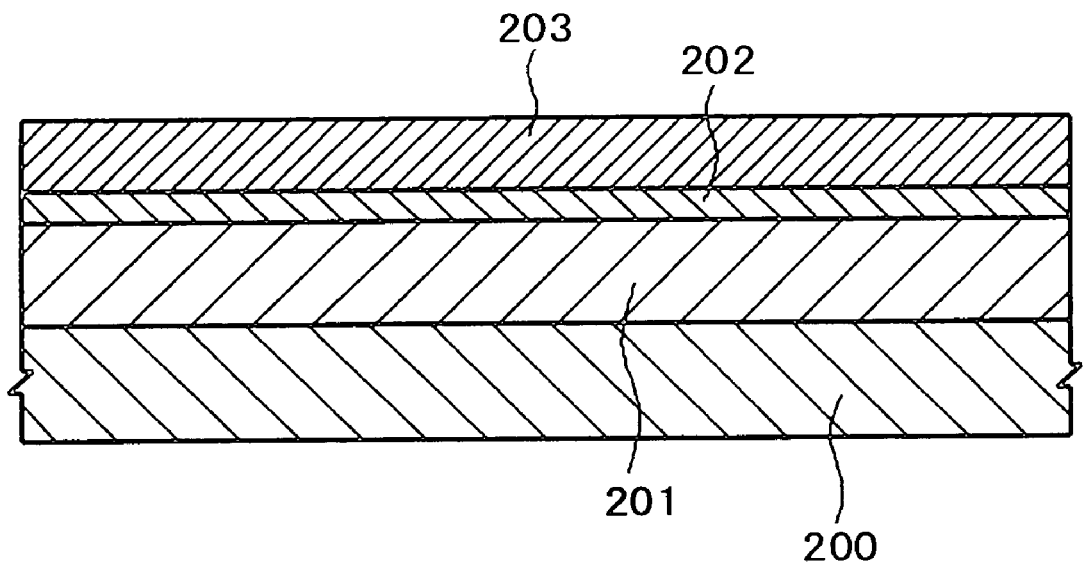
FIG. 18 is a cross sectional view for a main portion of a substrate showing a preferred manufacturing method of a nonvolatile semiconductor memory device of a third preferred embodiment of the present invention.
Figure 19:
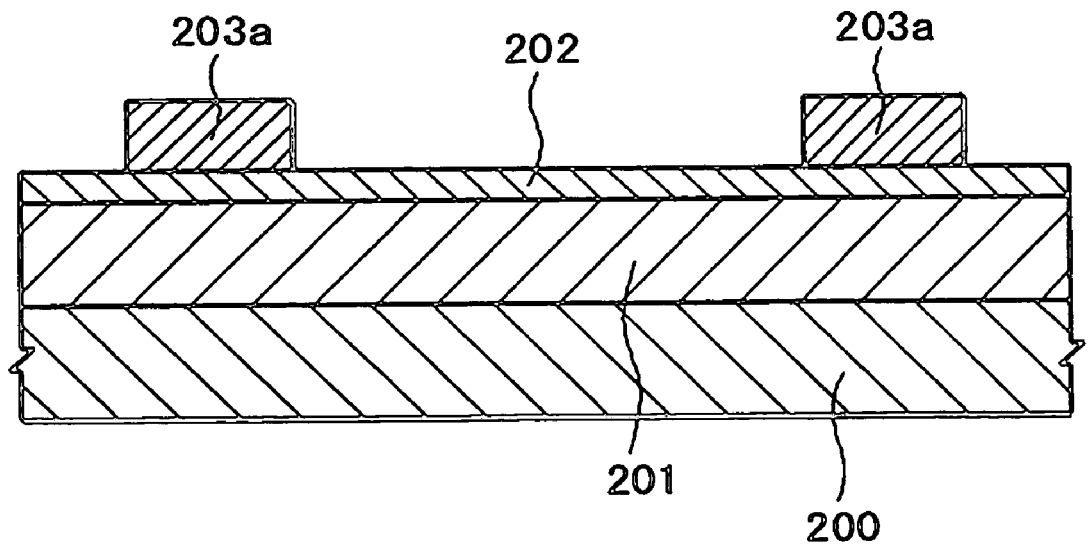
FIG. 19 is a cross sectional view for a main portion of a substrate showing a preferred manufacturing method of a nonvolatile semiconductor memory device of the third preferred embodiment of the present invention.

At first, as shown in FIG. 18, after forming a p-well 201 on a silicon substrate 200, a gate insulator film 202 of 9 nm thickness for isolating the floating gate from the well is formed by a known thermal oxidation process and, successively, a phosphorus-doped polysilicon film 203 as the floating gate is deposited. Then, as shown in FIG. 19, the polysilicon film 203 is patterned by known lithograph and dry etching technology. As a result, the polysilicon film 203 is formed as 203a (floating gate).

Figure 20:
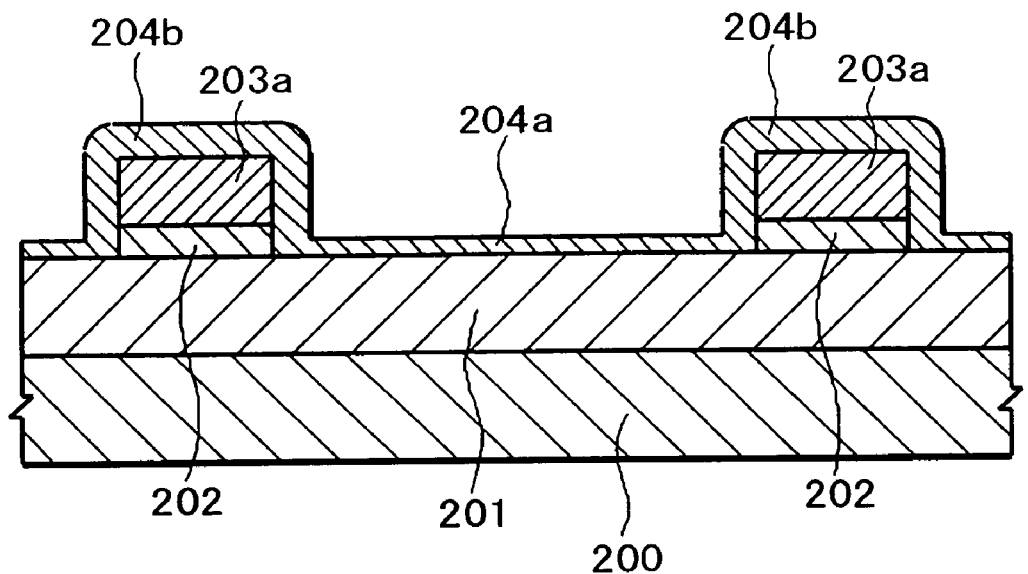
FIG. 20 is a cross sectional view for a main portion of a substrate showing a preferred manufacturing method of a nonvolatile semiconductor memory device of the third preferred embodiment of the present invention.

Further, as shown in FIG. 20, after patterning the gate insulator film 202, a thermal oxidation film (gate insulator film) 204a for isolating the control gate from the substrate is formed to 7.5 nm thickness on the silicon substrate by a known thermal oxidation process. In this step, a thermally oxidized film 204b of about 20 nm is formed on the sidewall and on the floating gate 203a to enable isolation between the floating gate and the control gate. The thickness of the thermally oxidized film 204b is larger than that of 204a, because phosphorus is doped in the polysilicon film as the material for the floating gate 203a and phosphorus caused accelerated oxidation.

Figure 21:
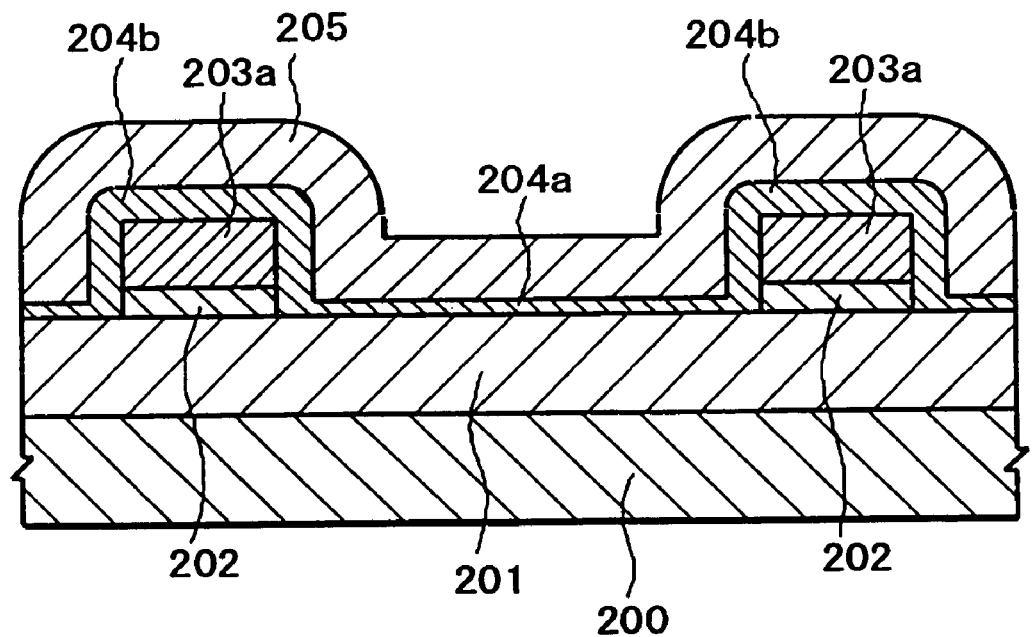
FIG. 21 is a cross sectional view for a main portion of a substrate showing a preferred manufacturing method of a nonvolatile semiconductor memory device of the third preferred embodiment of the present invention.
Figure 22:
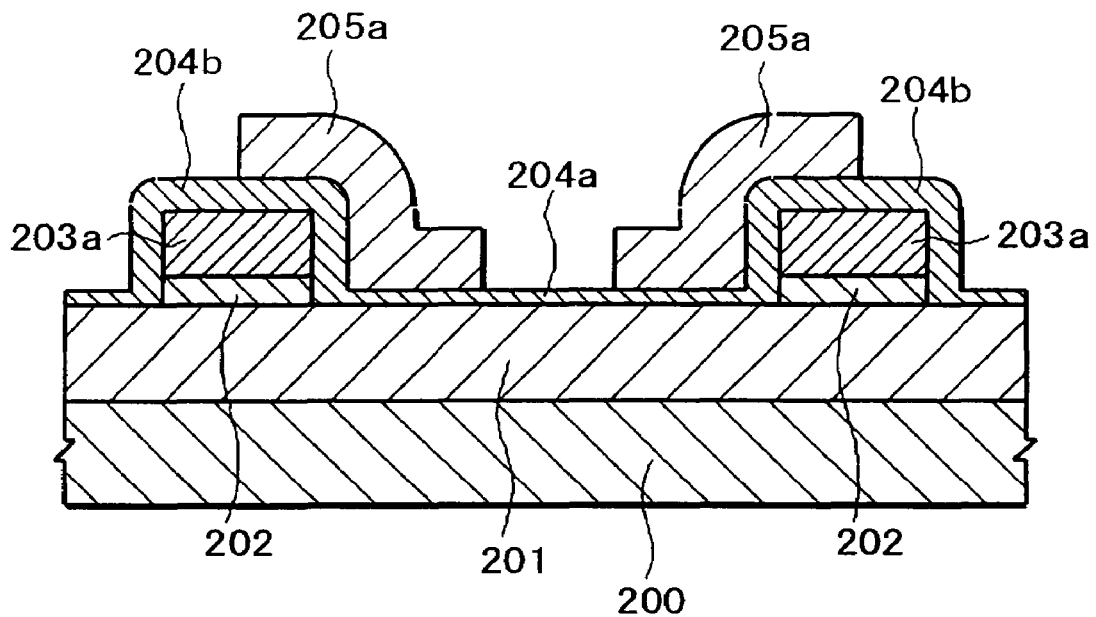
FIG. 22 is a cross sectional view for a main portion of a substrate showing a preferred manufacturing method of a nonvolatile semiconductor memory device of the third preferred embodiment of the present invention.

Successively, as shown in FIG. 21, a stacked film of a phosphorus-doped polysilicon film and a tungsten silicide film as the control gate 205, a so-called a polyside film, is deposited. Then, as shown in FIG. 22, the polyside film, 205 is patterned by known lithography and dry etching technology. As a result, the polyside film 205 is formed as 205a (control gate). As illustrated, the control gate 205a extends from about the center of the polysilicon film 203a to a position above the silicon substrate (p-well 201).

Figure 23:
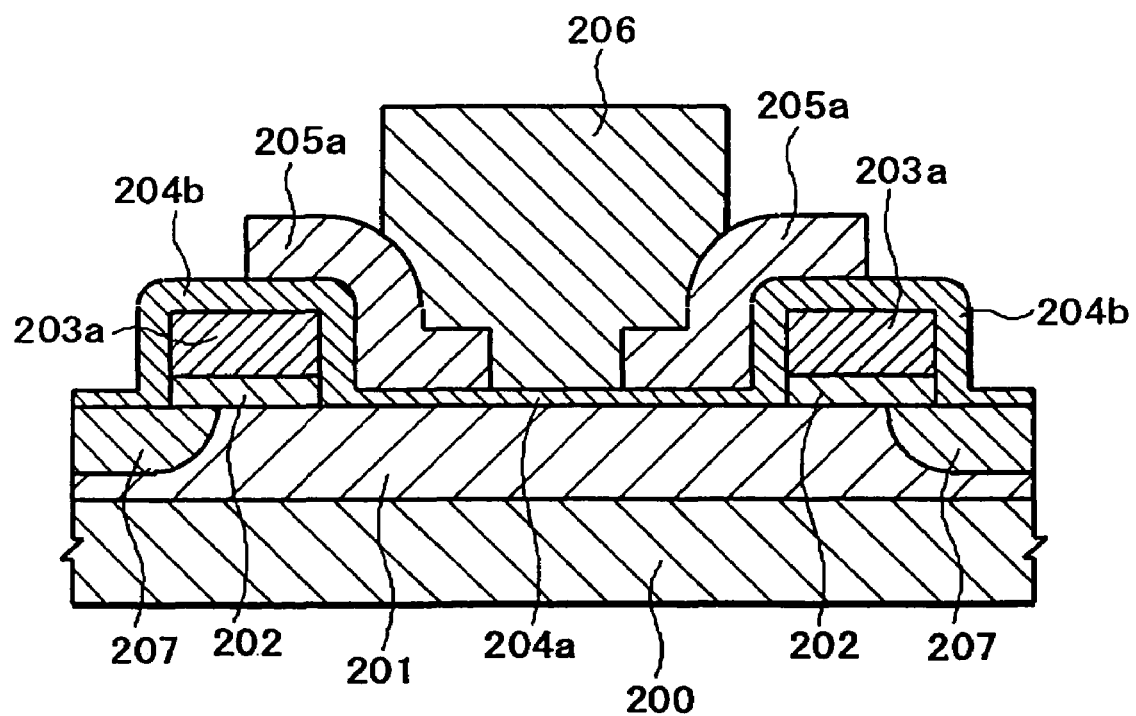
FIG. 23 is a cross sectional view for a main portion of a substrate showing a preferred manufacturing method of a nonvolatile semiconductor memory device of the third preferred embodiment of the present invention.

Subsequently, as shown in FIG. 23, a photo-resist pattern 206 is formed on the silicon substrate, phosphorus ions are ion implanted by an ion implantation process and a heat treatment is applied to form the drain region 207 of the memory cell.

Figure 24:
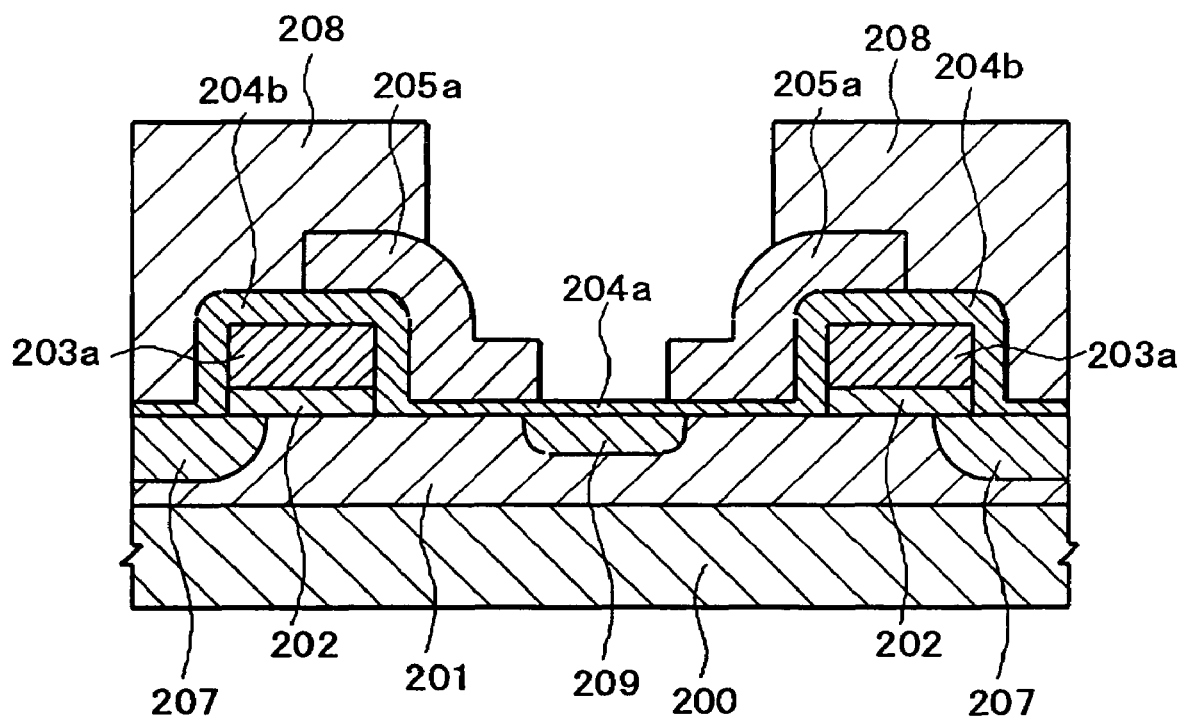
FIG. 24 is a cross sectional view for a main portion of a substrate showing a preferred manufacturing method of a nonvolatile semiconductor memory device of the third preferred embodiment of the present invention.

Successively, as shown in FIG. 24, a photo-resist pattern 208 is formed, and arsenic ions are implanted by an ion implanting process to form a source region 209 of the memory cell. Then, the photo-resist pattern 208 is removed (FIG. 25).

Subsequently, although not illustrated in the drawing, after forming an interlayer insulator film on the silicon substrate, a contact hole extending in the control gate 205a, the source region 209, the drain region 207 and the p-well 201 is formed and, successively, a metal film is deposited and patterned into wirings to complete the memory cell.

In this memory cell of the third preferred embodiment in which the thickness of the gate insulator film 202 between the floating gate 203a and the p-well 201 is made larger compared with the gate insulator film 204a between the control gate 205a and the p-well 201, when compared with the case in which the thickness of the gate insulator film 202 is made equal with or smaller than that of the gate insulator film 204a, the charge retention characteristic of the memory cell was comparable therewith after many writing/erasing cycles but punch-through did not occur even when the gate length of the control gate 205a was decreased and stable operation was possible. Further, a larger channel current was obtained to improve the access time of the nonvolatile semiconductor memory device.

As described above, in this third preferred embodiment of the nonvolatile semiconductor memory device of the present invention, memory cell area has been reduced while maintaining reliability after many writing/erasing cycles and access time has been improved.

Fourth Preferred Embodiment

In this fourth preferred embodiment, the invention is applied to a split gate type memory cell having an erasing gate as a third gate. The constitution, the operation method and the manufacturing method of a nonvolatile semiconductor memory device (flash memory) of the fourth preferred embodiment of the present invention are described below with reference to FIGS. 26 to 33.

Figure 32:
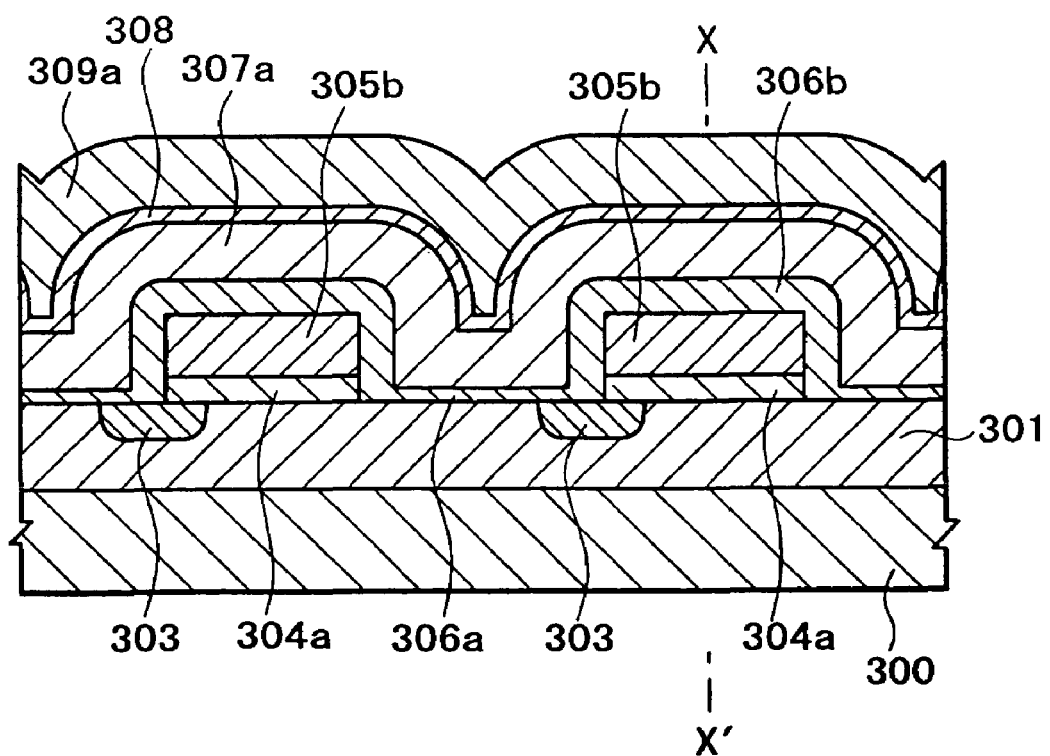
FIG. 32 is a cross sectional view for a main portion of a substrate showing a nonvolatile semiconductor memory device of the fourth preferred embodiment of the present invention.
Figure 33:
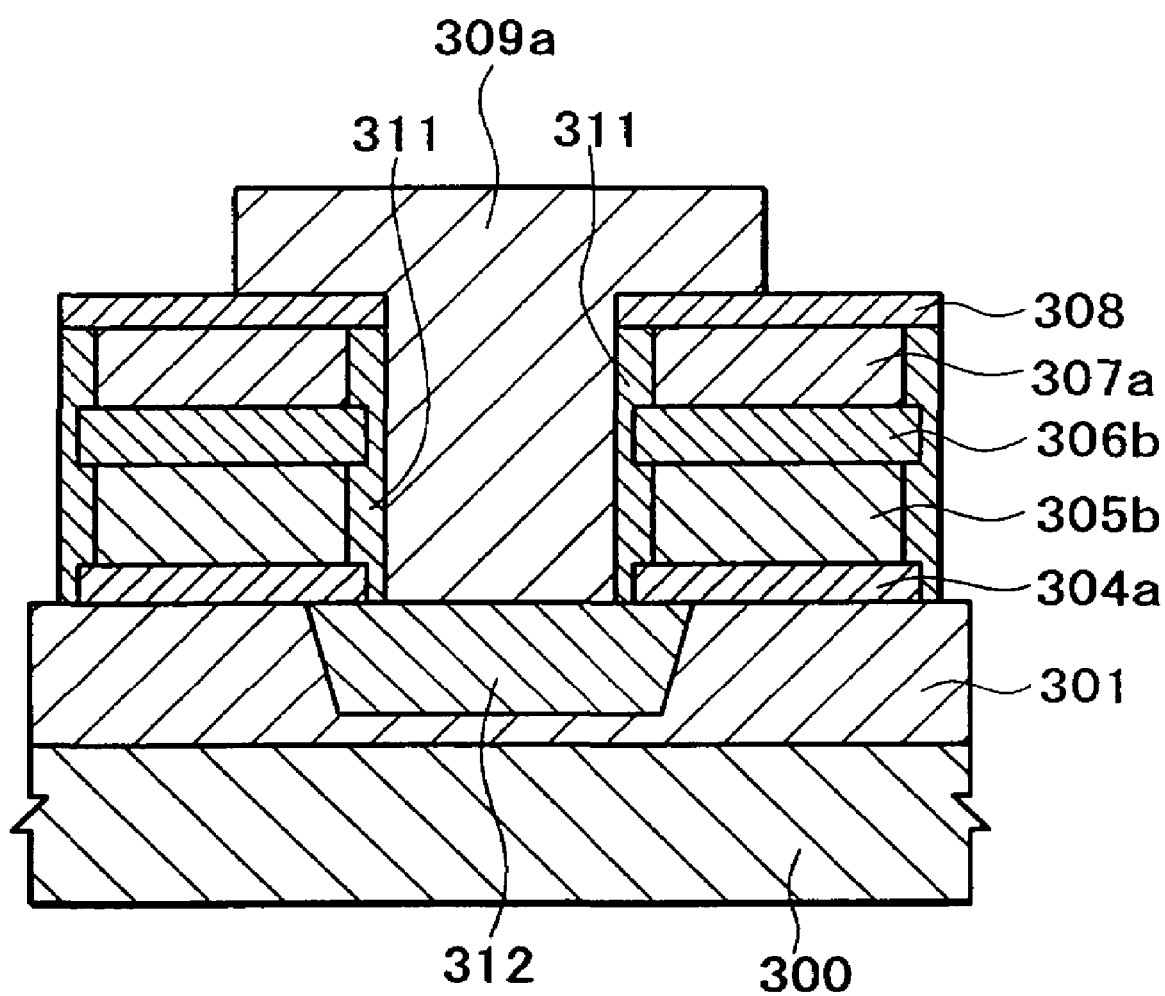
FIG. 33 is a cross sectional view for a main portion of a substrate showing a nonvolatile semiconductor memory device of the fourth preferred embodiment of the present invention.

As shown in FIG. 32 and FIG. 33, which is a cross sectional view taken along X–X' in FIG. 32, the memory cell comprises a source/drain diffusion layer 303 in a p-well 301 formed on the main surface of a silicon substrate 300, a floating gate 305b as a first gate, a control gate 307a as a second gate, and an erasing gate 309a as a third gate.

The control gate 307a for each of the memory cells is connected in the direction of a row to form a word line. The floating gate 305 and the p-well 301 are isolated from each other by a gate insulator film 304a, the floating gate 305b and the word line (control gate) 307a are isolated from each other by an insulator film 306b, and the erasing gate 309a and the word line (control gate) 307a are isolated from each other by an insulator film 308.

Further, as shown in FIG. 33, the floating gate 305b and the erasing gate 309a are isolated from each other by an insulator film 311. Further, the erasing gate 309a and the p-well 301 are also isolated from each other by an insulator film 312. The insulator film 312 is buried in the p-well 301.

The source/drain diffusion 303 is disposed perpendicular to the word line (control gate) 307a and is present as a local source line and a local data line connecting the source/drain of the memory cell in the columnar direction. That is, the nonvolatile semiconductor memory device of this fourth preferred embodiment comprises a so-called contactless array having no contact hole on every memory cell.

Upon writing, a voltage is applied at about 12 V to the control gate 307a, at about 4 V to the drain (303), and the p-well 301 and the source (303) are kept at 0 V. Thus, hot electrons are generated in the channel on the drain end and electrons are injected into the floating gate 305b.

Upon erasing, a voltage at about 10 V is applied to the erasing gate 309a, while the control gate 307a, the source 303 and the p-well 301 are kept at 0 V. Thus, electrons accumulated in the floating gate 305b are discharged by the tunnel phenomenon into the erasing gate 309a.

Also in this preferred embodiment, different from the memory cell shown in FIG. 60, the thickness of the insulator film 304a between the floating gate 305b and the p-well 301, a so-called tunnel insulator film, is made greater compared with the gate insulator film 306a between the control gate 307a and the p-well 301.

By increasing the thickness of the tunnel insulator film 304a, it is possible to suppress charge retention failure caused by incidental leakage of electrons accumulated in the floating gate into the substrate at specified bits.

Further, since the thickness of the gate insulator film 306a of the control gate 307a is reduced, punch-through resistance of the MOS transistor constituted with the control gate 307a can be improved to reduce the gate length of the control gate 307a.

Accordingly, improved reliability and the refinement of the memory cell are compatible with each other. Further, the channel current can be increased to improve the access time of the memory cell.

A preferred method of manufacturing the memory cell of the fourth preferred embodiment is described below with reference to FIGS. 26 to 33.

Figure 26:
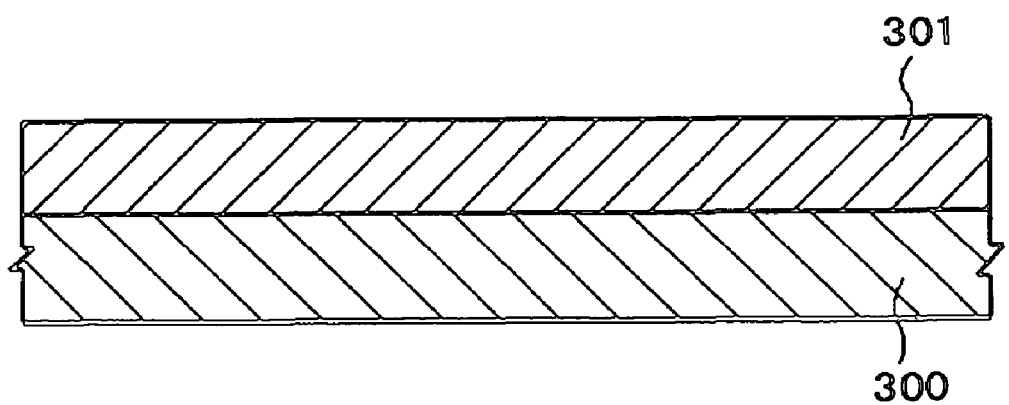
FIG. 26 is a cross sectional view for a main portion of a substrate showing a preferred manufacturing method of a nonvolatile semiconductor memory device of a fourth preferred embodiment of the present invention.
Figure 27:
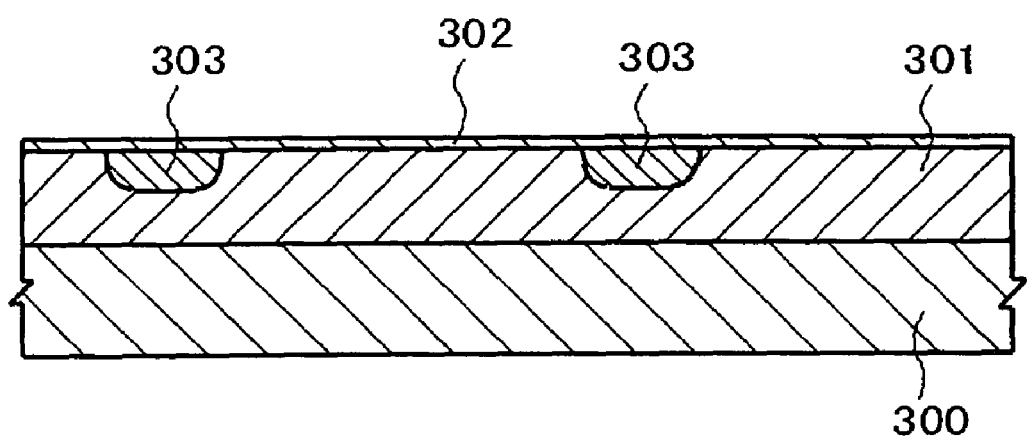
FIG. 27 is a cross sectional view for a main portion of a substrate showing a preferred manufacturing method of a nonvolatile semiconductor memory device of the fourth preferred embodiment of the present invention.

At first, as shown in FIG. 26, a p-well 301 is formed on a silicon substrate 300. Successively, as shown in FIG. 27, after forming a thin oxide film 302 on the surface of the p-well 301, arsenic ions are implanted by an ion implantation process to form a diffusion layer 303 as source/drain of the memory cell.

Figure 28:
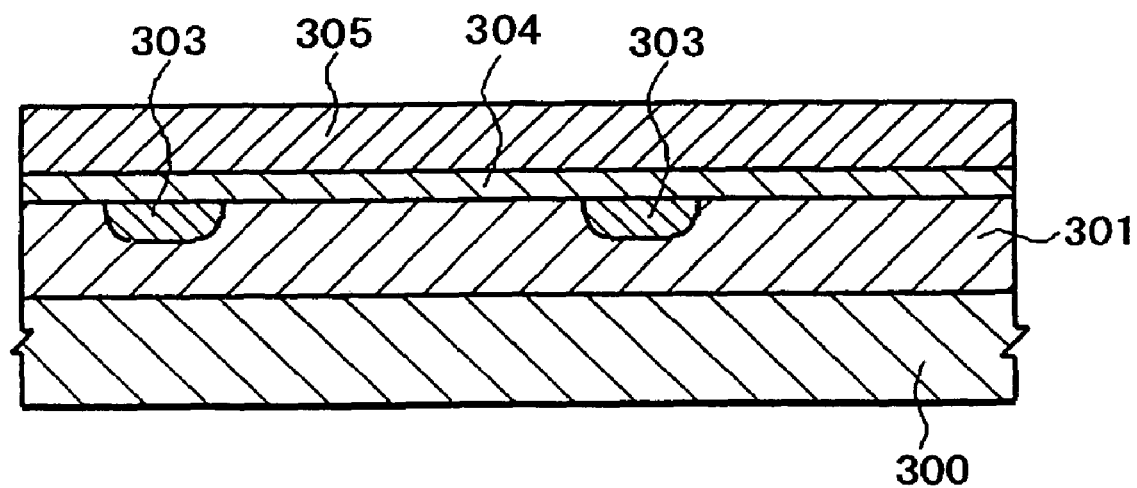
FIG. 28 is a cross sectional view for a main portion of a substrate showing a preferred manufacturing method of a nonvolatile semiconductor memory device of the fourth preferred embodiment of the present invention.

Then, as shown in FIG. 28, a gate insulator film 304 of 9 nm for isolating the floating gate from the well, and a phosphorus-doped polysilicon film 305 as a floating gate are formed successively by a known thermal oxidation process.

Figure 29:
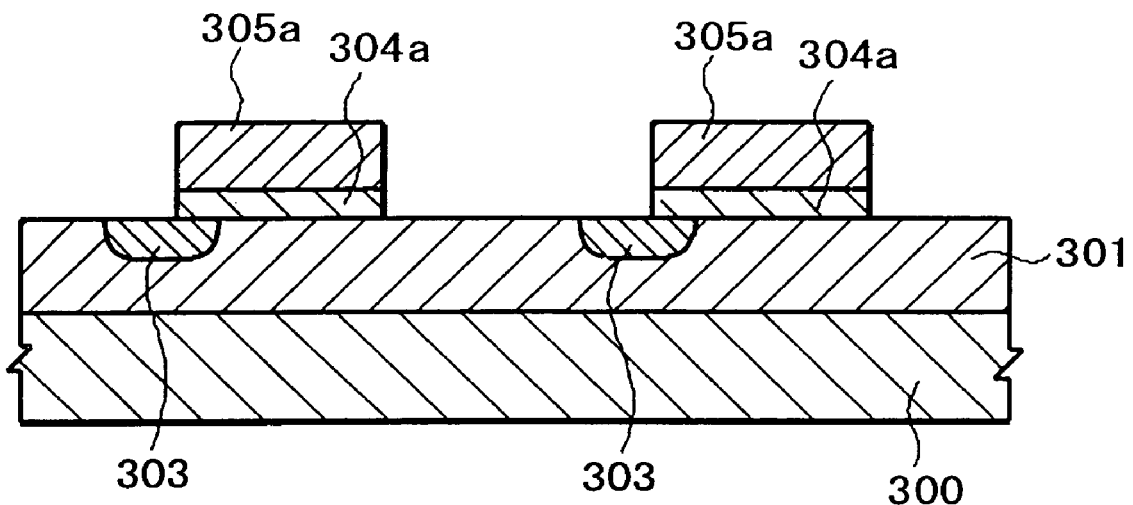
FIG. 29 is a cross sectional view for a main portion of a substrate showing a preferred manufacturing method of a nonvolatile semiconductor memory device of the fourth preferred embodiment of the present invention.

Then, as shown in FIG. 29, the polysilicon film 305 and the gate insulator film 304 are patterned by known lithography and dry etching technology. As a result, the polysilicon film 305 is formed as 305a and the gate insulator film 304 is formed as 304a.

Figure 30:
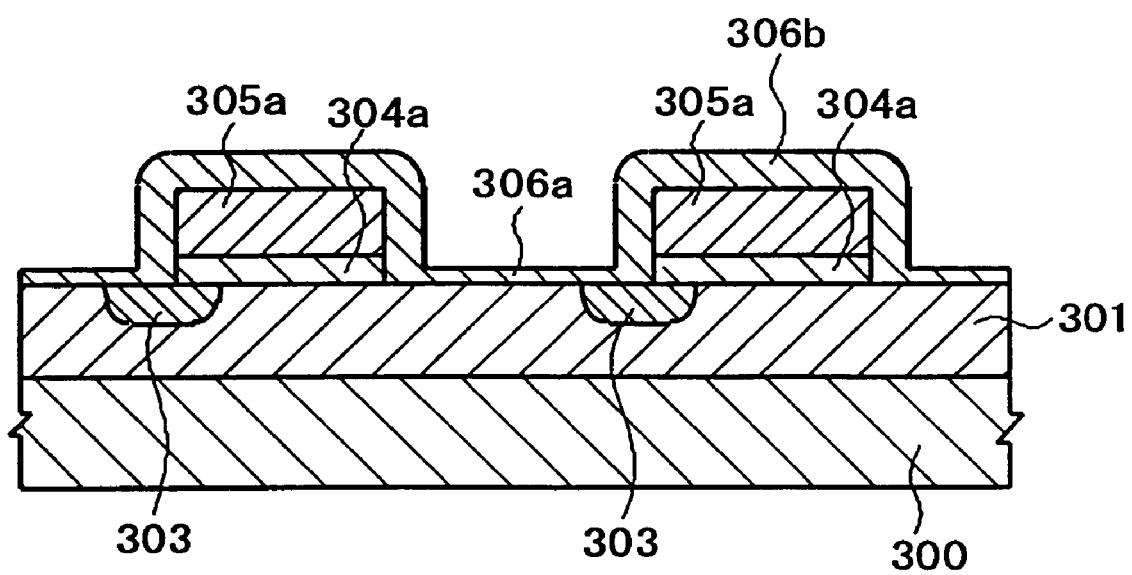
FIG. 30 is a cross sectional view for a main portion of a substrate showing a preferred manufacturing method of a nonvolatile semiconductor memory device of the fourth preferred embodiment of the present invention.

Then, as shown in FIG. 30, by a known thermal oxidation process, a thermal oxidation film 306a for isolating the control gate from the substrate is formed to 7 nm thickness on the silicon substrate (p-well 301) by a known thermal oxidation process. In this case, a thermal oxidation film 306b of about 20 nm thickness is formed on the side wall and on the upper surface of the polysilicon film 305a to isolate the floating gate and the control gate from each other. The thickness of the thermal oxidation film 306b is larger compared with 306a because phosphorus is doped in the polysilicon film 305 as the material for the floating gate 305b, and phosphorus caused accelerated oxidation.

Figure 31:
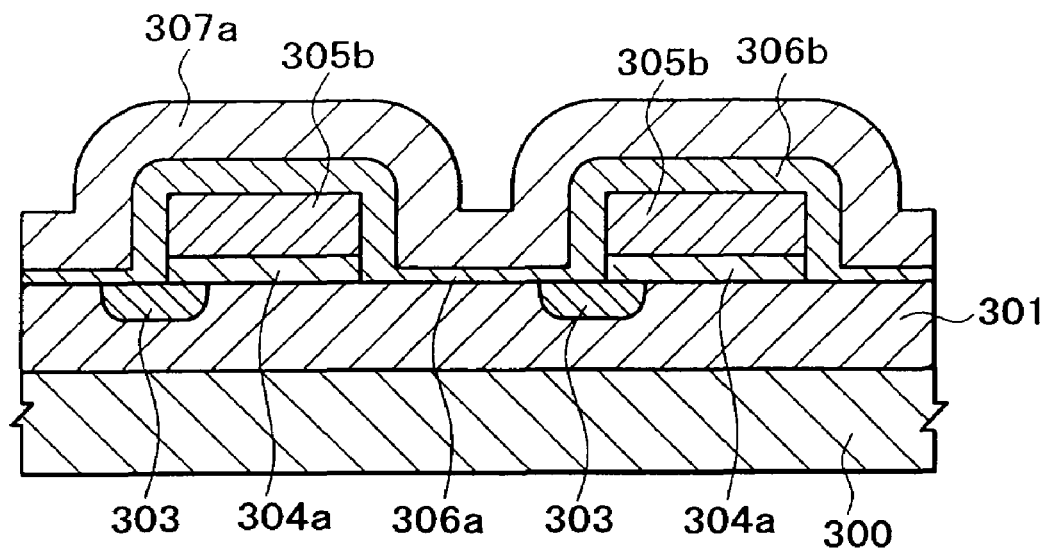
FIG. 31 is a cross sectional view for a main portion of a substrate showing a preferred manufacturing method of a nonvolatile semiconductor memory device of the fourth preferred embodiment of the present invention.

Then, as shown in FIG. 31, a polysilicon film 307 is deposited, which is patterned by known lithography and dry etching technology to form word lines (control gate). As a result, the polysilicon film 307 is formed as 307a (word line, control gate) (refer to FIG. 33).

Further, the thermal oxidation film 306b and the polysilicon film 305a are etched successively using the word line (control gate) 307a as the mask to complete a floating gate. Thus, the thermal oxidation film is formed as 306b and the polysilicon film 305a is formed as 305b (floating gate) (refer to FIG. 33).

Then, as shown in FIGS. 32 and 33, insulator films 308 and the 311 for isolating the control gate from the erasing gate, and the floating gate from the erasing gate, and a polyside film 309 as the erasing gate are formed successively, and the polyside film 309 is patterned to form an erasing gate 309a (FIG. 33).

Then, although not illustrated in the drawing, after forming an interlayer insulator film on the silicon substrate, a contact hole extending in the word line (control gate) 307a, the source/drain diffusion layer 303, the p-well 301, and the erasing gate 309 is formed and, successively, a metal film is deposited which is patterned and wired to compete a memory cell.

In this memory cell of the fourth preferred embodiment in which the thickness of the gate insulator film 304a between the floating gate 305b and the p-well 301 is made larger compared with the gate insulator film 306a between the control gate 307a and the p-well 301, when compared with the case in which the thickness of the gate insulator film 304a is made equal with or smaller than that of the gate insulator film 306a, the charge retention characteristic of the memory cell was comparable therewith after many writing/erasing cycles but punch-through did not occur, even when the gate length of the control gate was decreased and stable operation was possible. Further, a larger channel current was obtained to improve the access time of the nonvolatile semiconductor memory device.

As described above, in this fourth preferred embodiment of the nonvolatile semiconductor memory device of the present invention, memory cell area has been reduced while maintaining reliability after many writing/erasing cycles and access time has been improved.

In this preferred embodiment, while the gate insulator film 304 or the like for isolating the floating gate from the p-well preferably was formed by a thermal oxidation process, it may also be formed by low pressure chemical vapor deposition process as in preferred Embodiment 2, and the same effect can also be obtained by using a nitrogen-added oxide film.

Fifth Preferred Embodiment

In this preferred embodiment, described is an example of a simplified production method by simultaneously forming a gate insulator film of a memory cell and a gate insulator film of MOS transistors for a low voltage system peripheral circuit of a nonvolatile semiconductor memory device. The constitution and the manufacturing method of a nonvolatile semiconductor memory device of this fifth preferred embodiment of the present invention are described below with reference to FIGS. 34 to 46.

Figure 46:
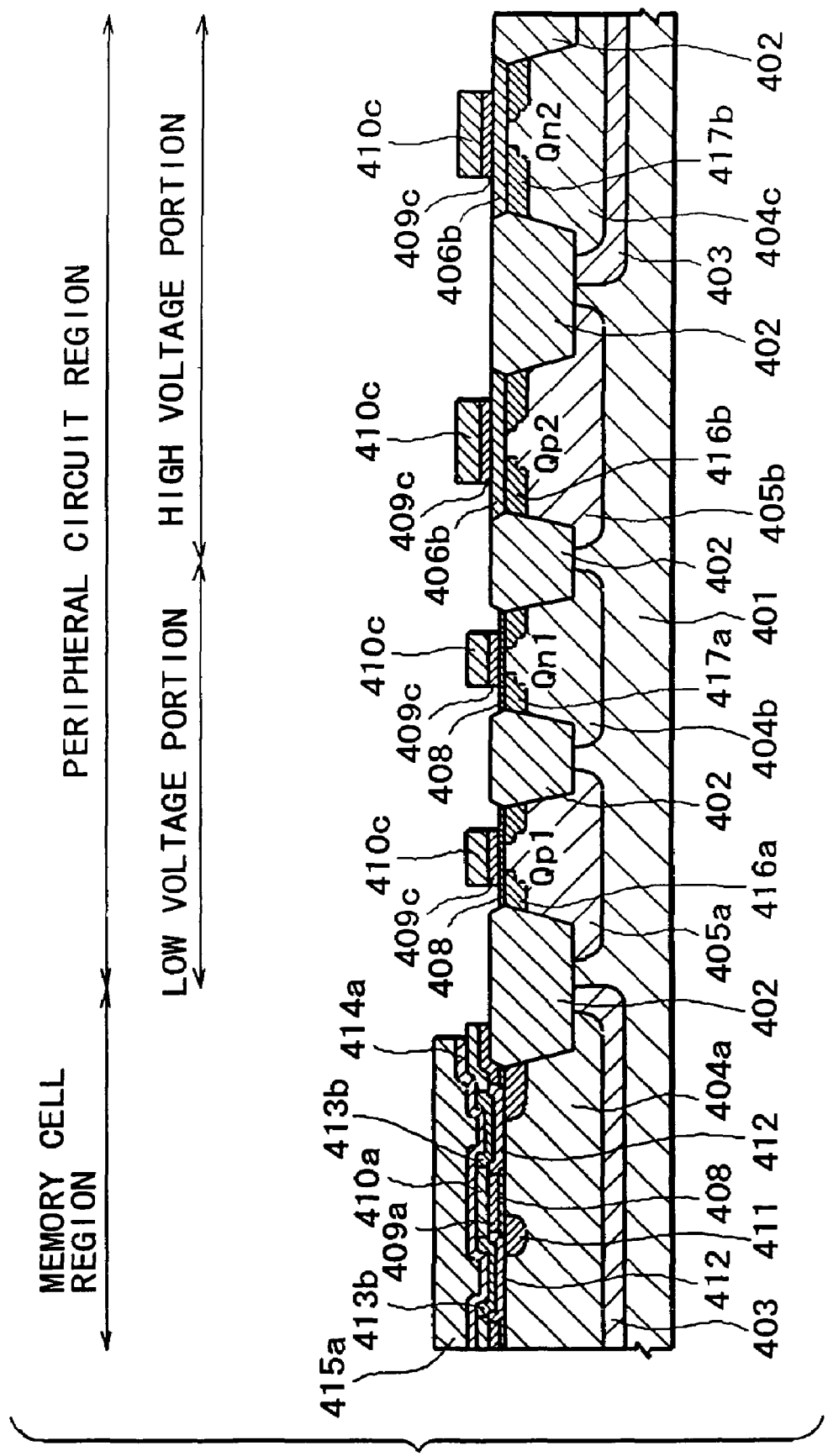
FIG. 46 is a cross sectional view for a main portion of a substrate showing a nonvolatile semiconductor memory device of the fifth preferred embodiment of the present invention.

As shown in FIG. 46, the nonvolatile semiconductor memory device of this preferred embodiment comprises a memory cell region in which a plurality of memory cells for storing information are arranged in a matrix and a peripheral circuit region in which a plurality of MOS transistors (MISFET) are arranged for selecting bits for conducting writing, erasing or reading and constituting a peripheral circuit for generating a voltage necessary in the chip.

The peripheral circuit region is divided into a low voltage portion in which only a relatively low voltage, for example, of 3.3 V of a power source voltage is applied and a high voltage portion in which a high voltage necessary for writing, for example, of 18 V is applied.

Each of the low voltage portion and the high voltage portion comprises, as shown in FIG. 46, a plurality of NMOS transistors (Qn1, Qn2) and PMOS transistors (Qp1, Qp2) formed on the p-wells 404b, 404c and the n-wells 405a, 405b.

The memory cell formed in the memory cell region is a flash memory as has been described above with respect to the first preferred embodiment and is formed on a p-well 404a.

FIG. 34 to FIG. 46 are cross sectional views parallel with the word lines (control gate) 415a of the memory cell and perpendicular to the word lines 409c of the peripheral circuit MOS transistors.

A preferred manufacturing method of the nonvolatile semiconductor memory device of this preferred embodiment is described below with reference to FIGS. 34 to 46.

Figure 34:
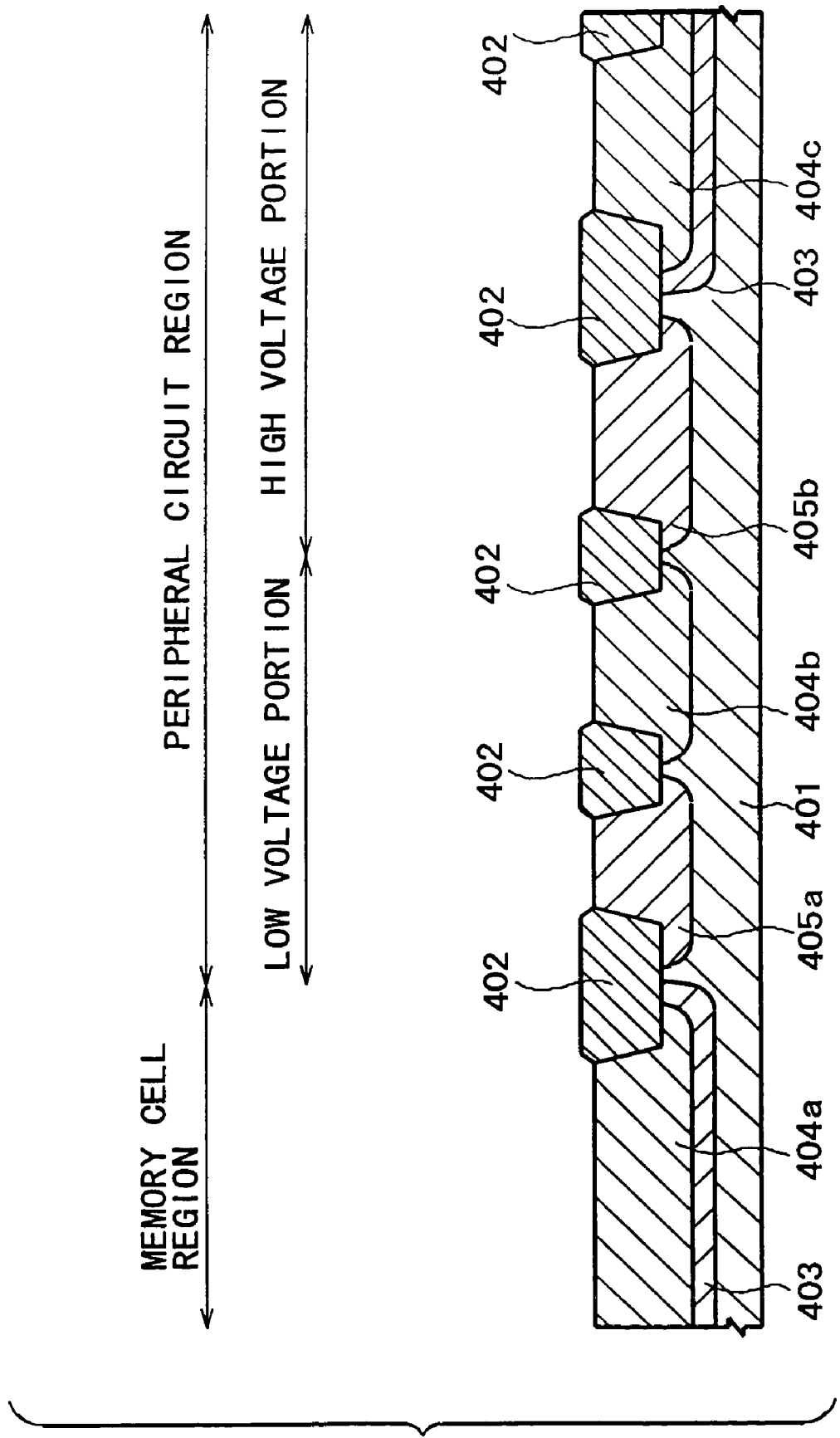
FIG. 34 is a cross sectional view for a main portion of a substrate showing a preferred manufacturing method of a nonvolatile semiconductor memory device of a fifth preferred embodiment of the present invention.

First, as shown in FIG. 34, a shallow trench isolation region 402 for isolating each of the memory cells and the peripheral circuit MOS transistors is formed to a p-Si substrate 401 of face orientation (100). Then, P-well regions 404a, 404b, 404c and N-well regions 405a, 405b, as well as isolation regions 403 between the wells, are formed by an ion implantation process.

Figure 35:
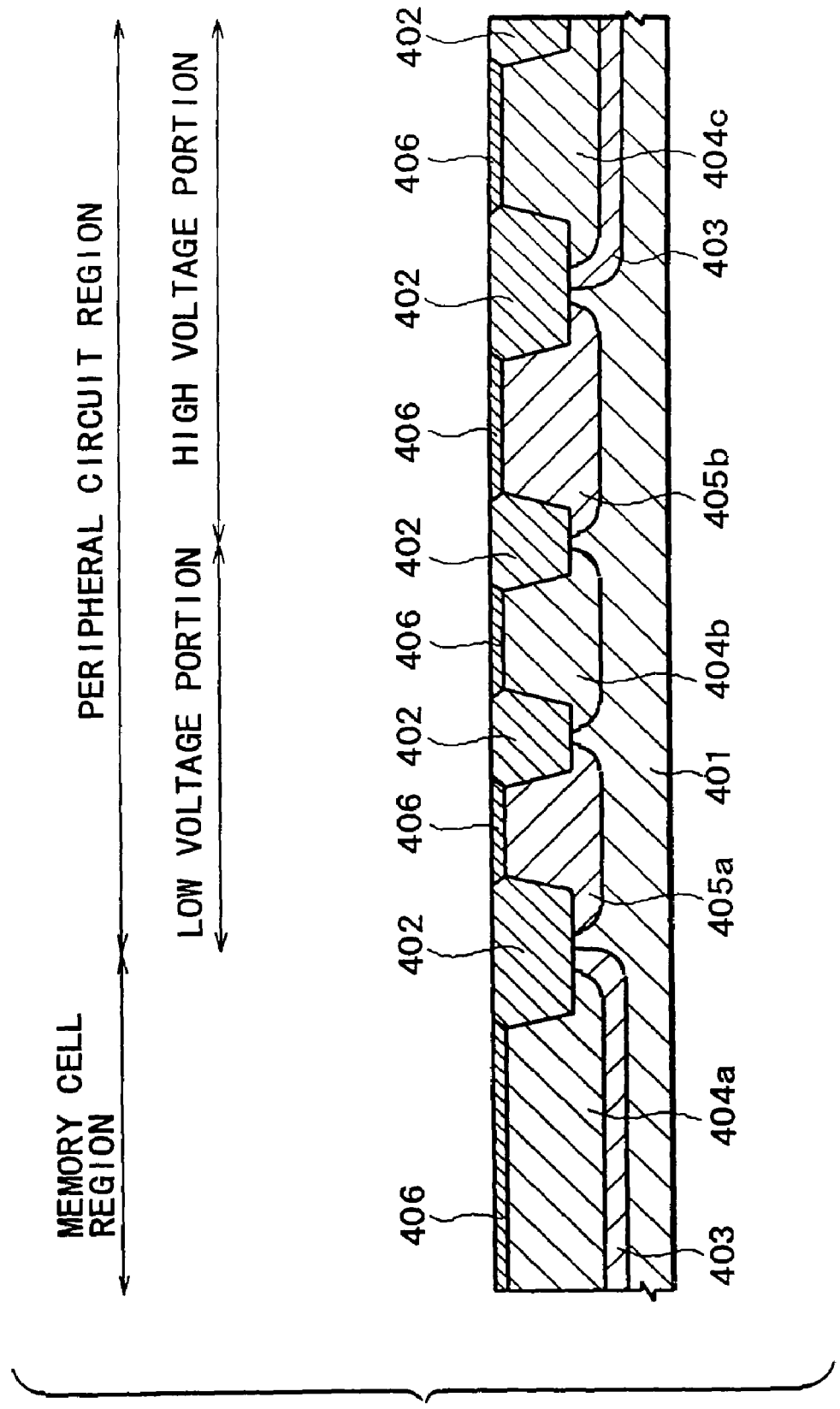
FIG. 35 is a cross sectional view for a main portion of a substrate showing a preferred manufacturing method of a nonvolatile semiconductor memory device of the fifth preferred embodiment of the present invention.
Figure 36:
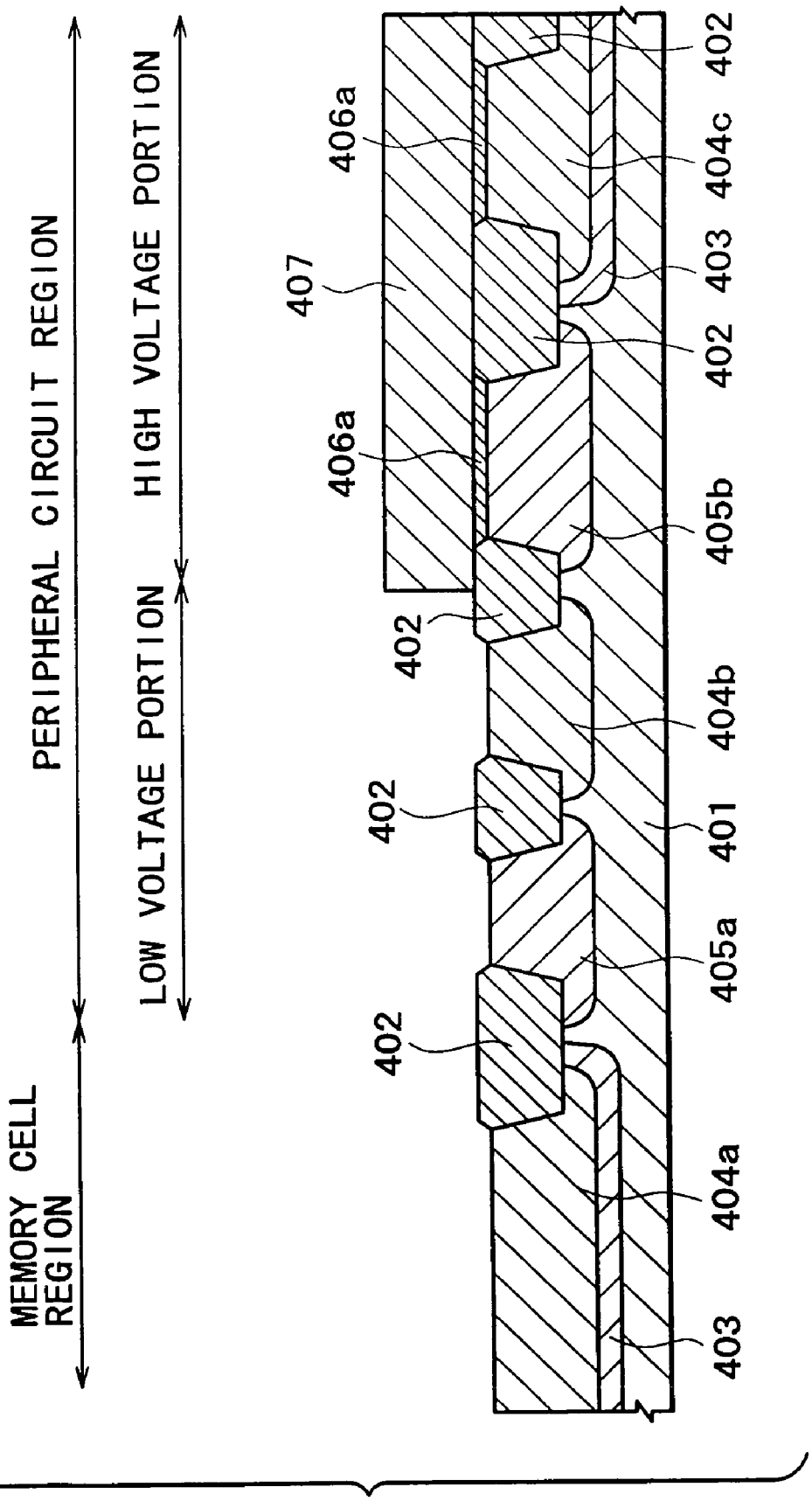
FIG. 36 is a cross sectional view for a main portion of a substrate showing a preferred manufacturing method of a nonvolatile semiconductor memory device of the fifth preferred embodiment of the present invention.

Then, as shown in FIG. 35, a silicon oxide film 406 as a gate insulator film of the high voltage portion in the peripheral circuit region is formed to about 23 nm by a thermal oxidation process. Then, as shown in FIG. 36, a photo-resist pattern 407 is formed and the silicon oxide film 406 is left only in the high voltage portion of the peripheral circuit region by a wet etching process. As a result, the silicon oxide film 406 is formed as 406a.

Figure 37:
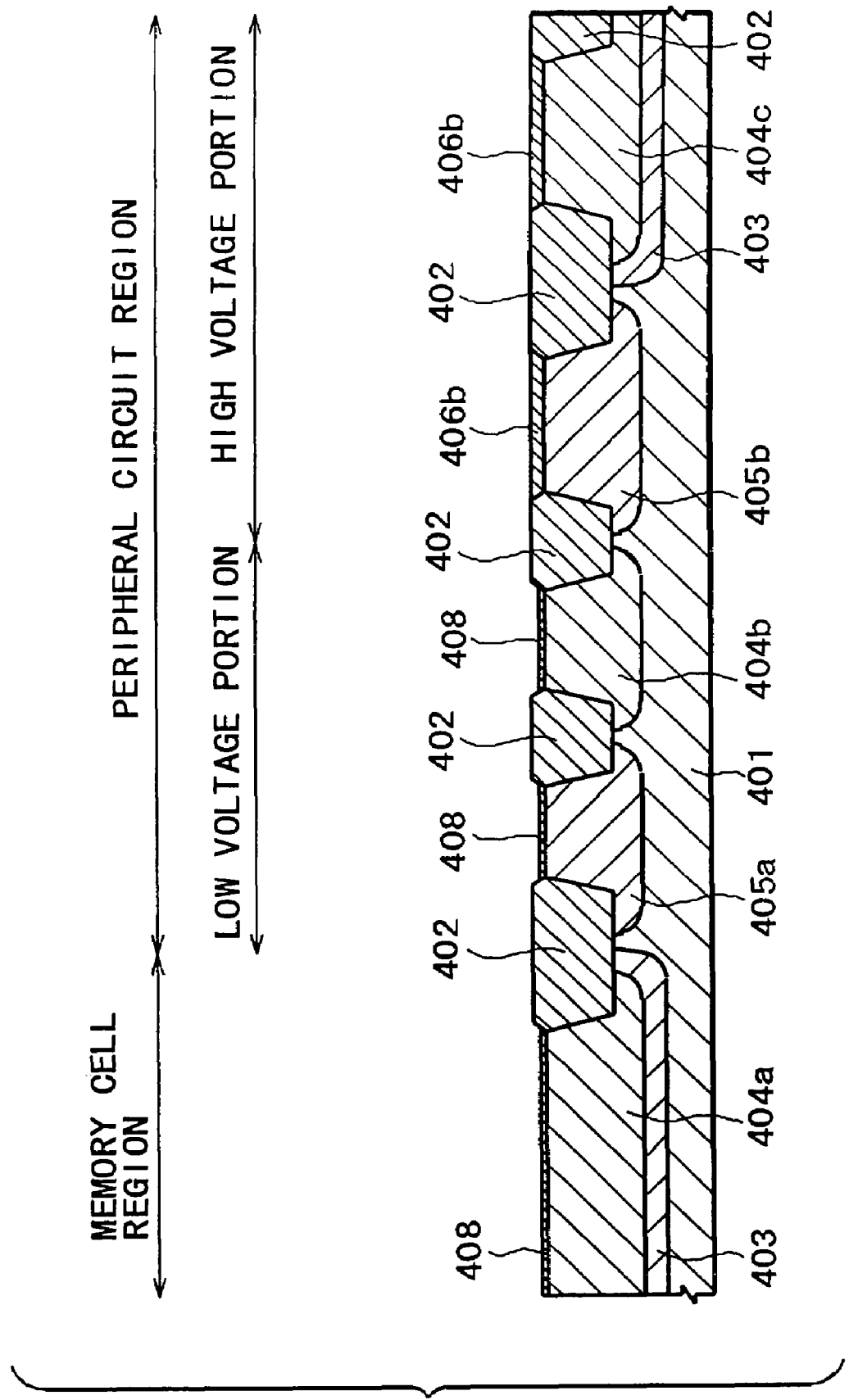
FIG. 37 is a cross sectional view for a main portion of a substrate showing a preferred manufacturing method of a nonvolatile semiconductor memory device of the fifth preferred embodiment of the present invention.

Then, as shown in FIG. 37, a thermally oxidized film 408, having a thickness of 7.5 nm, as a gate insulator film of the peripheral MOS transistors and the insulator film for isolating the third gate from the well of the memory cell is formed to the low voltage portion in the peripheral circuit region and the memory cell region by a thermal oxidation process.

In this step, the thickness of the thermally oxidized film for the high voltage portion in the peripheral circuit region is 25 nm. That is, the thickness of the silicon oxide film 406a is increased and formed as 406b (gate insulator film of the high voltage portion).

Figure 38:
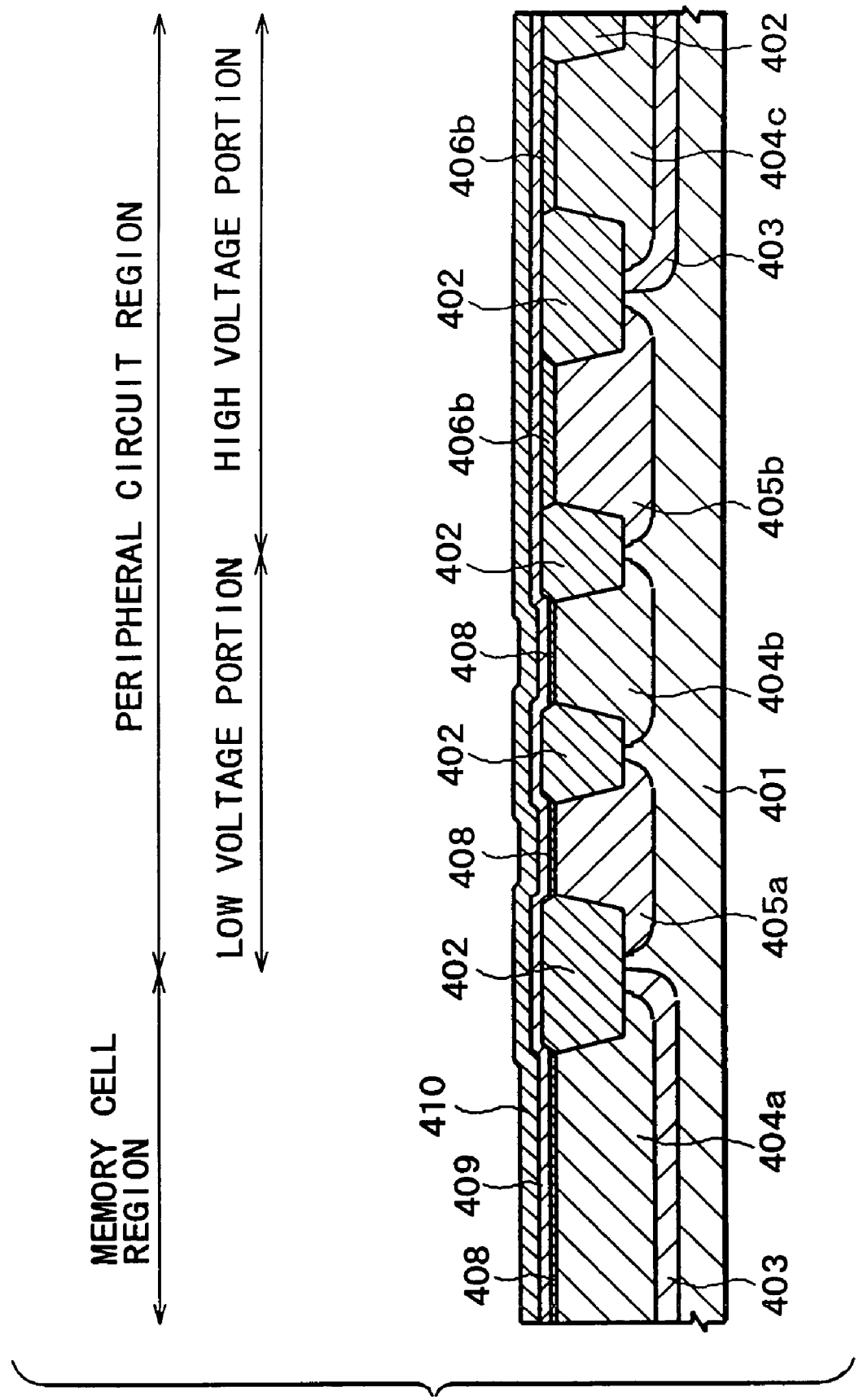
FIG. 38 is a cross sectional view for a main portion of a substrate showing a preferred manufacturing method of a nonvolatile semiconductor memory device of the fifth preferred embodiment of the present invention.

Then, as shown in FIG. 38, a polysilicon film 409 as the electrode of the third gate and of the peripheral MOS transistors and the third gate of the memory cell and a silicon oxide film 410 are deposited successively.

Figure 39:
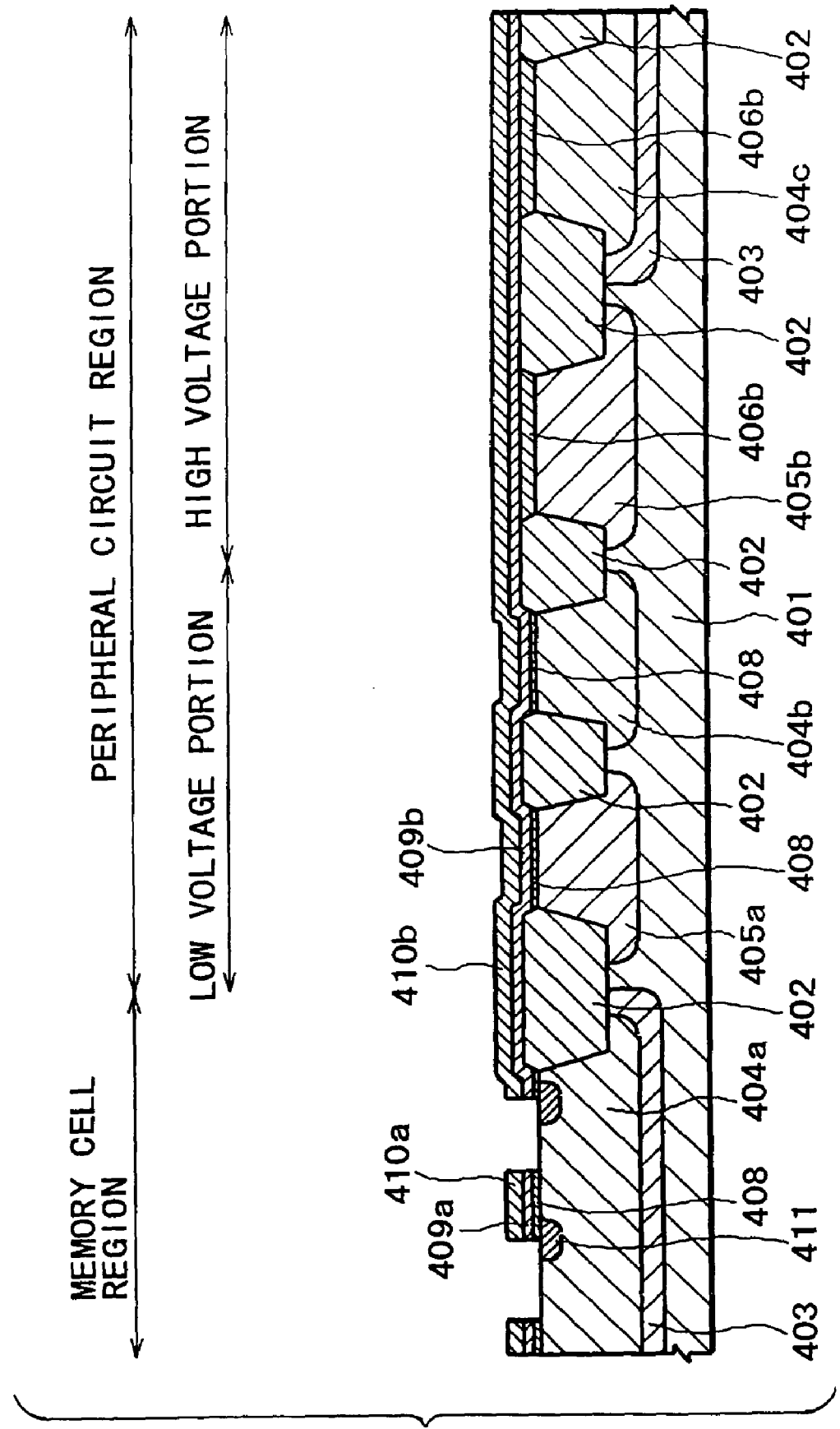
FIG. 39 is a cross sectional view for a main portion of a substrate showing a preferred manufacturing method of a nonvolatile semiconductor memory device of the fifth preferred embodiment of the present invention.

Successively, as shown in FIG. 39, the silicon oxide film 410 and the polysilicon film 409 are patterned by using lithographic and dry etching technology. As a result, the silicon oxide film 410 and the polysilicon film 409 in the memory cell region are formed as 410a and 409a, respectively. In this step, it is patterned such that the silicon oxide film 410 and the polysilicon film 409 of the peripheral circuit region are not etched but left as 410b and 409b.

Then, tilted ion implantation is applied in the same manner as in the first preferred embodiment to form a source/drain diffusion layer region 411 of the memory cell.

Figure 40:
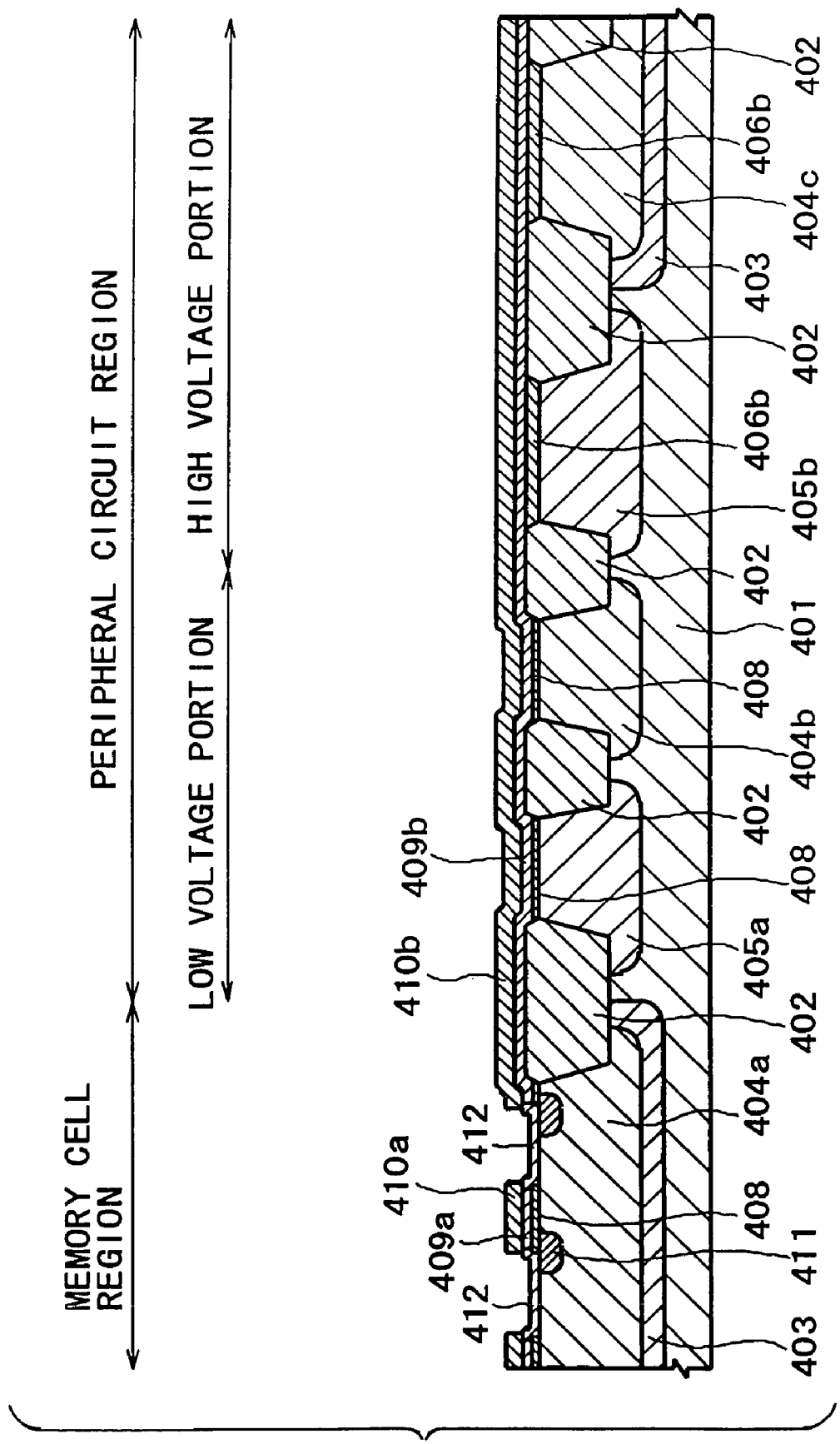
FIG. 40 is a cross sectional view for a main portion of a substrate showing a preferred manufacturing method of a nonvolatile semiconductor memory device of the fifth preferred embodiment of the present invention.

Then, as shown in FIG. 40, an insulator film 412 for isolating the floating gate from the well and for isolating the floating gate from the third gate is formed by a thermal oxidation process. In this step, the thickness of the oxide film on the well is 9.0 nm.

Figure 41:
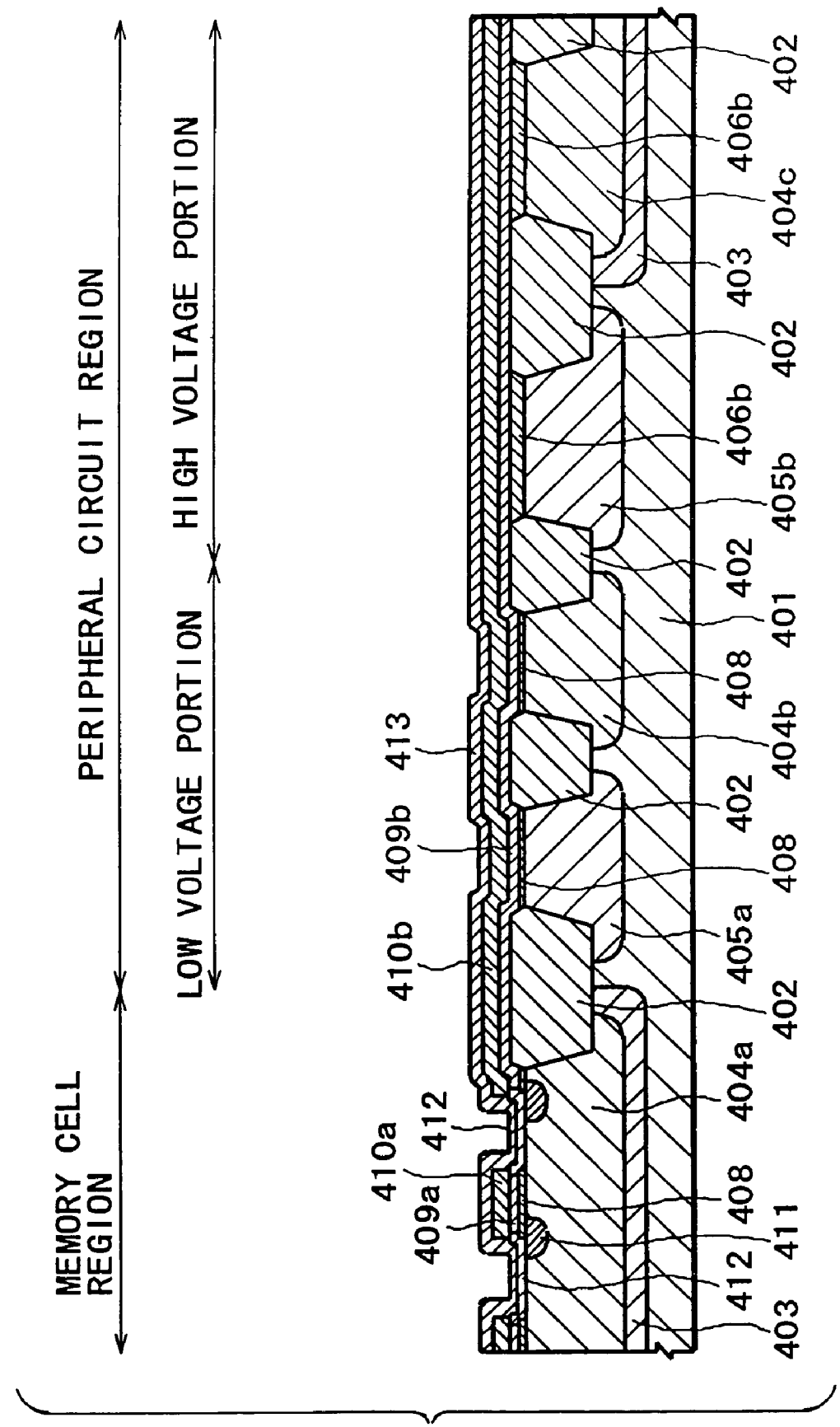
FIG. 41 is a cross sectional view for a main portion of a substrate showing a preferred manufacturing method of a nonvolatile semiconductor memory device of the fifth preferred embodiment of the present invention.
Figure 42:
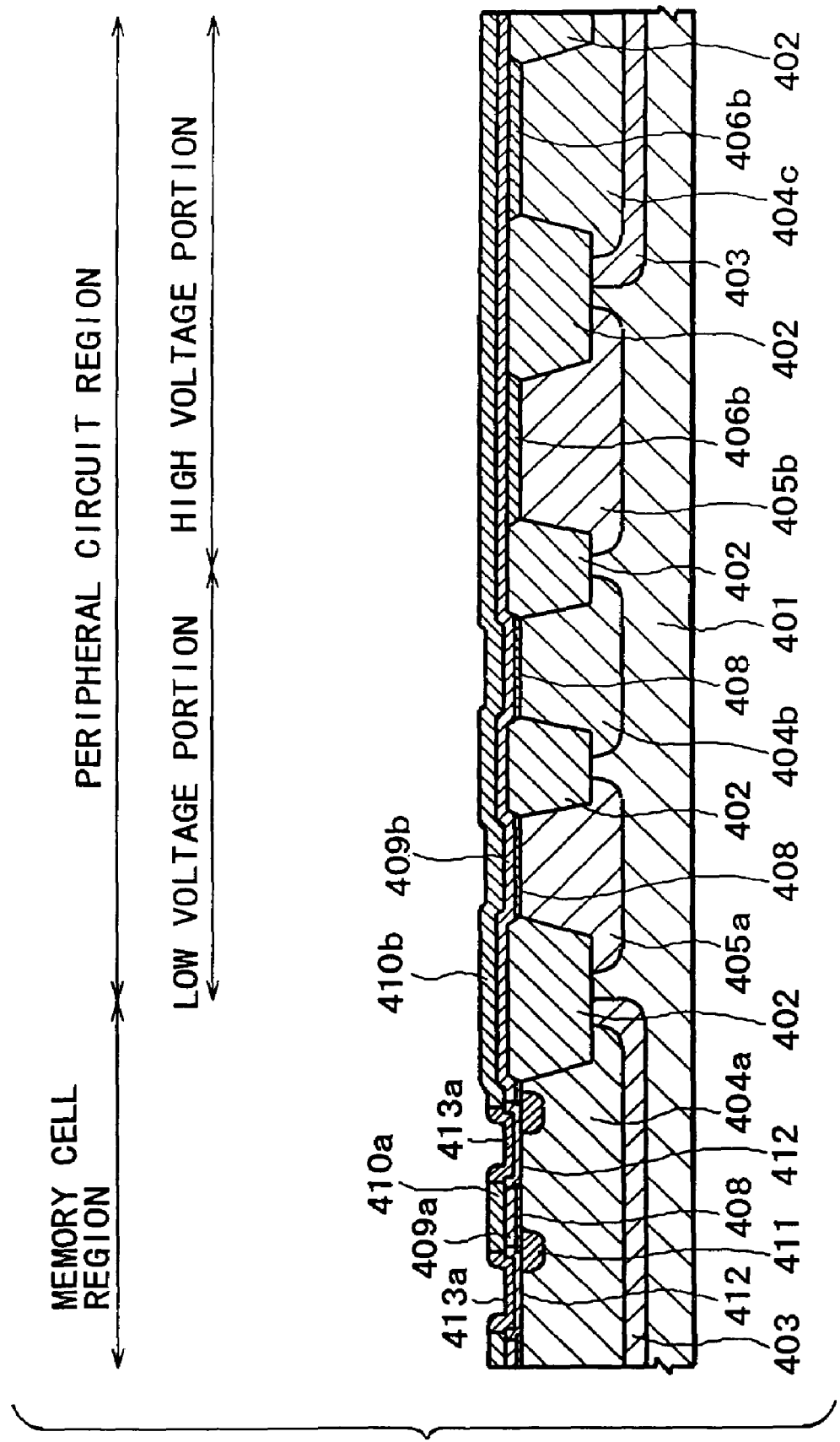
FIG. 42 is a cross sectional view for a main portion of a substrate showing a preferred manufacturing method of a nonvolatile semiconductor memory device of the fifth preferred embodiment of the present invention.

Then, as shown in FIG. 41, a polysilicon film 413 as a floating gate is deposited and the polysilicon film 413 is patterned by an etching back process using a fluidizable organic material described in preferred Embodiment 1 as a mask. As a result, the polysilicon film 413 is formed as 413a (FIG. 42).

Figure 43:
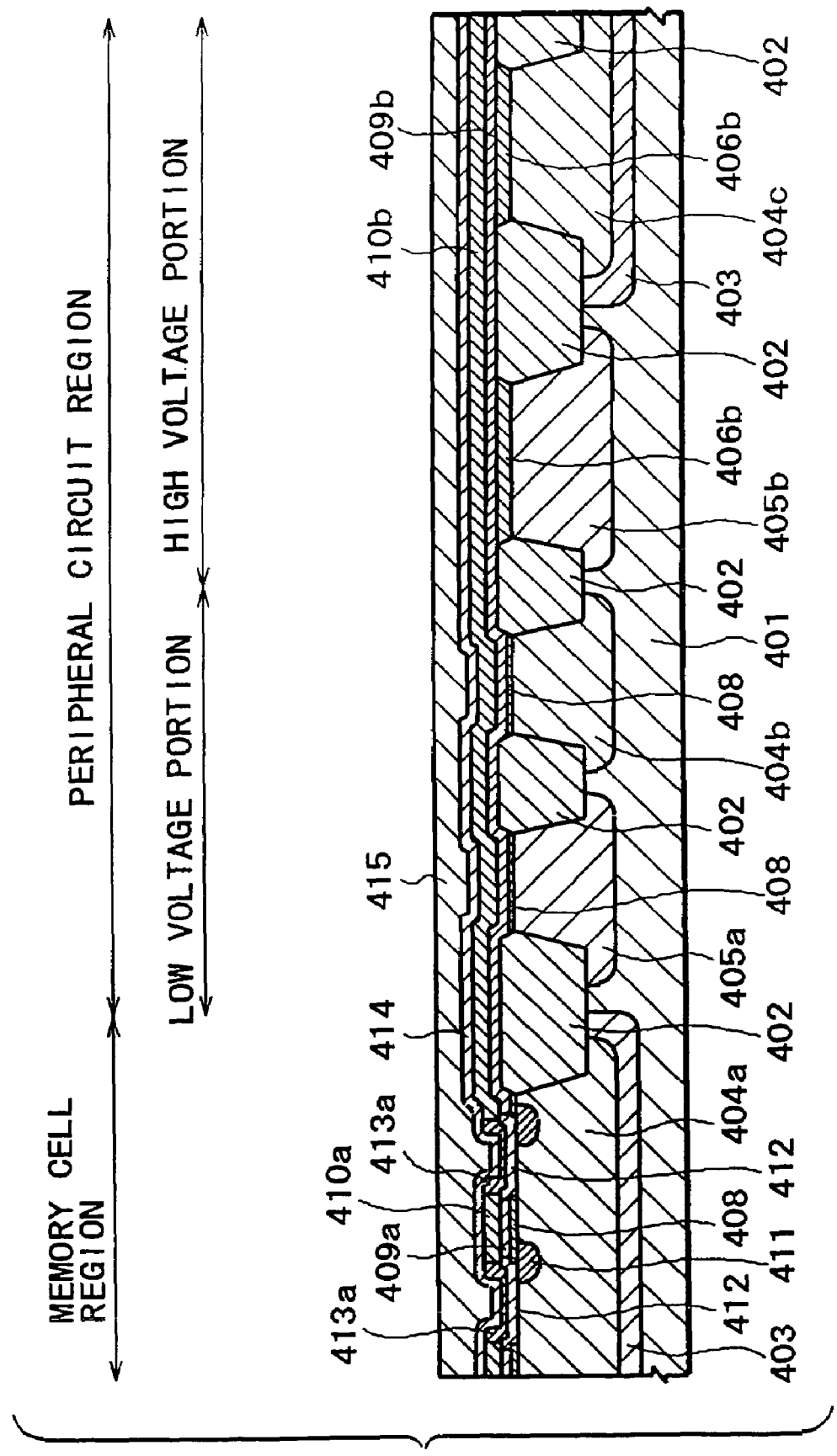
FIG. 43 is a cross sectional view for a main portion of a substrate showing a preferred manufacturing method of a nonvolatile semiconductor memory device of the fifth preferred embodiment of the present invention.

Then, as shown in FIG. 43, a stacked film of a silicon oxide film/silicon nitride film/silicon oxide film, a so-called ONO film, 414 for isolating the floating gate from the word line, as well as a polyside film 415 as a word line are deposited successively.

Figure 44:
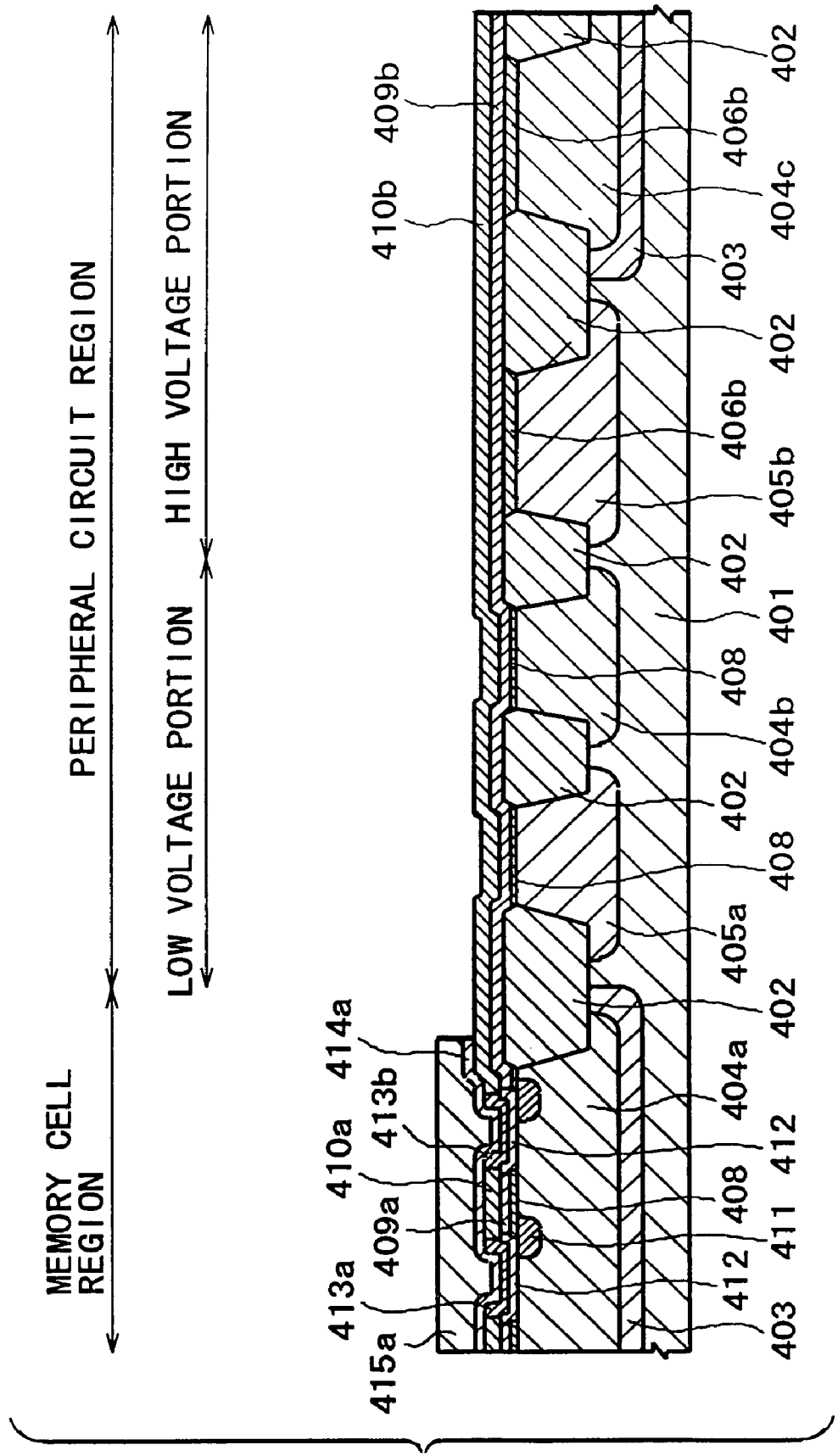
FIG. 44 is a cross sectional view for a main portion of a substrate showing a preferred manufacturing method of a nonvolatile semiconductor memory device of the fifth preferred embodiment of the present invention.

Then, as shown in FIG. 44, they are patterned by known lithography and dry etching technology to form word lines (control gate). As a result, the polyside film 415 is formed as 415a (word line).

Further, the ONO film 414 and the polysilicon film 413a are patterned using the word line 415a as a mask to complete the floating gate. That is, the ONO film 414 and the polysilicon film 413a are formed as 414a and 413b (floating gate), respectively.

Figure 45:
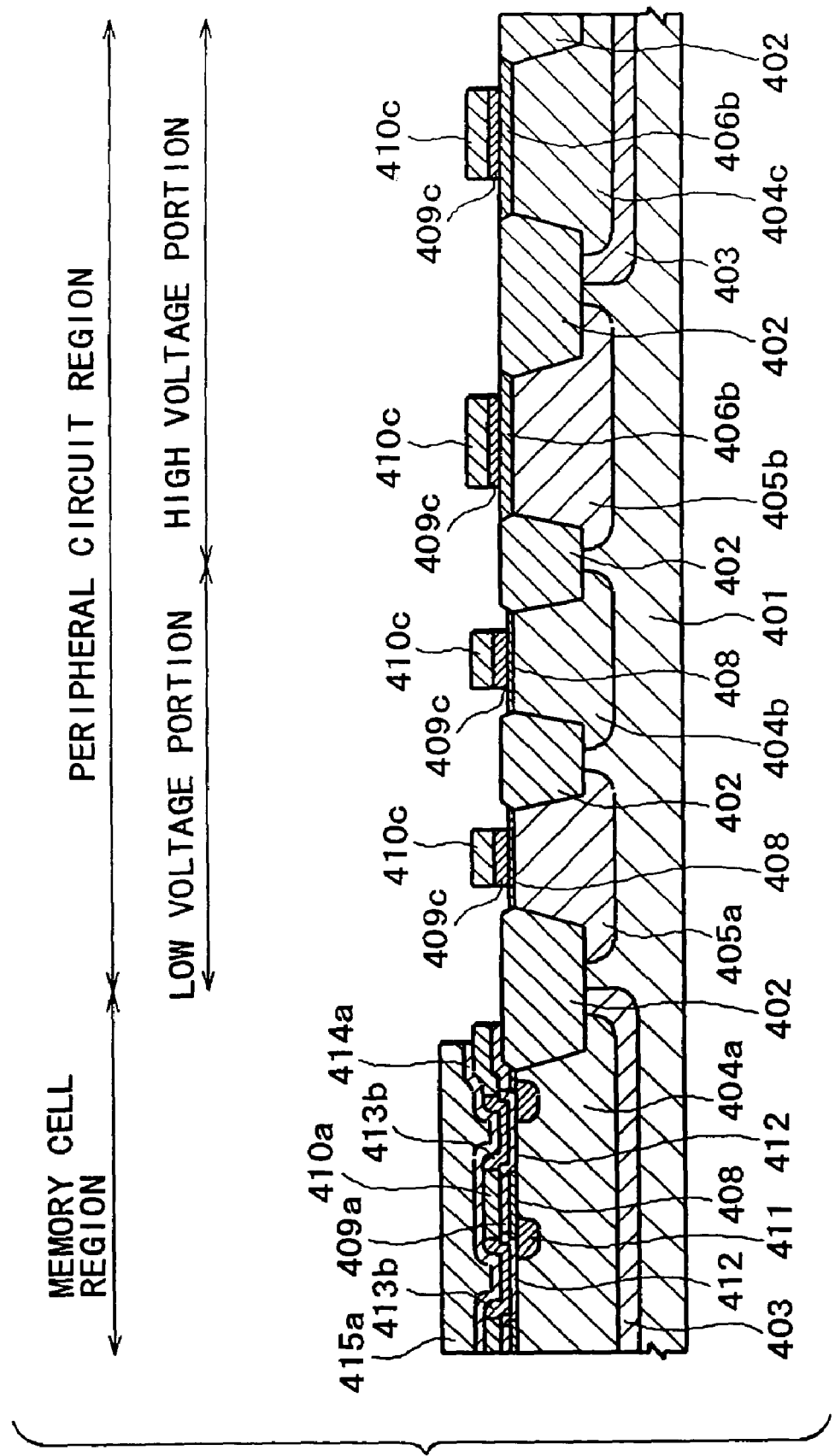
FIG. 45 is a cross sectional view for a main portion of a substrate showing a preferred manufacturing method of a nonvolatile semiconductor memory device of the fifth preferred embodiment of the present invention.

Then, as shown in FIG. 45, the silicon oxide film 410b and the polysilicon film 409b in the peripheral circuit portion are patterned by lithography and dry etching technology to form a gate electrode of the peripheral circuit MOS transistor. That is, the silicon oxide film 410b and the polysilicon film 409b are formed as 410c and 409c, respectively (gate electrode, gate line).

Then, as shown in FIG. 46, source/drain regions 416a, 416b, 417a and 417b of the peripheral circuit MOS transistors are formed by an ion implantation process.

Then, although not illustrated, after depositing an interlayer insulator film on the Si substrate, a contact hole extending in the word line 415a, the gate electrodes 410c of the peripheral MOS transistors (Qn1, Qn2, Qp1, Qp2), and the source/drain regions (416a, 416b, 417a, 417b) is formed, then, a metal film is deposited and patterned into an electrode to complete a nonvolatile semiconductor memory device.

In this preferred embodiment, the gate insulator film 403 for the third gate of the memory cell and the gate insulator film 408 for the MOS transistors of the peripheral circuit low voltage portion are formed by the same process step.

Accordingly, four kinds of gate insulator films including the tunnel insulator film of the memory cell can be formed with three kinds of films. Accordingly, the number of production steps can be reduced compared with the case of forming each of the gate insulator films independently.

As described above, by forming the gate insulator film 408 of the third gate to a thickness less than that of the insulator film 412 in this fifth exemplary embodiment of the nonvolatile semiconductor memory device of the present invention, memory cell area has been reduced while maintaining reliability after many writing/erasing cycles and access time has been improved.

Sixth Preferred Embodiment

In this preferred embodiment, a description is made of another example of simplifying the production steps by simultaneously forming a gate insulator film for the memory cell and a gate insulator film of the MOS transistors of the low voltage system peripheral circuit in the nonvolatile semiconductor memory device. This is different from the fifth preferred embodiment in that the gate insulator film of the MOS transistors of the low voltage system peripheral circuit and the gate insulator film between the floating gate and the well of the memory cell, that is, a so-called tunnel insulator film, are formed in common. A preferred constitution and method of manufacturing the nonvolatile semiconductor memory device of the sixth preferred embodiment of the present invention are described below.

Figure 59:
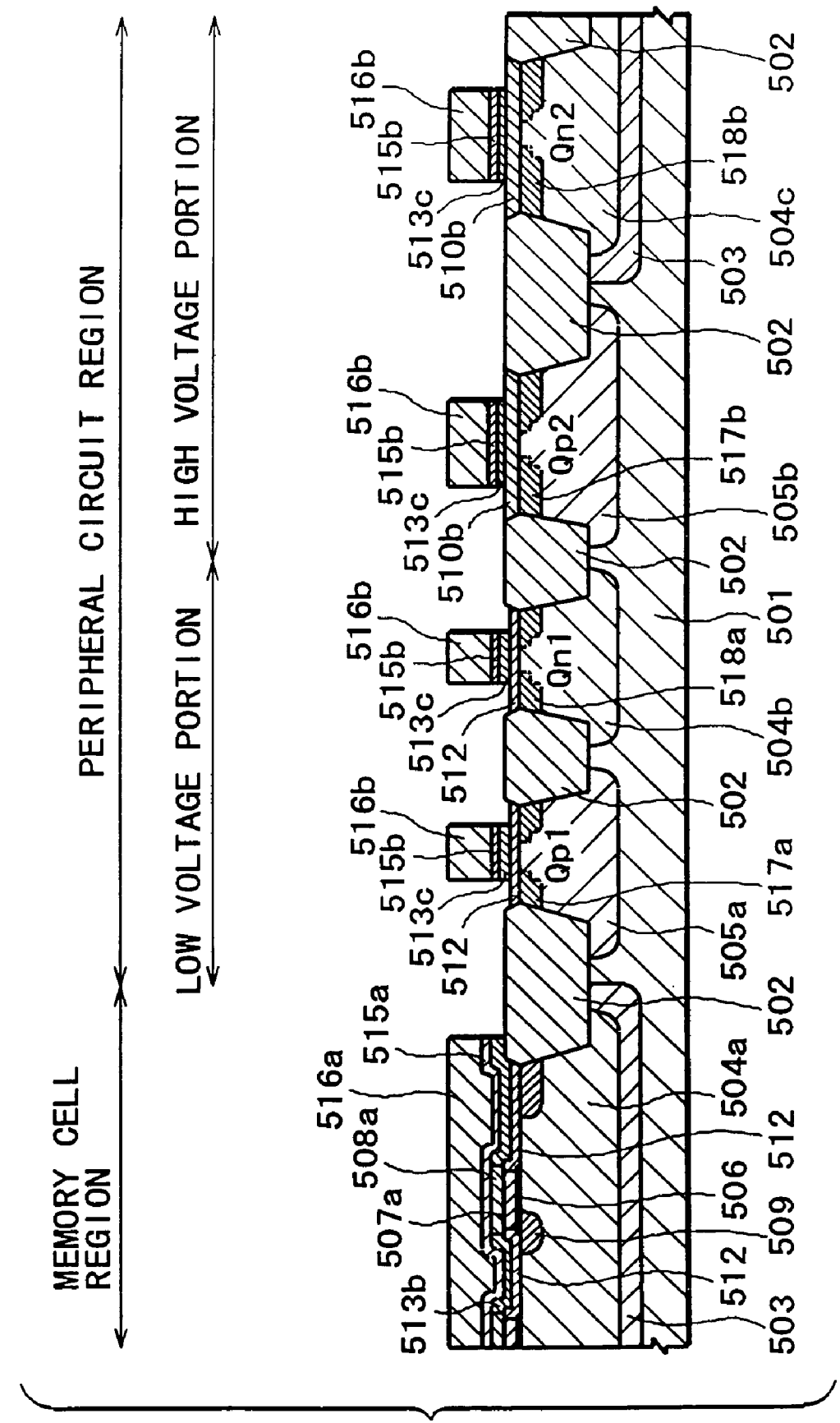
FIG. 59 is a cross sectional view for a main portion of a substrate showing a nonvolatile semiconductor memory device of the sixth preferred embodiment of the present invention.

As shown in FIG. 59, the nonvolatile semiconductor memory device of this preferred embodiment comprises a memory cell region in which a plurality of memory cells for storing information are arranged in a matrix, and a peripheral circuit region in which a plurality of MOS transistors are arranged for selecting bits to conduct writing, erasing or reading and constituting a peripheral circuit for generating a voltage necessary in the chip.

The peripheral circuit region is divided into a low voltage portion in which only a relatively low voltage, for example, of 3.3 V such as a power source voltage is applied, and a high voltage portion in which a high voltage necessary for writing, for example, of 18 V is applied.

Each of the low voltage portion and the high voltage portion comprises, as shown in FIG. 59, a plurality of NMOS transistors (Qn1, Qn2) and PMOS transistor (Qp1 Qp2) formed on P-wells 504b, 504c and N-wells 505a, 505b.

The memory cell formed in the memory cell region is a flash memory as has been described above regarding preferred Embodiment 1 and is formed on the P-well 504a.

FIGS. 47 to 59 are cross sectional views parallel with the word line 516a of the memory cell and perpendicular to the gate line 513c of the peripheral circuit MOS transistors.

A preferred method of manufacturing the nonvolatile semiconductor memory device of this preferred embodiment is described below with reference to FIGS. 47 to 59.

Figure 47:
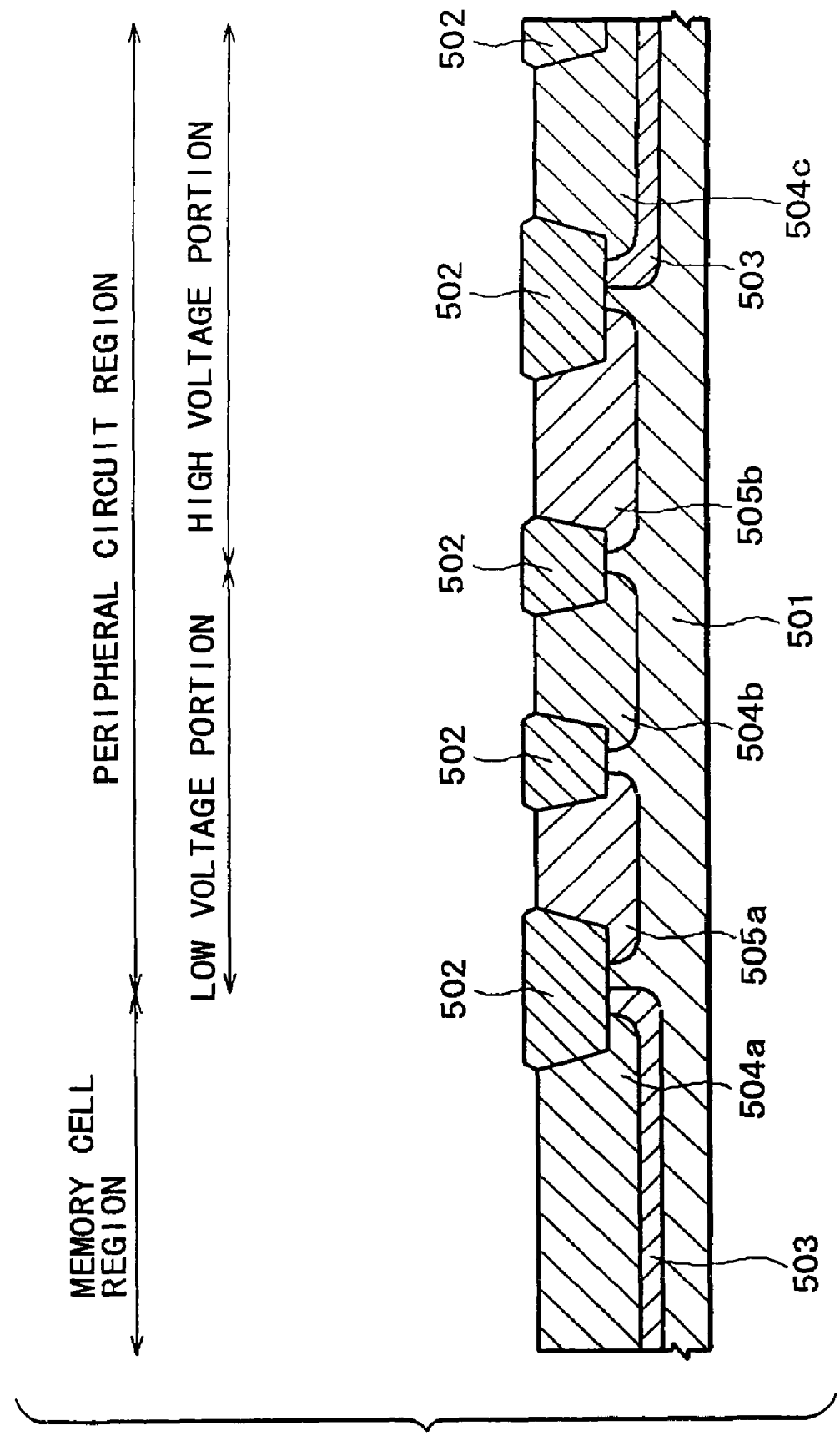
FIG. 47 is a cross sectional view for a main portion of a substrate showing a preferred manufacturing method of a nonvolatile semiconductor memory device of a sixth preferred embodiment of the present invention.

At first, as shown in FIG. 47, a shallow trench isolation region 502 for isolating each of memory cells and peripheral circuit MOS transistors is formed to a p-Si substrate 501 of face orientation (100). Then, P-well regions 504a, 504b, 504c and N-well regions 505a 505b, as well as isolation regions 503 between the wells are formed by an ion implantation process.

Figure 48:
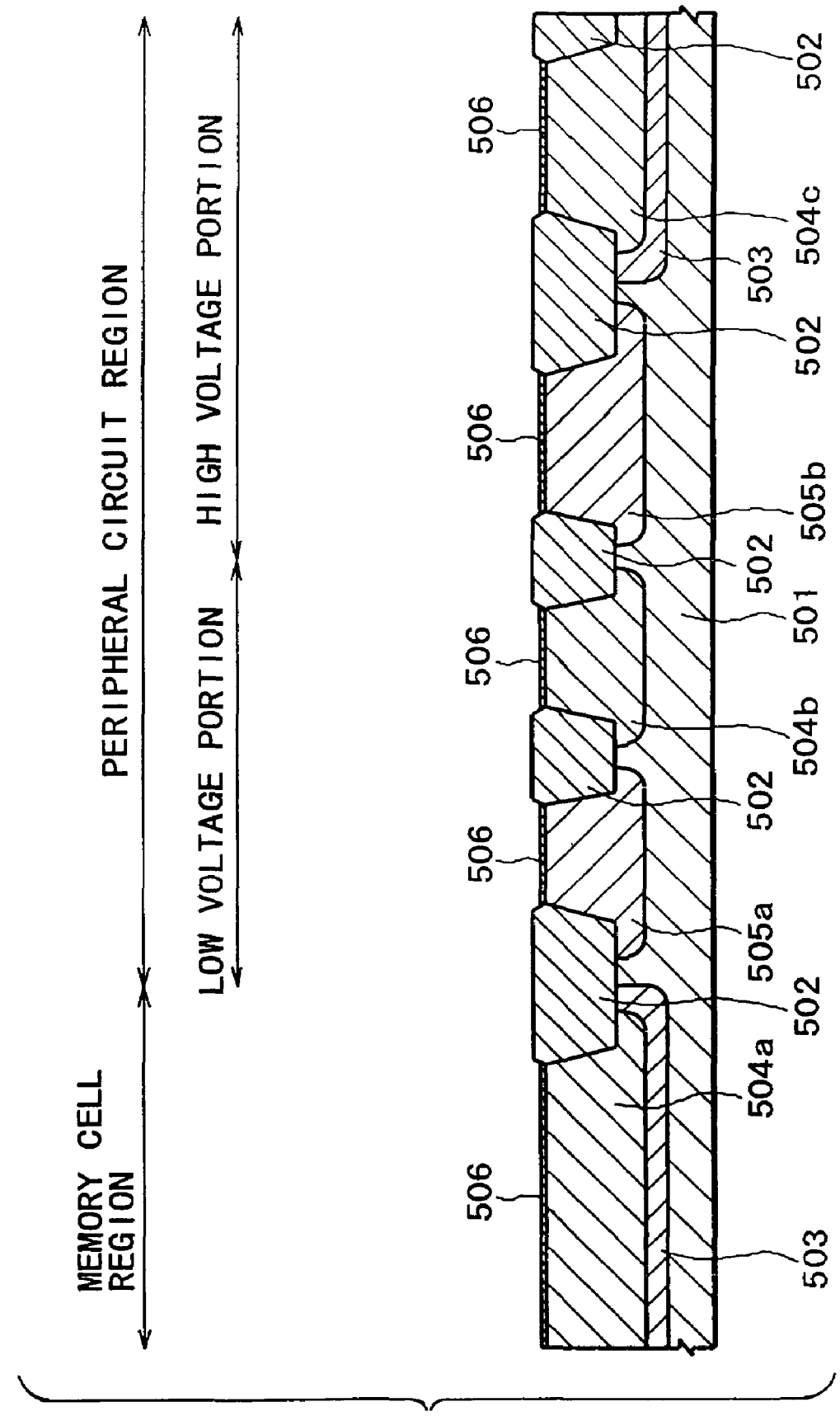
FIG. 48 is a cross sectional view for a main portion of a substrate showing a preferred manufacturing method of a nonvolatile semiconductor memory device of the sixth preferred embodiment of the present invention.

Then, as shown in FIG. 48, a silicon oxide film 506 as a gate insulator film as the third gate of the memory cell is formed to 7.5 nm thickness by a thermal oxidation process.

Figure 49:
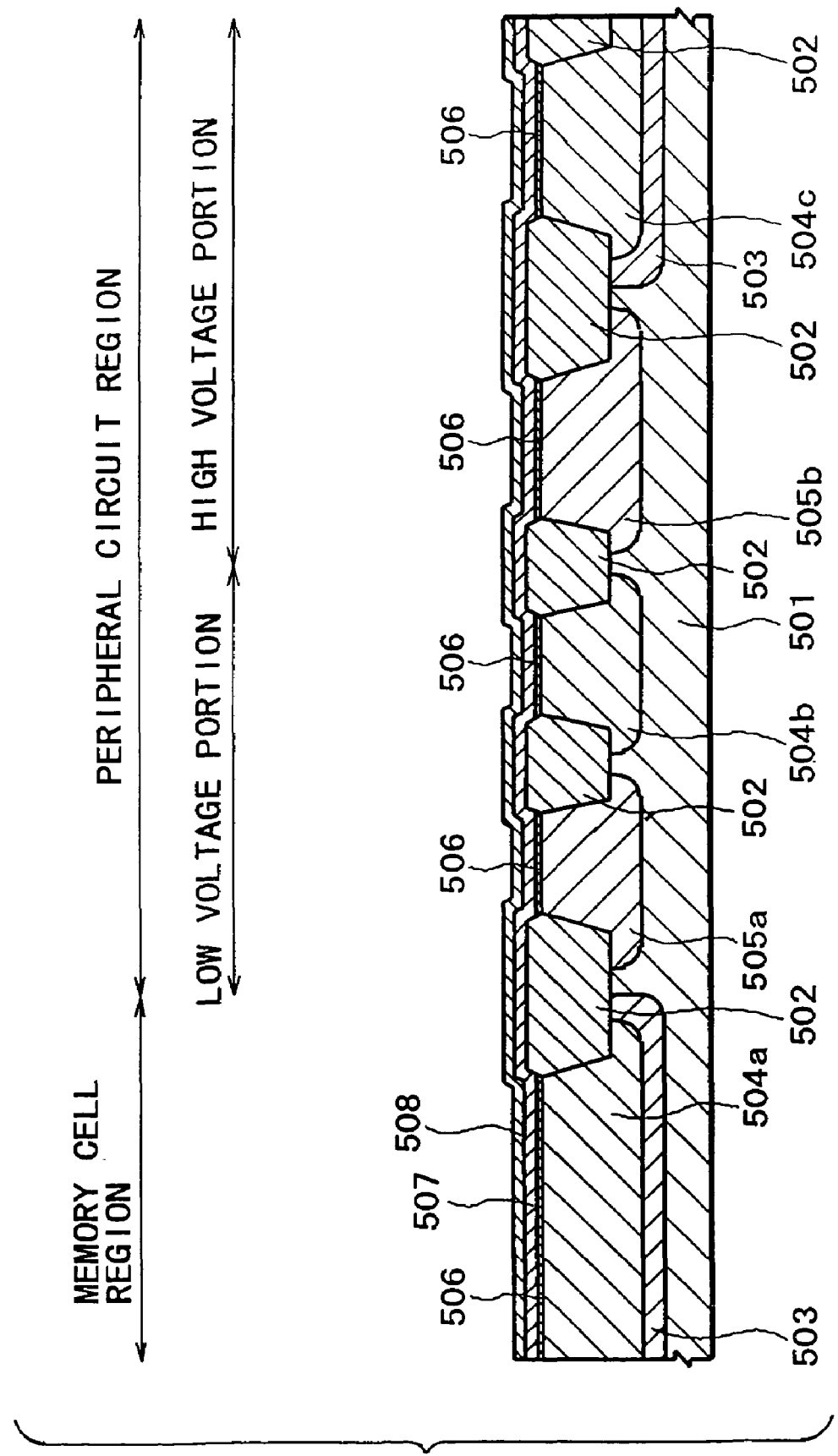
FIG. 49 is a cross sectional view for a main portion of a substrate showing a preferred manufacturing method of a nonvolatile semiconductor memory device of the sixth preferred embodiment of the present invention.

Then, as shown in FIG. 49, a polysilicon film 507 and a silicon nitride film 508 as the third gate electrode in the peripheral MOS transistors and the memory cell are deposited successively.

Figure 50:
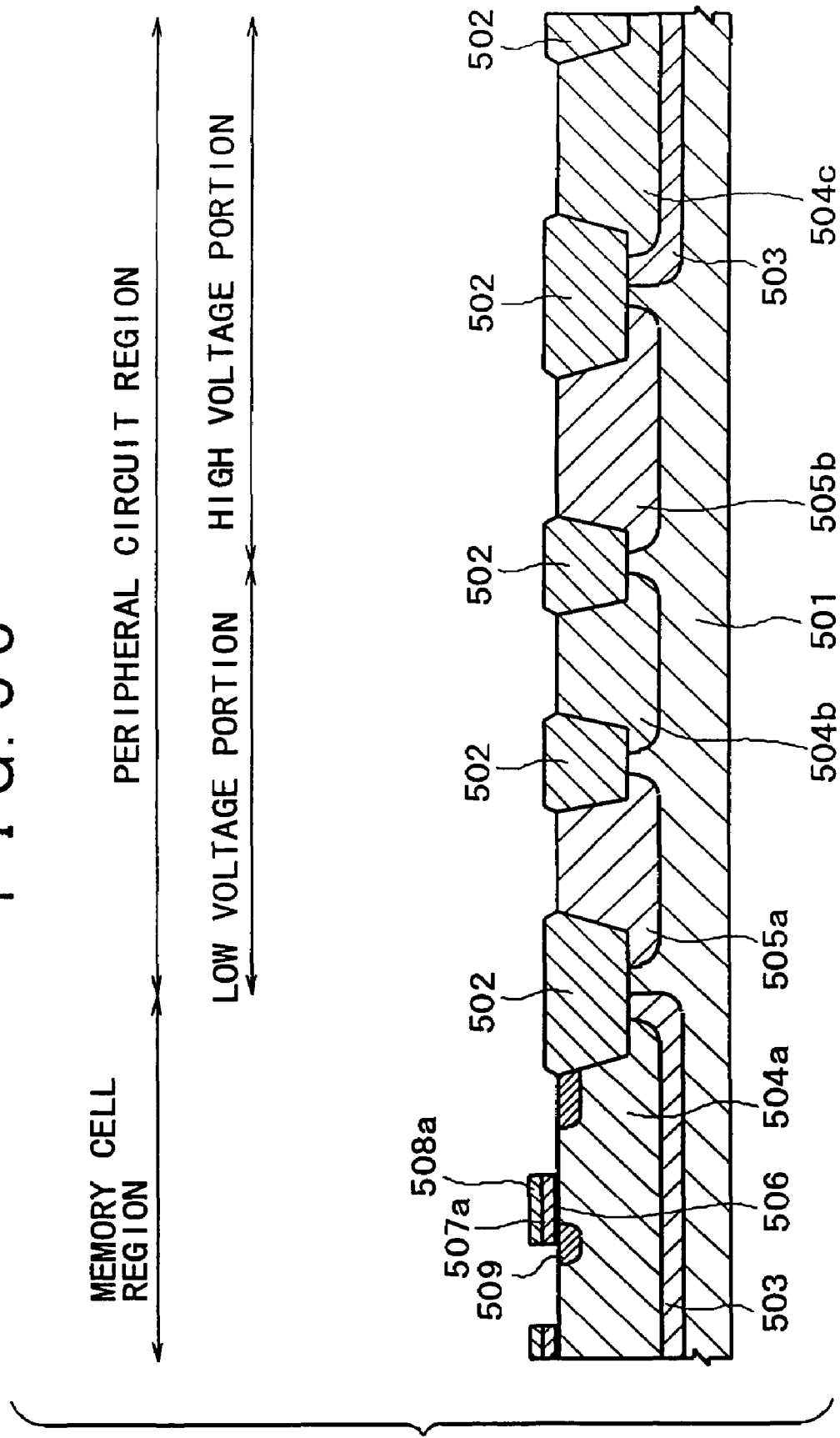
FIG. 50 is a cross sectional view for a main portion of a substrate showing a preferred manufacturing method of a nonvolatile semiconductor memory device of the sixth preferred embodiment of the present invention.

Successively, as shown in FIG. 50, the silicon nitride film 508 and the polysilicon film 507 are patterned using lithography and dry etching technology. As a result, the silicon nitride film 508 and the polysilicon film 507 are formed as 508a and 507a, respectively. In this step, the silicon nitride film 508 and the polysilicon film 507 in the peripheral circuit region are removed by etching.

Then, tilted ion implantation like in preferred Embodiment 1 is conducted to form a source/drain diffusion layer region 509 of the memory cell.

Figure 51:
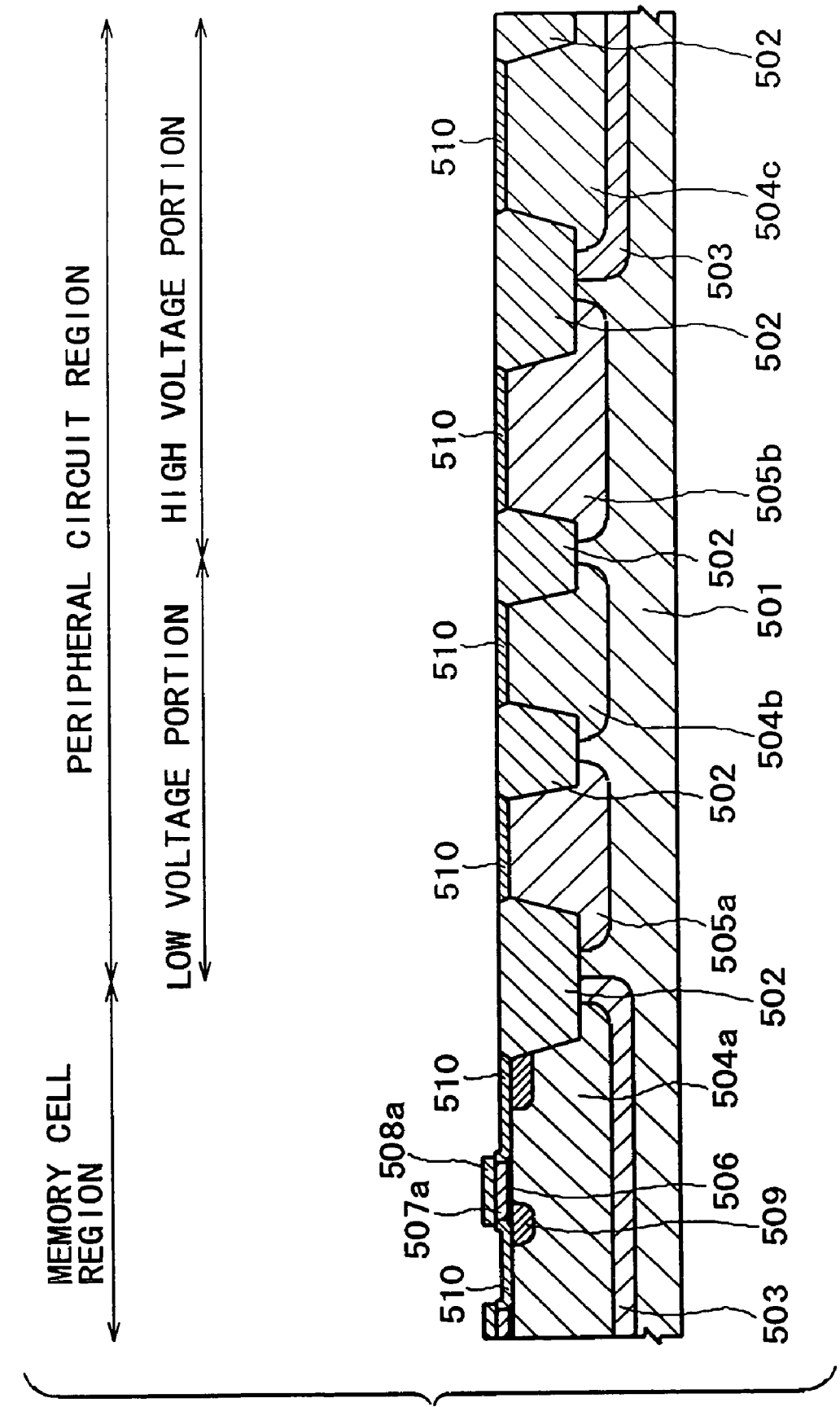
FIG. 51 is a cross sectional view for a main portion of a substrate showing a preferred manufacturing method of a nonvolatile semiconductor memory device of the sixth preferred embodiment of the present invention.

Then, as shown in FIG. 51, a silicon oxide film 510 as a gate insulator film for the high voltage portion in the peripheral circuit region is formed on the p-Si substrate to about 23 nm thickness by the combination of a thermal oxidation process and a CVD process.

Figure 52:
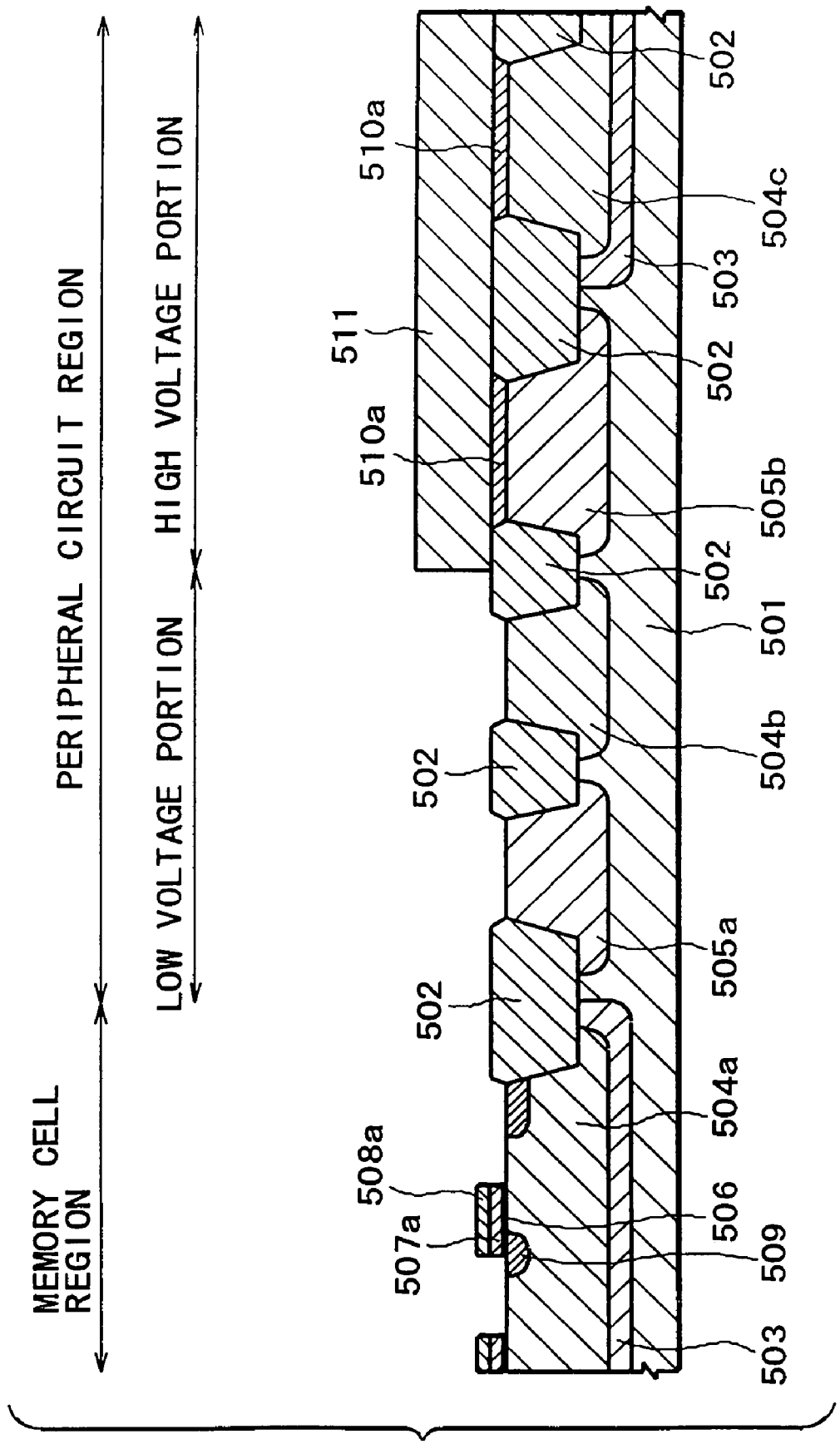
FIG. 52 is a cross sectional view for a main portion of a substrate showing a preferred manufacturing method of a nonvolatile semiconductor memory device of the sixth preferred embodiment of the present invention.

Then, as shown in FIG. 52, a photo-resist pattern 511 is formed and the silicon oxide film is left only in the high voltage portion of the peripheral circuit region by a wet etching process. As a result, the silicon oxide film 510 is formed as 510a.

Figure 53:
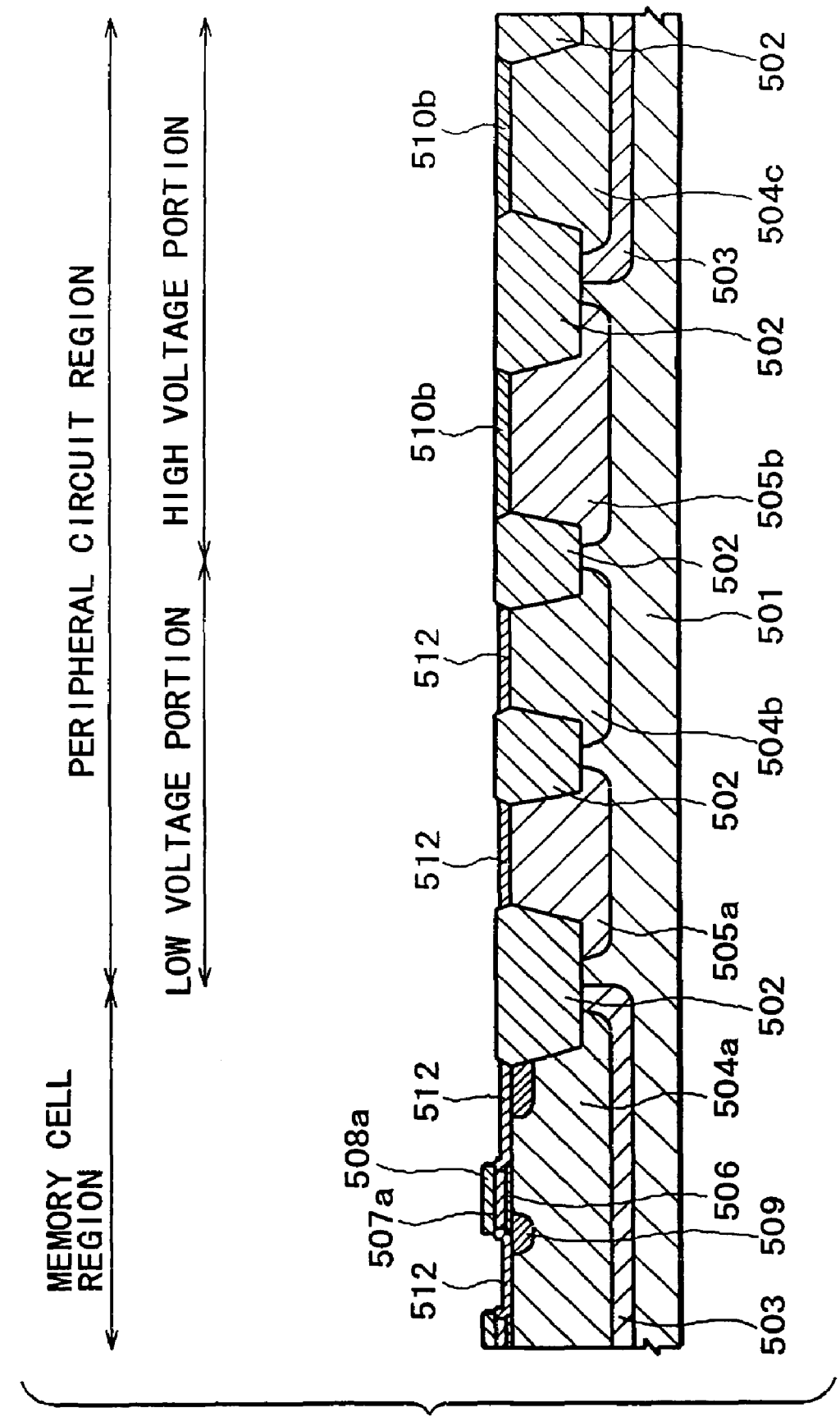
FIG. 53 is a cross sectional view for a main portion of a substrate showing a preferred manufacturing method of a nonvolatile semiconductor memory device of the sixth preferred embodiment of the present invention.

Then, as shown in FIG. 53, a gate insulator film 512 for the low voltage portion in the peripheral circuit region, and as an insulator film for isolating the floating gate from the well and isolating the floating gate from the third gate in the memory cell, is formed to 9 nm thickness by a thermal oxidation process.

In this step, the thickness of the gate insulator film for the high voltage portion in the peripheral circuit region is 25 nm. That is, the silicon oxide film 510a is formed as 510b (gate insulator film).

Figure 54:
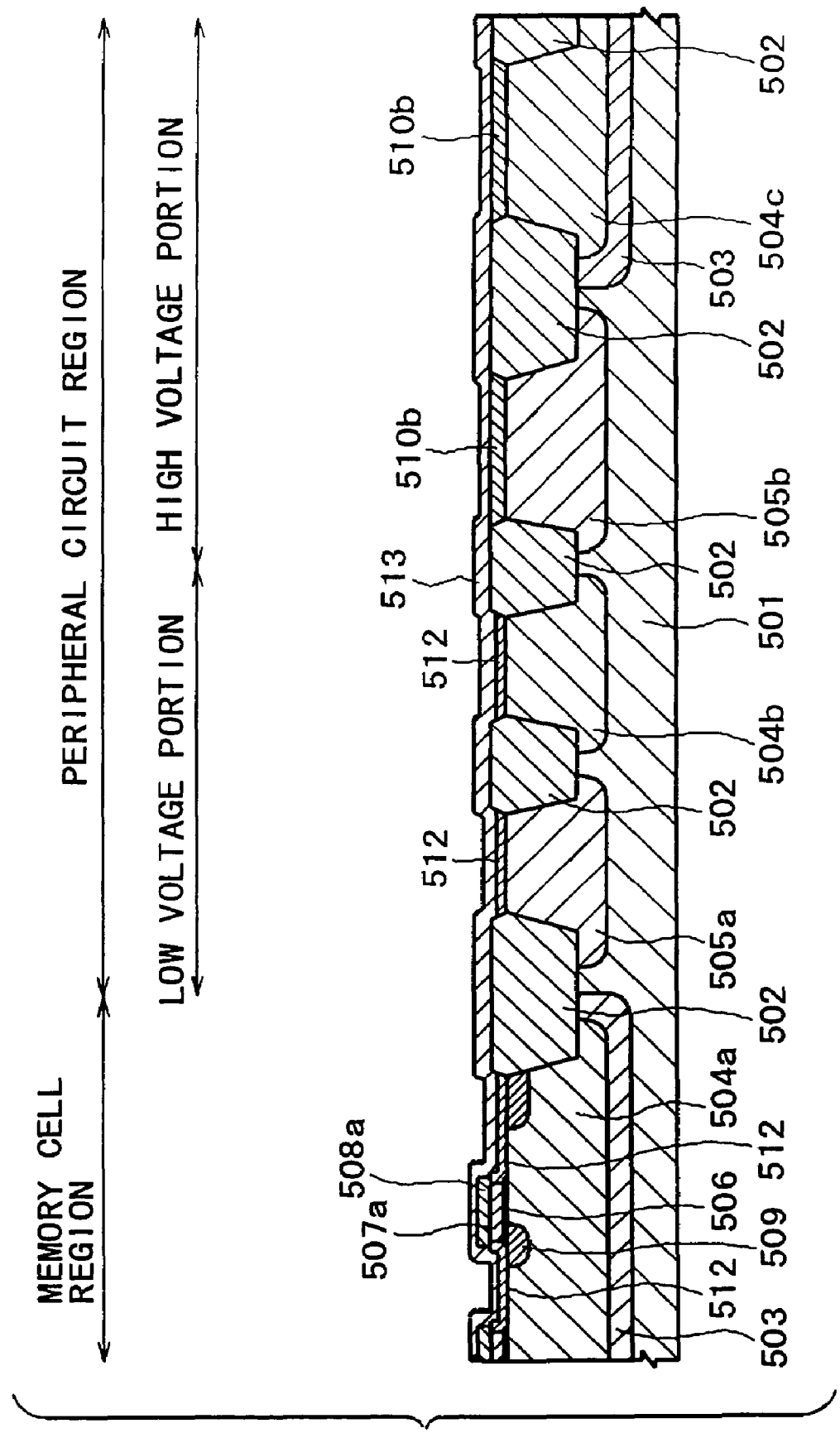
FIG. 54 is a cross sectional view for a main portion of a substrate showing a preferred manufacturing method of a nonvolatile semiconductor memory device of the sixth preferred embodiment of the present invention.
Figure 55:
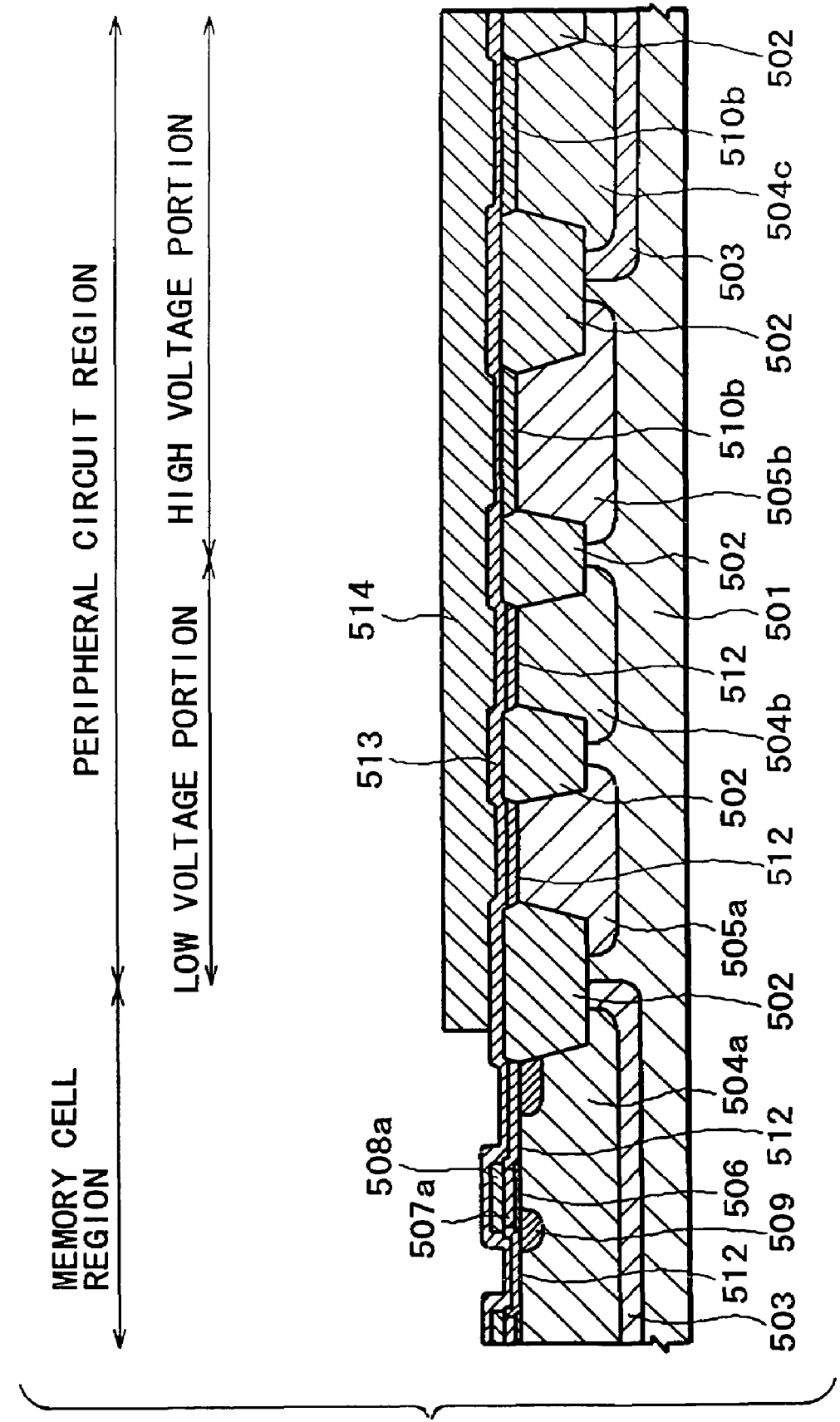
FIG. 55 is a cross sectional view for a main portion of a substrate showing a preferred manufacturing method of a nonvolatile semiconductor memory device of the sixth preferred embodiment of the present invention.

Then, as shown in FIGS. 54 and 55, after depositing a polysilicon film 513 as a floating gate, a silicon oxide film 514 is deposited and the silicon oxide film 514 is left in the peripheral circuit region by using lithography and dry etching technology (FIG. 55).

Figure 56:
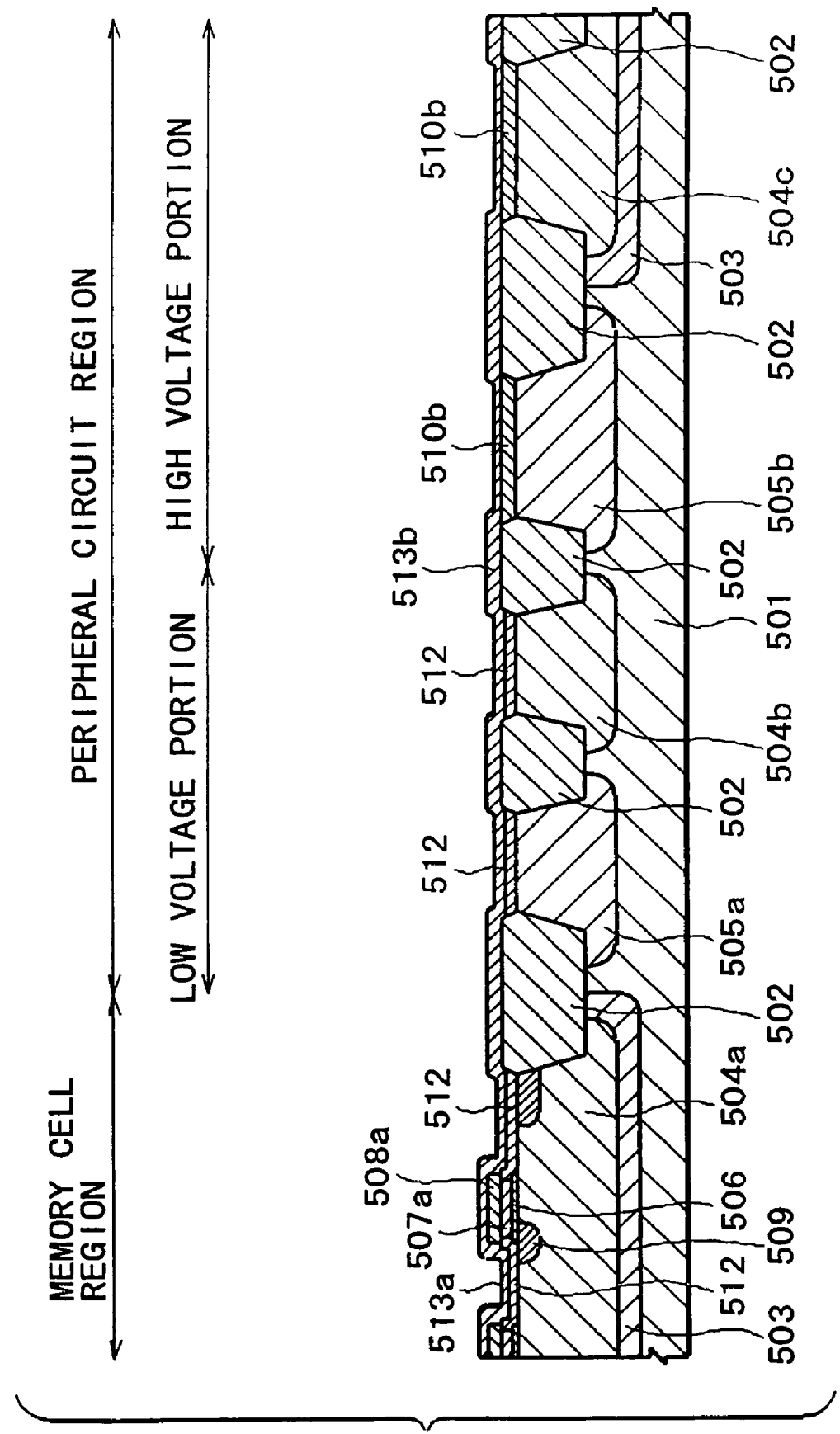
FIG. 56 is a cross sectional view for a main portion of a substrate showing a preferred manufacturing method of a nonvolatile semiconductor memory device of the sixth preferred embodiment of the present invention.

Then, as shown in FIG. 56, the polysilicon film 513 is patterned by an etching back method using an organic material having flowability described above regarding the preferred Embodiment 1. As a result, the polysilicon film 513 is formed as 513a. Then, the silicon oxide pattern 514 is removed by wet etching. The polysilicon film exposed to the peripheral circuit region is defined as 513b.

Figure 57:
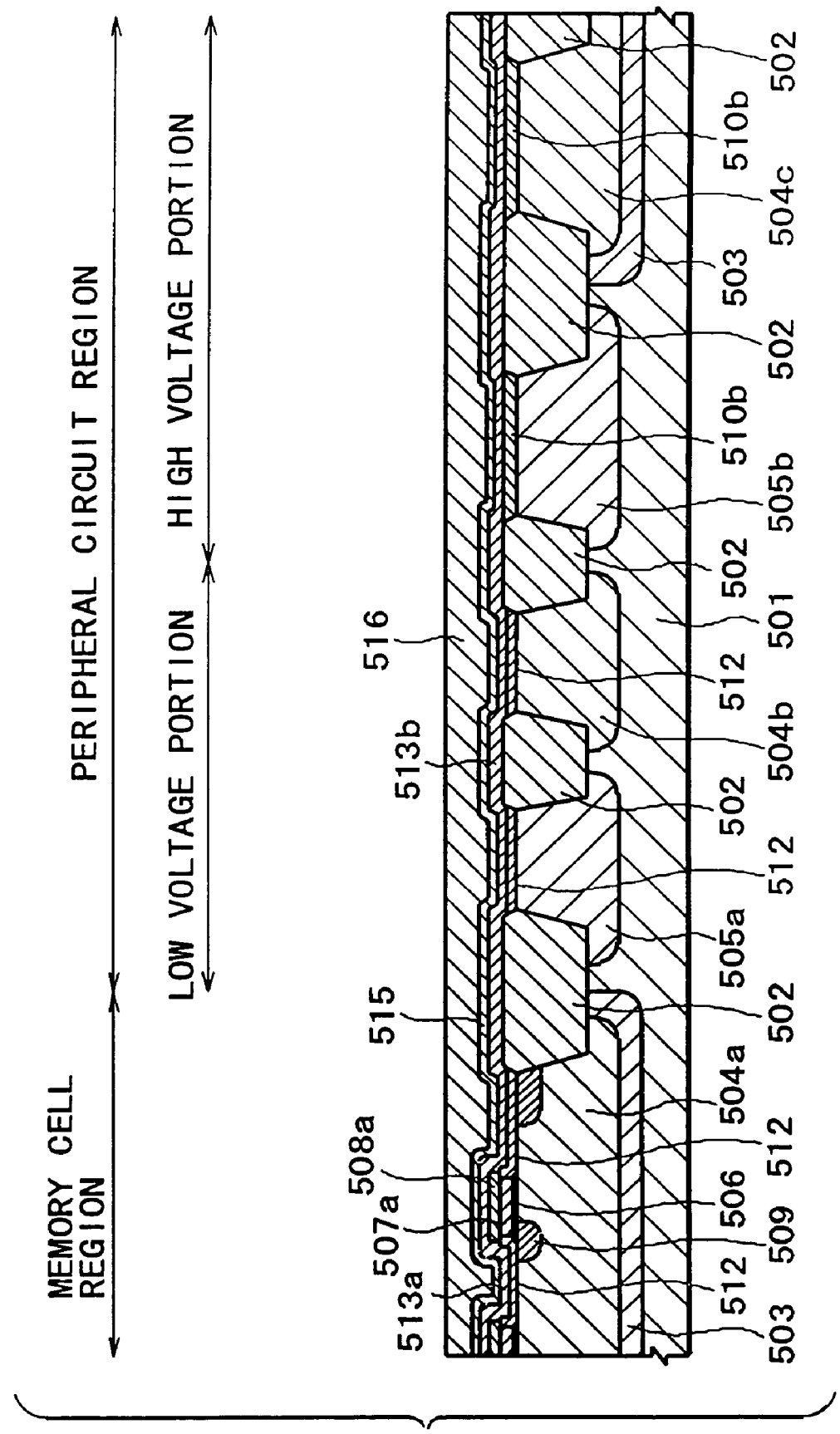
FIG. 57 is a cross sectional view for a main portion of a substrate showing a preferred manufacturing method of a nonvolatile semiconductor memory device of the sixth preferred embodiment of the present invention.

Then, as shown in FIG. 57, a stacked film of silicon oxide film/silicon nitride film/silicon oxide film for isolating a floating gate from a word line, a so-called ONO film, 515 and a polyside film 516, as a word line, are deposited successively.

Figure 58:
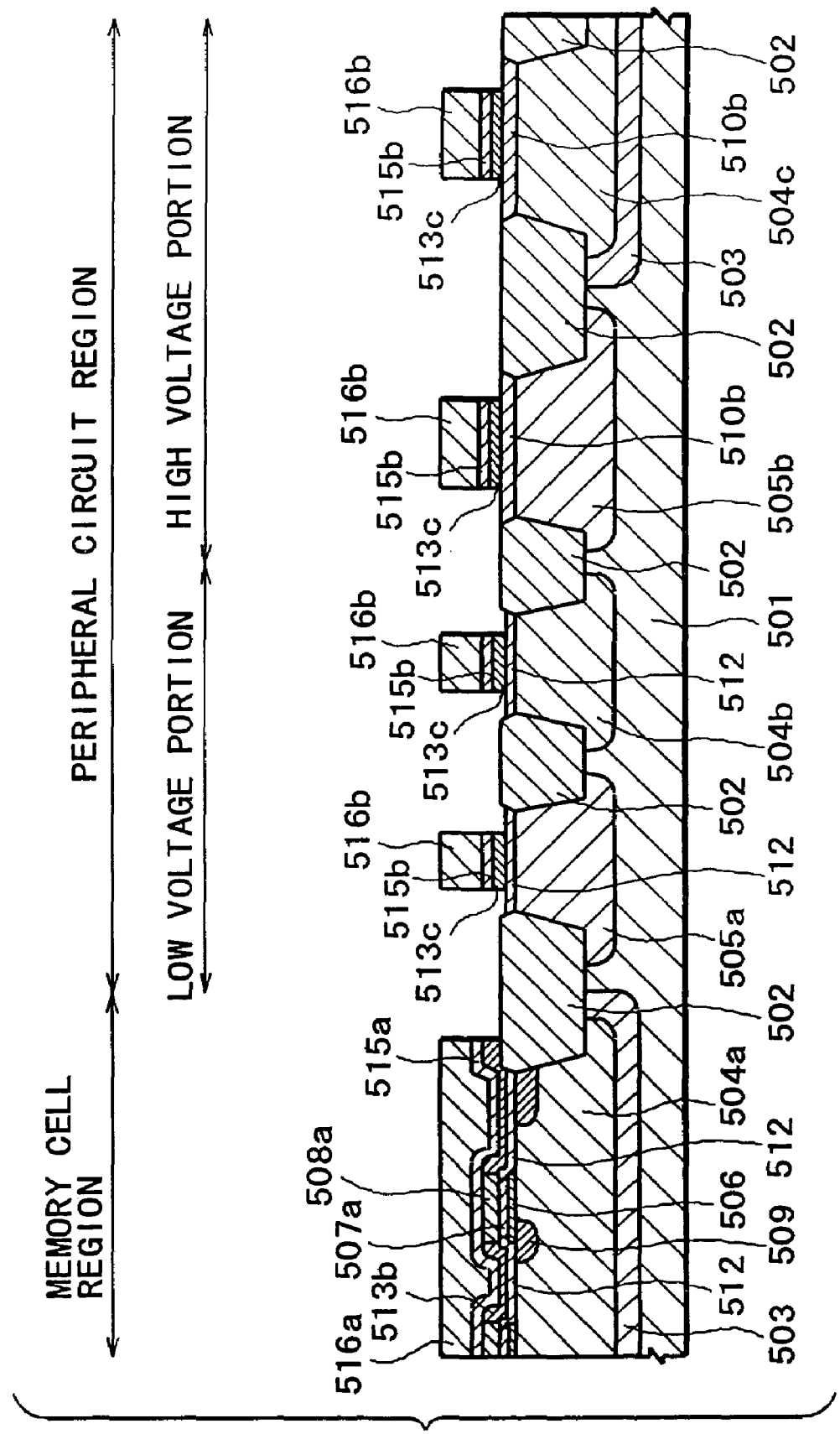
FIG. 58 is a cross sectional view for a main portion of a substrate showing a preferred manufacturing method of a nonvolatile semiconductor memory device of the sixth preferred embodiment of the present invention.

Then, as shown in FIG. 58, they are patterned by known lithography and dry etching technology to form word lines (control gate). That is, the polyside film 516 is formed as 516a (word line). Further, the ONO film 515 and the polysilicon pattern 513a are patterned by using the word line 516a as a mask to complete the floating gate. That is, the ONO film 515 and the polysilicon film 513a are formed as 515a and 513b (floating gate), respectively.

Simultaneously, the gate electrode for the peripheral MOS transistor is also formed. That is, the polyside film 516, ONO film 515 and the polysilicon film 513b for the peripheral circuit region are formed as 516b, 515b and 513c, respectively.

Then, as shown in FIG. 59, source/drain regions 517a, 517b, 518a, 518b of the peripheral circuit MOS transistors are formed by an ion implantation process.

Then, although not illustrated in the drawing, after depositing an interlayer insulator film on the Si substrate, a contact hole extending in the word line (control gate), gate electrode 513c of the peripheral MOS transistor, and the source/drain region are formed to the interlayer insulator film, and then a metal film is deposited and patterned into an electrode to complete a nonvolatile semiconductor memory device.

In this preferred embodiment, the gate insulator film 512 for the floating gate of the memory cell and the gate insulator film 512 for the MOS transistor of the peripheral circuit low voltage portion are formed by the same process step.

Accordingly, four kinds of gate insulator films including the tunnel insulator film of the memory cell can be formed with three kinds of films as in preferred Embodiment 5. Accordingly, the number of production steps is reduced compared with the case of forming each of the gate insulator films individually.

Further, as described with respect to preferred Embodiment 1, by forming the gate insulator film 506 of the third gate to a thickness less than that of the insulator film 512 for the floating gate, refinement and insurance of reliability of the memory cell are compatible with each other. Further, improvement is obtained in the access time of the memory cell.

In the preferred Embodiments 1 to 6, while description has been made of an n-channel type memory cell in which an n-type diffusion layer is formed in the p-well as an example, the same effect can be obtained in a p-channel type memory cell in which the well is an n-type and the diffusion layer is a p-type.

Further, in preferred Embodiments 1 to 6, while description has been made of a thermally oxidized film as a gate insulator film for the third gate or the control gate of the memory cell as an example, it is possible to further decrease the gate length and increase the reading current by using a film including a silicon nitride film or a material of high dielectric constant.

Further, in any of the preferred embodiments of the present invention, at least two states of electrons accumulated in the floating gate are necessary upon writing and it may be applied to a so-called multi-level memory in which 4 or more states are formed and 2 or more bits of data are stored in one memory cell.

In a general multi-level memory, even when the amount of electrons accumulated in the floating gate was controlled at high accuracy and the threshold voltage distribution at each level is compressed, there was a problem that the difference increased between the state of the lowest threshold voltage and the state of the highest threshold voltage compared with the binary level memory. Accordingly, in the Fowler-Nordheim type writing, it resulted in a problem that the writing rate was lowered or writing voltage increased.

However, the present invention is extremely effective for multi-level memories, since both writing and erasing can be conducted at the low voltage of about 13 V thereby increasing the writing rate.

The present invention has been described specifically with reference to the preferred embodiments, but it will be apparent that this invention is not restricted to the preferred embodiments described above but can be modified within a range not departing the gist thereof.

For example, this invention may be applied to a one-chip microcomputer (semiconductor device) comprising a memory cell array portion having a nonvolatile semiconductor memory device.

The effects obtained by typical inventions among those disclosed in the present application are to be explained simply as below.

Since the thickness of the gate insulator film between the floating gate and the substrate (well) is made larger than the gate insulator film between the third gate or the control gate and the substrate, the memory cell area of the nonvolatile semiconductor memory device can be reduced.

Further, reliability after many writing/erasing cycles in the nonvolatile semiconductor memory device of the present invention is improved.

Further, operation speed of the nonvolatile semiconductor memory device of the present invention is improved.

Further, since the gate insulator film between the floating gate and the substrate, and the gate insulator film between the third gate and the substrate are formed by the same process step as that of the gate insulator film for the MOS transistors in the lower voltage portion of the peripheral circuit, the production steps of the nonvolatile semiconductor memory device of the present invention have been simplified.

Nothing in the above description is meant to limit the present invention to any specific materials, geometry, or orientation of parts. Many part/orientation substitutions are contemplated within the scope of the present invention. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A method of manufacturing a nonvolatile semiconductor memory device having a plurality of memory cells disposed in a memory cell region, wherein each memory cell has a floating gate, a control gate and a third gate, comprising steps of:
   (a) forming a first insulator film on a semiconductor substrate in said memory cell region;
   (b) forming said third gate on said first insulator film;
   (c) forming a second insulator film, having a thickness larger than that of said first insulator film, on said semiconductor substrate in said memory cell region;
   (d) forming said floating gate on said second insulator film; and
   (e) forming said control gate on a third insulator film formed on said floating gate, wherein
   said second insulator film is a tunnel insulator film between said floating gate and said semiconductor substrate.

2. A method of manufacturing a nonvolatile semiconductor memory device according to claim 1, wherein said second insulator film is formed on said semiconductor substrate by a thermal oxidation process.

3. A method of manufacturing a nonvolatile semiconductor memory device according to claim 1, wherein said second insulator film is formed on said semiconductor substrate by a chemical vapor deposition process.

4. A method of manufacturing a nonvolatile semiconductor memory device according to claim 3, wherein said chemical vapor deposition process is a low pressure chemical vapor deposition process.

5. A method of manufacturing a nonvolatile semiconductor memory device according to claim 1, wherein said control gate is a word line.

6. A method of manufacturing a nonvolatile semiconductor memory device according to claim 1, wherein said third insulator film is a stacked film of silicon oxide film/silicon nitride film/silicon oxide film.

7. A method of manufacturing a nonvolatile semiconductor memory device according to claim 1, wherein said control gate is a stacked film of a polysilicon film and a silicide film.

8. A method of manufacturing a nonvolatile semiconductor memory device having a plurality of memory cells disposed in a memory cell region, comprising steps of:
   (a) forming a first insulator film on a semiconductor substrate in said memory cell region;
   (b) forming a floating gate on said first insulator film;
   (c) forming a second insulator film, having a thickness smaller than that of said first insulator film, on said semiconductor substrate in said memory cell region; and
   (d) forming a control gate on said second insulator film, wherein
   said first insulator film is a tunnel insulator film between said floating gate and said semiconductor substrate.

9. A method of manufacturing a nonvolatile semiconductor memory device according to claim 8, A portion of said control gate is riding over said floating gate.

10. A method of manufacturing a nonvolatile semiconductor memory device according to claim 8, further comprising the step of forming a gate between said floating gates.

11. A method of manufacturing a nonvolatile semiconductor memory device according to claim 10, wherein said gate is erasing gate.

12. A method of manufacturing a nonvolatile semiconductor memory device according to claim 8, wherein said control gate is a stacked film of a polysilicon film and a silicide film.

13. A method of manufacturing, on a semiconductor substrate, a nonvolatile semiconductor memory device comprising a plurality of memory cells disposed in a memory cell region wherein each memory cell has a floating gate, a control gate and a third gate, and MISFETs disposed in a peripheral circuit region comprising the steps of:
   (a) forming a first insulator film on said semiconductor substrate in said memory cell region and said peripheral circuit region;
   (b) forming said third gate of each memory cell on said first insulator film in said memory cell region;
   (c) forming a gate electrode for each of the MISFETs on said first insulator film in said peripheral circuit region;
   (d) forming a second insulator film, having a thickness larger than that of said first insulator film, in said memory cell region;
   (e) forming said floating gate of each memory cell on said second insulator film in said memory cell region; and
   (f) forming said control gate of each memory cell which comprises a third insulator film on said floating gate.

14. A method of manufacturing a nonvolatile semiconductor memory device according to claim 13, further comprising the steps of forming said second insulator film in said peripheral circuit region and forming a gate electrode for each of the MISFETs on said second insulator film in said peripheral circuit region.

15. A method of manufacturing a nonvolatile semiconductor memory device according to claim 14, wherein said gate is erasing gate.

16. A method of manufacturing a nonvolatile semiconductor memory device having a plurality of memory cells disposed in a memory cell region, wherein each memory cell has a floating gate, a control gate and a third gate, comprising steps of:
   (a) forming a first insulator film on a semiconductor substrate in said memory cell region;
   (b) forming said third gate on said first insulator film;
   (c) forming a second insulator film, having a thickness larger than that of said first insulator film, on said semiconductor substrate in said memory cell region to isolate said floating gate from said semiconductor substrate;
   (d) forming said floating gate on said second insulator film; and
   (e) forming said control gate on a third insulator film formed on said floating gate.

17. A method of manufacturing a nonvolatile semiconductor memory device according to claim 16, wherein said second insulator film is formed on said semiconductor substrate by a thermal oxidation process.

18. A method of manufacturing a nonvolatile semiconductor memory device according to claim 16, wherein said second insulator film is formed on said semiconductor substrate by a chemical vapor deposition process.

19. A method of manufacturing a nonvolatile semiconductor memory device according to claim 18, wherein said chemical vapor deposition process is a low pressure chemical vapor deposition process.

20. A method of manufacturing a nonvolatile semiconductor memory device according to claim 16, wherein said control gate is a word line.

21. A method of manufacturing a nonvolatile semiconductor memory device according to claim 16, wherein said third insulator film is a stacked film of silicon oxide film/silicon nitride film/silicon oxide film.

22. A method of manufacturing a nonvolatile semiconductor memory device according to claim 16, wherein said control gate is a stacked film of a polysilicon film and a silicide film.

23. A method of manufacturing a nonvolatile semiconductor memory device having a plurality of memory cells disposed in a memory cell region, comprising steps of:
(a) forming a first insulator film on a semiconductor substrate in said memory cell region to isolate a floating gate from said semiconductor substrate;
(b) forming said floating gate on said first insulator film;
(c) forming a second insulator film, having a thickness smaller than that of said first insulator film, on said semiconductor substrate in said memory cell region; and
(d) forming a control gate on said second insulator film, wherein said control gate is a stacked film of a polysilicon film and a silicide film.

* * * * *